United States Patent [19]
Okada et al.

[11] Patent Number: 5,991,530
[45] Date of Patent: Nov. 23, 1999

[54] INTERFACE DEVICE RECEIVABLE IN CARD STORAGE DEVICE SLOT OF HOST COMPUTER

[75] Inventors: Toru Okada; Hitoshi Kurihara; Ryuichi Negishi; Kiyoyuki Kakinuma, all of Saitama-ken, Japan

[73] Assignee: Canon Denshi Kabushiki Kaisha, Saitama-ken, Japan

[21] Appl. No.: 08/955,715

[22] Filed: Oct. 22, 1997

Related U.S. Application Data

[63] Continuation of application No. 08/189,487, Jan. 31, 1994, abandoned.

[30] Foreign Application Priority Data

| Feb. 5, 1993 | [JP] | Japan | 5-041849 |
| Feb. 5, 1993 | [JP] | Japan | 5-041850 |
| Feb. 5, 1993 | [JP] | Japan | 5-041851 |
| Feb. 5, 1993 | [JP] | Japan | 5-041852 |
| Feb. 5, 1993 | [JP] | Japan | 5-041853 |
| Mar. 15, 1993 | [JP] | Japan | 5-080212 |
| Mar. 31, 1993 | [JP] | Japan | 5-097218 |

[51] Int. Cl.[6] .............. G06F 9/455; H05K 5/00
[52] U.S. Cl. .............. 395/500.46; 395/500.45; 395/500.48; 710/65; 710/100; 361/684; 361/685; 439/75.1; 439/76.1
[58] Field of Search ............... 395/500, 187.04, 395/281, 308, 846, 500.46, 500.45; 710/65, 100, 129, 105, 74; 439/76.1, 911, 55, 928.1, 159, 260, 377, 653, 638, 945, 75.1; 361/684, 686, 737, 752, 796, 685, 727

[56] References Cited

U.S. PATENT DOCUMENTS

| 4,744,006 | 5/1988 | Duffield | 361/686 |
|---|---|---|---|
| 4,792,896 | 12/1988 | Maclean et al. | 395/500 |
| 5,014,237 | 5/1991 | Masters et al. | 395/500 |
| 5,157,769 | 10/1992 | Eppley et al. | 395/500 |
| 5,184,282 | 2/1993 | Kaneda et al. | 361/395 |
| 5,239,662 | 8/1993 | Danielson et al. | 395/500 |
| 5,261,075 | 11/1993 | Ouchi et al. | 395/500 |
| 5,261,077 | 11/1993 | Duval et al. | 395/500 |
| 5,313,617 | 5/1994 | Nakano et al. | 395/500 |
| 5,315,478 | 5/1994 | Cadwell et al. | 361/684 |
| 5,321,817 | 6/1994 | Feinstein | 395/500 |
| 5,355,489 | 10/1994 | Bealkowski et al. | 395/500 |
| 5,400,216 | 3/1995 | Tsai | 361/684 |
| 5,410,677 | 4/1995 | Roskowski et al. | 395/500 |
| 5,473,505 | 12/1995 | Kessoku et al. | 361/684 |
| 5,495,586 | 2/1996 | Adachi et al. | 395/280 |
| 5,497,464 | 3/1996 | Yeh | 395/281 |
| 5,509,811 | 4/1996 | Homic | 439/55 |
| 5,528,459 | 6/1996 | Ainsbury et al. | 361/737 |
| 5,529,503 | 6/1996 | Kerklaan | 439/76.1 |
| 5,596,707 | 1/1997 | Ohta | 395/182.04 |
| 5,678,029 | 10/1997 | Iijima | 395/500 |

*Primary Examiner*—Jacques H. Louis-Jacques
*Attorney, Agent, or Firm*—Robin, Blecker & Daley

[57] ABSTRACT

The present invention relates to a data processing device which is also used as an interface device for connecting an external storage device to a host computer to which a card form of storage device can be connected, the external storage device differing in data format from the card form of storage device. The data processing device includes a connection unit for connecting the external storage device to the host computer, the connection unit being able to be removably fitted into a slot which is provided in the host computer and into which to removably fit the card form of storage device, and a converting circuit for converting data, which is to be outputted from the host computer in a data format conforming to the card form of storage device, into a data format conforming to the external storage device, as well as for converting data read out from the external storage device into the data format conforming to the card form of storage device.

35 Claims, 33 Drawing Sheets

FIG.8

FD BIOS

| |
|---|
| RESETTING OF DISK |
| ACQUISITION OF DISK DRIVE STATUS |
| SECTOR READING |
| SECTOR WRITING |
| VERIFICATION OF CONTENT OF SECTOR |
| FORMATTING OF CYLINDER (TRACK) |
| ACQUISITION OF DISKETTE INFORMATION |
| ACQUISITION OF TYPE OF DRIVE |
| ACQUISITION OF DISKETTE EXCHANGE STATUS |
| SETTING OF DRIVE TYPE FOR FORMATTING |
| SETTING OF MEDIA TYPE |
| ACQUISITION OF MEDIA TYPE |

FIG.9

CARD BIOS

| RESETTING OF MEMORY IN CARD |
|---|
| ACQUISITION OF CARD SLOT STATUS |
| DATA READING |
| DATA WRITING |
| VERIFICATION OF CONTENT OF MEMORY |
| DATA FORMAT |
| MEMORY CAPACITY |
| ACQUISITION OF TYPE OF DRIVE |
| ACQUISITION OF MEMORY CARD INFORMATION (INCLUDING ACQUISITION OF TYPE OF CARD AND CONTENT OF DISCRIMINATION INFORMATION ROM) |
| DECISION AS TO DEFECT ON MEMORY |
| ACQUISITION OF CARD EXCHANGE STATUS |

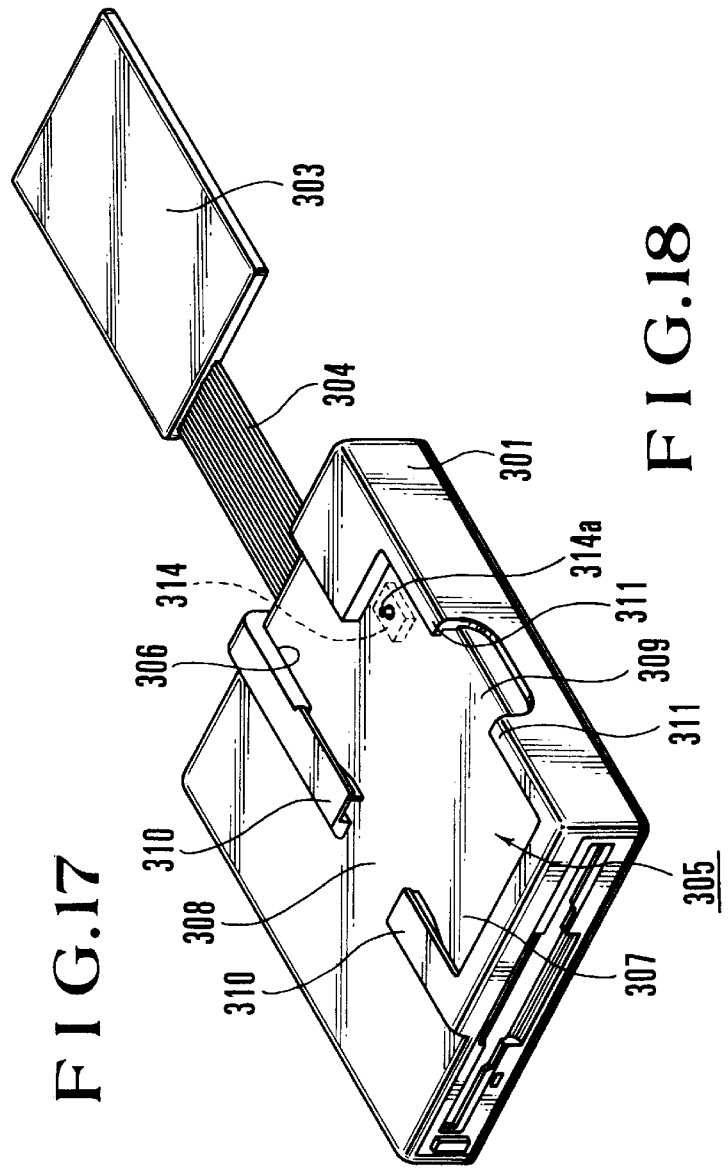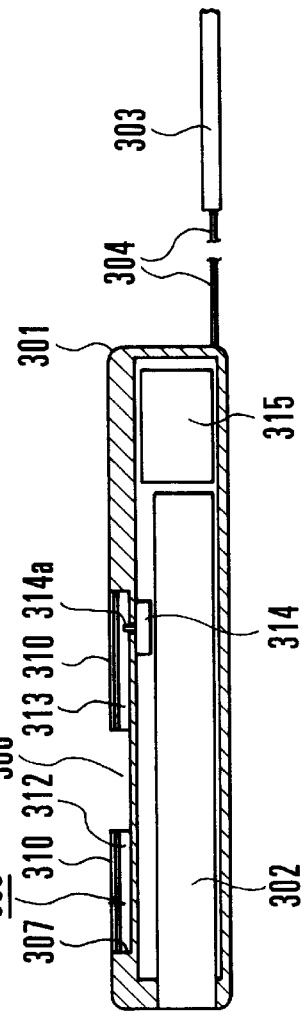

F I G. 24
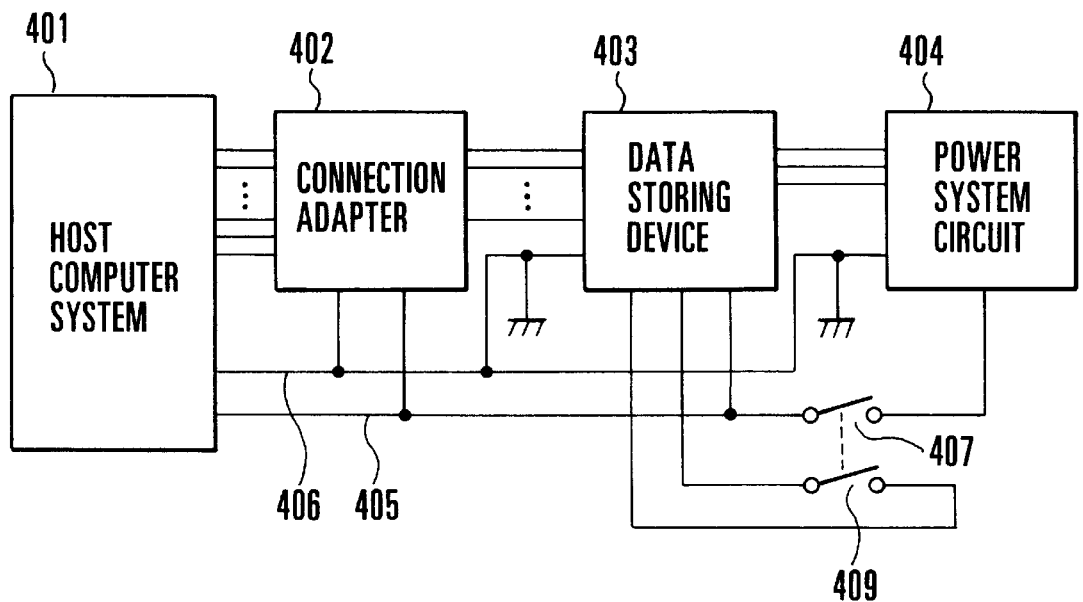
F I G. 25
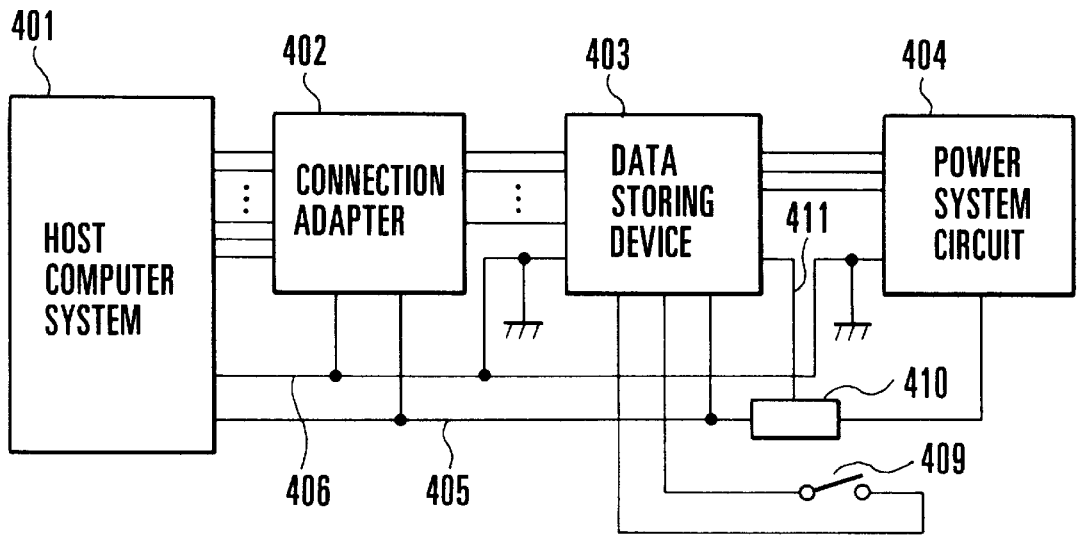

5,991,530

INTERFACE DEVICE RECEIVABLE IN CARD STORAGE DEVICE SLOT OF HOST COMPUTER

This is a continuation of application under 37 CFR 1.62 of prior application of U.S. Ser. No. 08/189,487, filed Jan. 31, 1994, now abandoned.

BACKGROUND OF THE INVENTION

1. Field of the Invention

The present invention relates to a device for connecting a floppy disk drive (FDD) to a computer having a card interface and, more particularly, to an interface device capable of connecting an FDD via an IC card slot to computer equipment having a card interface to which an IC card can be connected as an external storage device.

2. Description of the Related Art

It has heretofore been known that a data storage device, such as a floppy disk drive (FDD) or a magnetic tape drive, is incorporated as an external storage device in computer equipment, such as a personal computer, a word processor or a video game machine, for the purpose of saving various kinds of data files or exchanging data files with other equipment.

In recent years, the computer equipment, such as a personal computer, has been smaller and smaller, and the current trend in the field of portable computer equipment (for example, a small computer called "subnote" or a pen-input type personal computer) is to use an IC memory card rather than a large FDD.

However, since IC memory cards are considerably expensive, if such an IC memory card is to be used in an application in which storage of a large amount of data is needed, it is necessary to prepare an expensive IC memory card having a large memory capacity. In contrast, although floppy disks (FDs) are inexpensive and suited for applications in which storage of a large amount of data is needed, it is necessary to furnish the computer equipment, such as a personal computer, with a dedicated connector for external connection to an FDD. This makes it difficult to design a personal computer of reduced size.

IC memory cards in general have a memory capacity of several megabytes and can be employed similarly to FDs. However, since the price of an IC memory card is two hundred to three hundred times as high as that of an FD, it is strongly demanded to provide an arrangement which enables an FDD, instead of an IC memory card, to be connected to the IC memory card slot of a small computer having the aforementioned card interface.

SUMMARY OF THE INVENTION

The present invention has been made to solve the above-described problems, and a first object of the present invention is to provide an interface device which enables an FDD to be connected to a card interface of a computer of the type which has a card interface.

A second object of the present invention is to provide a data converting device which enables a storage device other than a card to be connected to a card interface of a computer of the type which has a card interface, and which is capable of performing data conversion between the card interface and the storage device.

To achieve the above objects, in accordance with one aspect of the present invention, there is provided an interface device for connecting an external storage device to a host computer to which a card form of storage device can be connected, the external storage device differing in data format from the card form of storage device. The interface device comprises a connection unit for connecting the external storage device to the host computer, the connection unit being able to be removably fitted into a slot which is provided in the host computer and into which to removably fits the card form of storage device, and converting means for converting data, which is to be outputted from the host computer in a data format conforming to the card form of storage device, into a data format conforming to the external storage device, as well as for converting data read out from the external storage device into the data format conforming to the card form of storage device.

A third object of the present invention is to provide a data converting device having an interface for connecting an FDD to computer equipment provided with a card interface.

A fourth object of the present invention is to provide an interface device for connecting an FDD to a card slot of computer equipment provided with a card interface in which the information required to operate the card interface is stored, that is, an interface and a computer system both of which are capable of automatically enabling the card interface when the interface device is connected to computer equipment, thereby reducing burdens to be imposed on the computer equipment and an operator and realizing good operability.

To achieve the fourth object, in accordance with another aspect of the present invention, there is provided an interface device for connecting an external storage device to a host computer to which a card form of storage device can be connected, the external storage device differing in data format from the card form of storage device. The interface device comprises a connection unit for connecting the external storage device to the host computer, the connection unit being able to be removably fitted into a slot which is provided in the host computer and into which to removably fit the card form of storage device, converting means for converting data, which is to be outputted from the host computer in a data format conforming to the card form of storage device, into a data format conforming to the external storage device, as well as for converting data read out from the external storage device into the data format conforming to the card form of storage device, and a nonvolatile memory in which are stored a plurality of pieces of discrimination information for allowing the external storage device to be controlled by the host computer.

In accordance with another aspect of the present invention, there is provided a computer system which comprises a host computer to which a card form of storage device is connectable, an external storage device which differs in data format from the card form of storage device, and an interface which includes a connection unit for connecting the card form of storage device to the host computer, the connection unit being able to be removably fitted into a slot which is provided in the host computer and into which to removably fits the card form of storage device, and controlling means for converting control information, which is to be outputted from the host computer in a data format conforming to the card form of storage device, into a data format conforming to the external storage device, and enabling the external storage device to be controlled.

In accordance with another aspect of the present invention, there is provided a card device to be disposed between an FDD and a host system having a card interface in order to connect the FDD to the host system. The card device comprises an FD controller for controlling the FDD, a memory in which CIS/CCR indicative of card information is stored, and a card input/output controller to be connected to a card controller of the host system.

The above and other objects, features and advantages of the present invention will become apparent from the following detailed description of preferred embodiments of the present invention, taken in conjunction with the accompanying drawings.

BRIEF DESCRIPTION OF THE DRAWINGS

FIG. 8 is a table showing the functions of an FD BIOS;

FIG. 9 is a table showing the functions of a card BIOS;

FIG. 17 is a diagrammatic perspective view showing a state in which a data storage device according to a seventh embodiment is usable;

FIG. 18 is a schematic cross-sectional view of the data storage device of FIG. 17;

FIG. 24 is a schematic circuit block diagram showing the state in which a data storage device according to a tenth embodiment of the present invention is connected to computer application equipment;

FIG. 25 is a schematic circuit block diagram showing the state in which a data storage device according to an eleventh embodiment of the present invention is connected to computer application equipment;

DETAILED DESCRIPTION OF THE PREFERRED EMBODIMENTS

Figure 1:
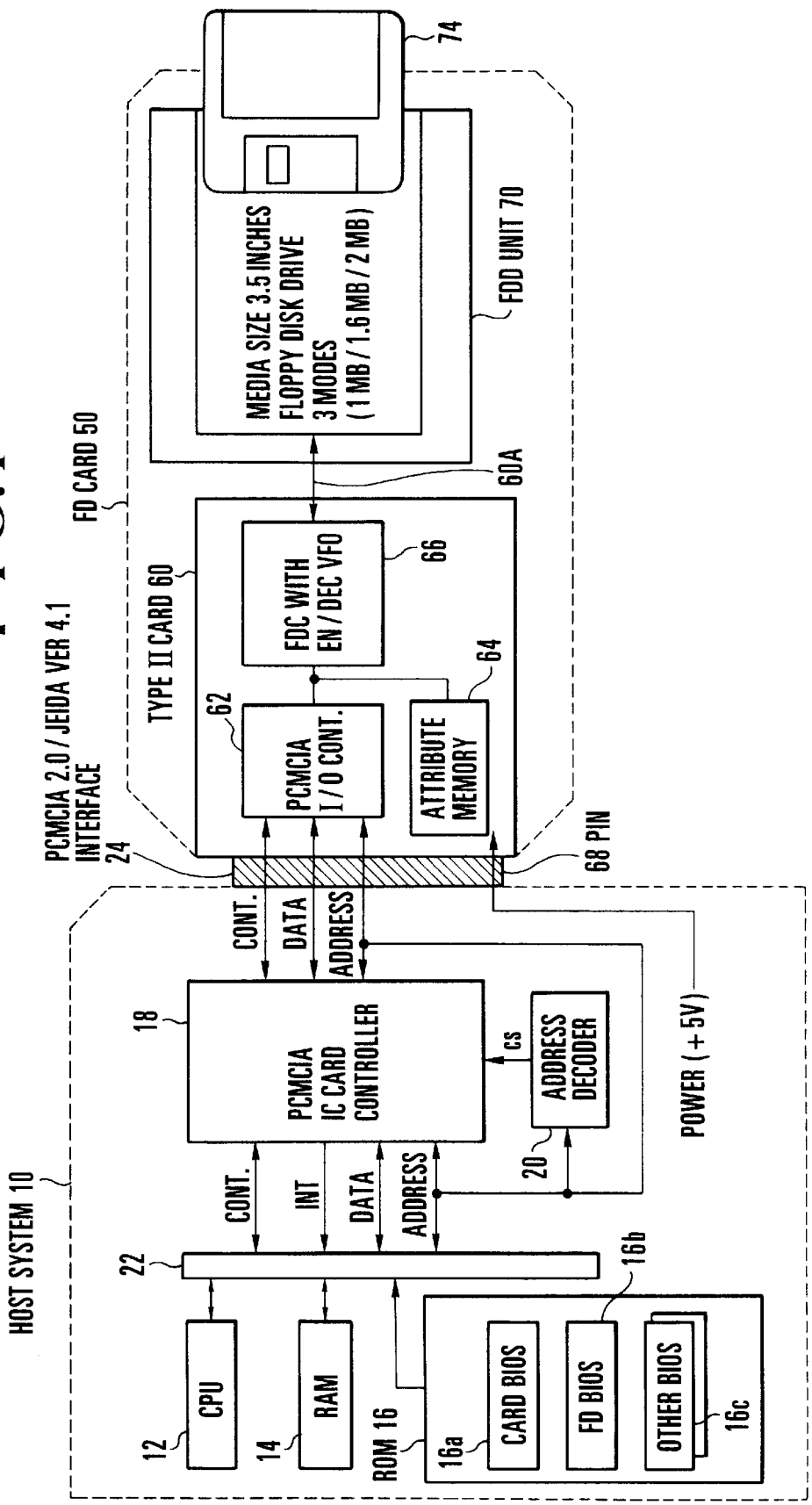
FIG. 1 is a block diagram showing the arrangement of an interface device according to the present invention and the system arrangement of computer equipment according to the present invention.

Embodiments of the present invention will be described below with reference to the accompanying drawings. FIG. 1 is a block diagram showing the hardware arrangement of the entire system (a host system, a card device and an FDD) according to the present invention.

In general, cards for connection to a small computer are IC cards which conform to PCMCIA (Personal Computer Memory Card International Association) or JEIDA (Japan Electronic Industry Development Association). Although the following description is made chiefly in connection with a PCMCIA-based IC card (hereinafter referred to simply as "IC card" or "card"), the present invention is not limited to this kind of card. In the following description of the embodiments of the present invention, for the sake of convenience of explanation, a small computer having a card interface to which a card is connectable as an external storage device is called "host system", a device which serves as an interface between the host system and an FDD is called "card device", and a device made up of the card device and the FDD is called "FD card device".

Referring to FIG. 1, a host system 10 is formed by a small computer which is called, for example, "subnote", or a small computer such as a pen-input type computer. The arrangement shown in FIG. 1 also includes an FD card device 50, a card device 60 which constitutes one part of the FD card device 50, and an FDD (floppy disk drive) 70 which constitutes another part of the FD card device 50.

According to the system arrangement of the FD card device 50 according to the present invention, the card device 60 has a shape substantially identical to that of a normally employed IC card and constitutes an adapter which is removably attachable to an IC card inserting opening of the host system 10. The card device 60 is connected to the FDD 70 by a cable 60A. The FDD 70 becomes adapted to be used by inserting the card device 60 into the IC card inserting opening of the host system 10 in a manner similar to the manner in which an IC card is used.

The host system 10 includes a CPU 12, a RAM 14, a ROM 16, an IC card controller 18 which conforms to PCMCIA, an address decoder 20, a bus 22, and a connector 24 for a 68-pin PCMCIA-based IC card. A number of programs are stored in the ROM 16, such as a card BIOS 16a (Basic Input and Output System) which is a program for enabling use of an IC card, an FD BIOS 16b which is a program for enabling use of an floppy disk drive, other BIOSes 16c which enable use of other connectable devices, and, although not shown, the program necessary to control the CPU 12. The card BIOS 16a is a program for executing the input/output operation of a card under the control of DOS (Disk Operating System) (refer to FIG. 2), and the FD BIOS 16b is a program for executing the input/output operation of an FD under the control of DOS. The above-described elements are connected to one another via the bus 22, and, for example, control signals (including an interrupt signal), data signals and address signals are transferred via the bus 22.

The card device 60 includes a PCMCIA I/O (input/output) controller 62, an attribute memory 64 and an FDC (FD controller) 66. The PCMCIA I/O controller 62 is interposed between the IC card controller 18 and the FDC 66 and controls the input/output of the IC card controller 18 and the input/output of the FDC 66. Information indicative of CIS (Card Information Structure) (specific attribute information peculiar to a card) and information to be stored into a CCR (Card Configuration Register) (a register for discriminating information about an electrical interface or the like) is stored in the attribute memory 64. The FDC 66 is provided for controlling the FDD (floppy disk drive) 70.

The FDD 70 serves to drive an FD (floppy disk) 74 and perform a data read/write operation on the basis of a predetermined format by means of a magnetic head during the writing/reading of data. The FDD 70 is arranged to be operable in three 3.5-inch FD modes, such as 1 MB, 1.6 MB and 2 MB.

The host system 10 is arranged so that the IC card controller 18 controls an IC card connected as an external storage device via the connector 24 for an IC card, thereby executing reading from and writing to the IC card. For this reason, if a storage device other than an IC card, for example, an FDD, is connected directly to the host system 10, it is impossible to drive the FDD because of problems concerned with control and interfacial incompatibility. Accordingly, in accordance with one aspect of the present invention which will be described later, there is provided an arrangement for connecting the FDD 70 to the host system 10 by interposing the card device 60, which functions as an interface, between the host system 10 and the FDD 70 and preparing software for performing control under which each of the elements can perform its individual function.

The card device 60 needs to have the FDC 66 for controlling the FDD 70, and to establish interfacial compatibility between a PCMCIA interface provided in the host system 10 and an FD interface for controlling the FDD 70, it is necessary that the card device 60 itself be able to be electrically regarded as an IC card or equivalent when the FD card device 50 (the card device 60 and the FDD 70) connected to the host system 10 is viewed from the host system 10. To this end, the card device 60 is provided with the attribute memory (ROM) 64 in which the aforesaid CIS and CCR information is stored, so that such information can be supplied to the PCMCIA I/O controller 62. To control the FDD 70, it is necessary that, instead of a card BIOS which is a program for executing the input/output operation of an IC card, an FD BIOS be previously provided in the host system 10 or the card device 60 so that the FD BIOS can be installed into the host system 10 when a card device is connected.

In addition to arranging the card device 60 or the host system 10 in the above-described manner so that the FDD 70 can be connected to the card device 60 or the host system 10, it is desirable, as a matter of course, that the input/output operation of the FDD 70 be performed at a high speed. One method for achieving such a high-speed input/output operation is a DMA (Direct Memory Access) transfer system.

In the light of the above-described points, according to one aspect of the present invention, there are provided three embodiments which will be described later: (1) a first embodiment in which a ROM in which an FD BIOS is stored is provided in the host system 10 on a non-DMA basis; (2) a second embodiment in which a ROM in which an FD BIOS is stored in provided in the card device 60 on a non-DMA basis; and (3) a third embodiment in which the DMA transfer system is employed and a ROM in which an FD BIOS is stored is provided in the host system 10.

First Embodiment

Figure 2:
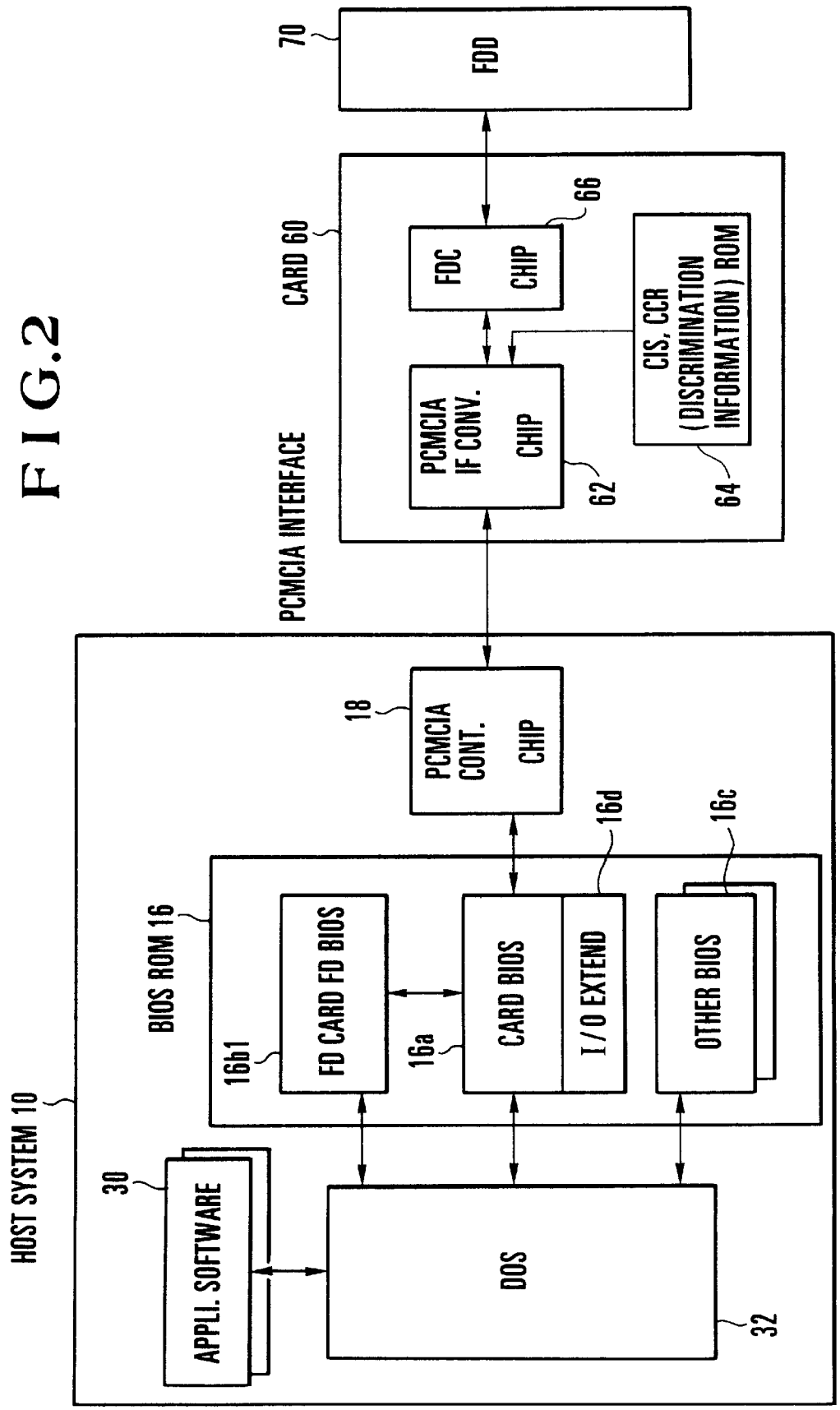
FIG. 2 is a block diagram of an arrangement in which an FD BIOS ROM is provided in a host system on a non-DMA basis, showing the disposition of each stored software program.

FIG. 2 is a system block diagram of the arrangement in which a ROM in which an FD BIOS is stored is provided in the host system 10 on a non-DMA basis, and shows the disposition of each stored software program. In FIG. 2, reference numeral 30 denotes pieces of application software for executing various kinds of operations, controls and processing, and reference numeral 32 denotes DOS (Disk Operating System). An FD BIOS 16$b$1 for operating the FD card device 50 according to the present invention is stored in the BIOS ROM 16 of the host system 10. The FD BIOS 16$b$1 is a program for executing an input/output operation relative to the FDD 70 under the control of the DOS 32, and is transferred via the PCMCIA controller (or IC card controller) 18 to the PCMCIA interface converter (I/O controller) 62 provided in the card device 60. The PCMCIA interface converter 62 converts data and a command of PCMCIA format into data and a command conforming to the data format of the FDD 70, and the thus-obtained data and command are supplied to the FDC 66. In this manner, the FDD 70 can be controlled on the basis of the data and the command of PCMCIA format supplied from the host system 10. In the first embodiment, the control can be achieved by preparing the FD BIOS 16$b$1 for the FD card device 50 in the state of being stored in the BIOS ROM 16 of the host system 10.

The CIS information in which specific attribute information peculiar to a card is stored and the register CCR for discriminating information about an electrical interface or the like are provided in the card device 60 in addition to the PCMCIA interface converter 62 and the FDC 66. The CIS or CCR information is read out in accordance with a request of the host system 10 when the card device 60 is connected to the host system 10 or when a power source is turned on to start up the host system 10, and the read-out information is outputted to the host system 10. On the basis of this information, the host system 10 discriminates whether the card device 60 is a normal IC memory card or an FD card according to the present invention, and sets a system according to the kind, specifications and performance of the card device 60. For example, in the case of discrimination information indicating that a connected device is an FD card, the FD card FD BIOS 16$b$1 is started up, while in the case of discrimination information indicating that a connected device is an IC memory card, the card BIOS 16$a$ is started up. If another kind of device is connected, the one of the other BIOSes 16$c$ which corresponds to the connected device and an extended interface (I/O Extend) 16$d$ are started up. In this manner, the host system 10 and the connected device are made accessible to each other.

In the above-described arrangement, various data processed under the management of the DOS 32 provided in the host system 10 are subjected to an input/output operation for writing to or reading from an FD by using the FD card FD BIOS 16$b$1 on the DOS 32, and actually written or read data is transformed into data (having a data area and addresses) which can be inputted to or outputted from an IC memory card, via the card BIOS 16$a$ and the I/O Extend 16$d$. The data is converted into data of PCMCIA format by the PCMCIA converter 18, and the data of PCMCIA is communicated to the card device 60.

In the card device 60, the data of PCMCIA format outputted from the host system 10 is converted into data conforming to the FDC 66 by the PCMCIA interface converter 62, and this data is supplied to the FDC 66. In this manner, the data of PCMCIA format stored in the IC memory card is converted into data of FD format so that it can be recorded by the FDD 70.

Also, if data read out from an FD in the FDD 70 is to be converted into the PCMCIA format and read into the host system 10, the inverse data conversion of the aforesaid one is performed.

Accordingly, an FDD can be connected to computer equipment which has only an interface and a slot for an IC card of PCMCIA format, and data can be written to or read from the FDD.

Second Embodiment

Figure 3:
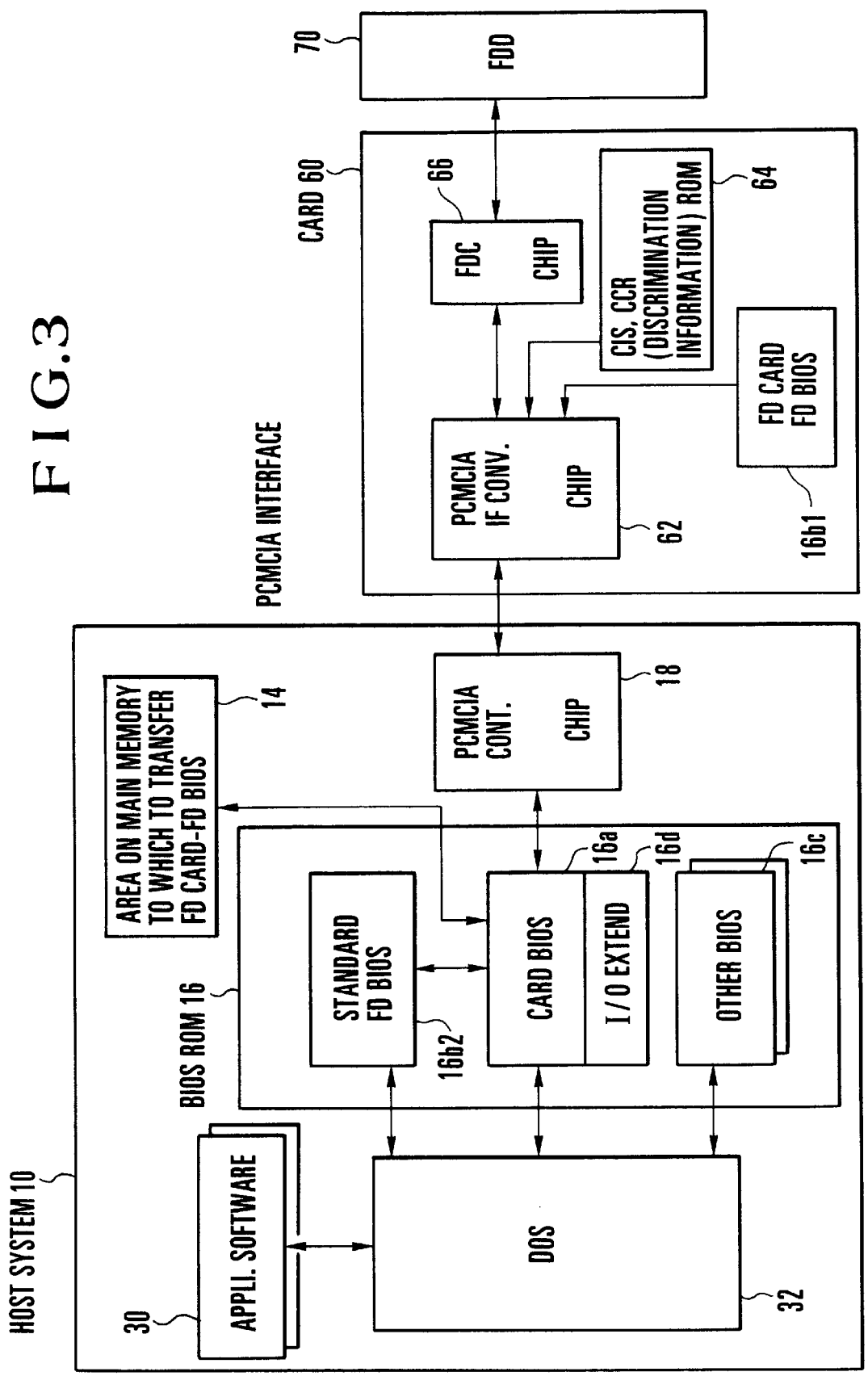
FIG. 3 is a block diagram of another arrangement in which the FD BIOS ROM is provided in a card device on a non-DMA basis, showing the disposition of each stored software program.

FIG. 3 is a system block diagram of the arrangement in which a ROM in which an FD BIOS is stored is provided in the card device 60 on a non-DMA basis, and shows the disposition of each stored software program. In the above-described first embodiment the FD card FD BIOS 16$b$1 is stored in the BIOS ROM 16 of the host system 10, but in the second embodiment the FD card FD BIOS 16$b$1 is stored in a ROM of the card device 60.

In the second embodiment, a standard FD BIOS 16$b$2 which is stored in the ROM 16 of the host system 10 is not employed, and the area of the RAM 14 is used as an area to which to transfer the FD card FD BIOS 16$b$1. For example, when the system is started up, the FD card FD BIOS 16$b$1 is read out from the card device 60 and transferred to the FD card FD BIOS transferring area 14 provided in the host system 10, so that the FD card FD BIOS 16$b$1 is made to operate therein. In the second embodiment, there is no need to alter the hardware construction of the host system 10.

According to the above-described system arrangement, since an FD BIOS need not be provided in the host system 10 in advance, it is possible to achieve a highly versatile system arrangement.

According to the second embodiment, not only is the FD card FD BIOS 16$b$1 provided in the card device 60, but also the associated information is stored in the CIS and CCR ROM 64 in advance. When the system is started up, addresses are set in the host system 10 on the basis of the information and the FD card FD BIOS 16$b$1 is installed in accordance with the addresses.

Third Embodiment

Figure 4:
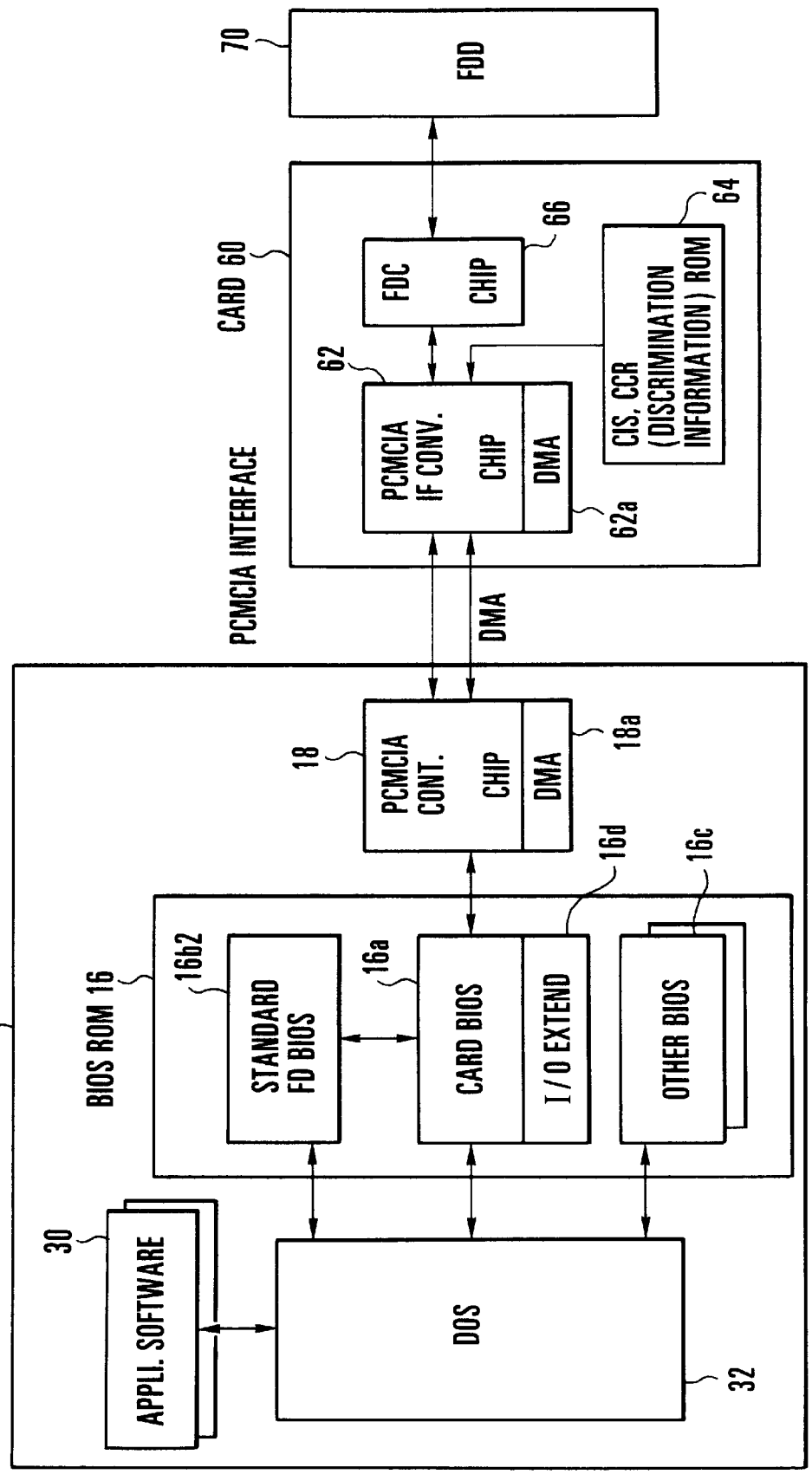
FIG. 4 is a block diagram of an arrangement in which the FD BIOS ROM is provided in the host system on a DMA basis, showing the disposition of each stored software program.

FIG. 4 is a system block diagram showing a system arrangement which enables DMA transfer to be performed between a host system and a card device, and shows the arrangement in which a ROM in which an FD BIOS is stored is provided in the host system as well as the disposition of each stored software program. In the arrangement according to the third embodiment, to realize DMA (direct memory access), the host system 10 is provided with a DMA controller 18a and the card device 60 is provided with an interface converter 62a for DMA, and a signal line for DMA is added.

In this arrangement, data on the DOS 32 is assigned to a data line for access to the IC card, by the card BIOS 16a in the host system 10, and the data is DMA-transferred via the DMA controller 18a. Accordingly, during this time, parallel processing can be performed by using another data line. High-speed processing can also be performed by DMA transfer. Since the other processing is similar to that performed in any of the above-described embodiments, a detailed description is omitted.

In each of the above-described embodiments, the CCR in the card device 60 is a register for discriminating information such as an electrical interface, an I/O address area, an interrupt request, the power consumption requirement of the card. The CIS indicates specific attribute information peculiar to the card, and stores discrimination information as card information formed by a chain of blocks called "turples".

Then, start-up processing for the computer system according to the present invention and the verification of a PCMCIA (or JEIDA)-based interface will be described below with reference to FIGS. 5 through 7.

Figure 5:
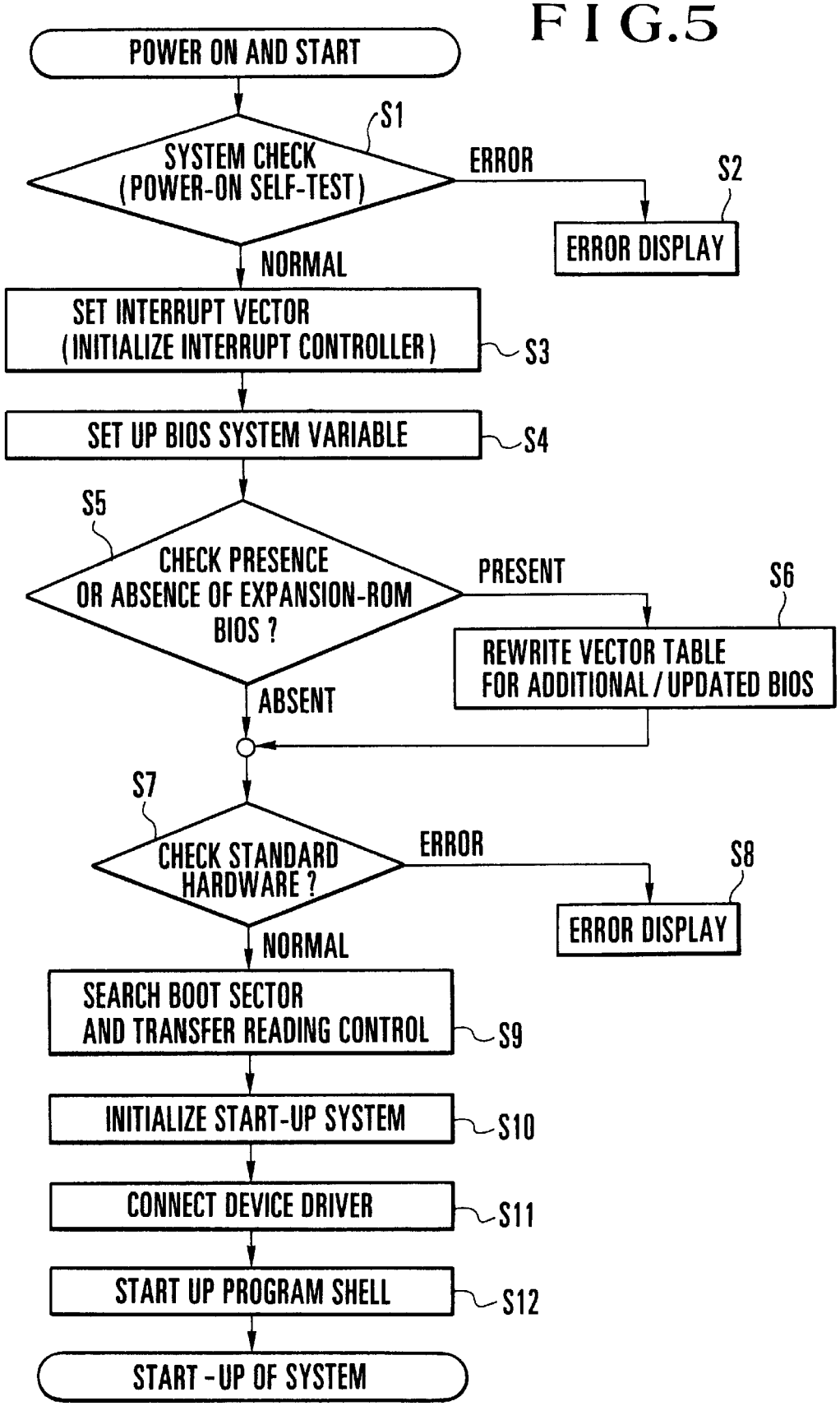
FIG. 5 is a flowchart showing the operation of the processing of starting up a computer system according to the present invention.

FIG. 5 is a flowchart showing the operation of the processing of starting up the computer system including the FD card device according to the present invention. This processing can be executed in common among the first to third embodiments. In operation, when the power source is turned on, a system check is first performed (Step S1). For example, a checksum of a ROM, a built-in memory, and hardware, such as a peripheral LSI, are verified. If there is an error, an error display is provided (Step S2). If there is no error, an interrupt vector is set (Step S3). Specifically, a jump table to be used upon the occurrence of a request for processing other than the current processing which is being performed is initialized, and peripheral devices (a CRT, a printer, a keyboard, etc.) are also initialized. Then, setup of individual BIOS system variables is performed (Step S4). Thus, the addresses of the individual BIOS system variables are assigned so that the corresponding devices are placed into their operable states. Specifically, the peripheral devices, the number of drives of the system, RS232 and the like are initialized. Then, a check is made as to the presence or absence of an expansion ROM BIOS (Step S5). If the expansion ROM BIOS is present, rewriting of a vector table for an additional/updated BIOS is performed (Step S6), and the process proceeds to Step S7. If the expansion ROM BIOS is absent, the process directly proceeds to Step S7. In Step S7, a check of standard hardware is performed. Specifically, predetermined verifications are performed, such as the verification of a PCMCIA/JEIDA interface for enabling access to an IC card which serves as a recording medium, the verification of RS232, the verification of a keyboard input, the verification of a printer interface, the verification of an FDD and the verification of other additional devices. If an error is detected during the check, an error display is provided (Step S8). If no error is detected, the process proceeds to Step S9. In Step S9, a boot sector is searched and reading control is transferred, and initialization of a start-up system is performed (Step S10). Individual functions and device drivers for driving the aforesaid peripheral devices are connected to the computer system (Step S11), and start-up of a program shell is performed (Step S12), whereby the computer system is started up. In brief, Steps S9 to S12 are executed in the following manner. The processing of each of Steps S9 to S12 is performed in accordance with the procedures of an employed OS. If an FDD is connected to the host system 10, the operation of starting up a program and other associated operations are performed in accordance with the information written in the leading part of a disk mounted in the FDD. If the disk is a system disk, since it contains a system program for controlling the computer system, the system program is started up and read into the host system 10. Subsequently, each processing is performed in accordance with the system program.

Figure 6:
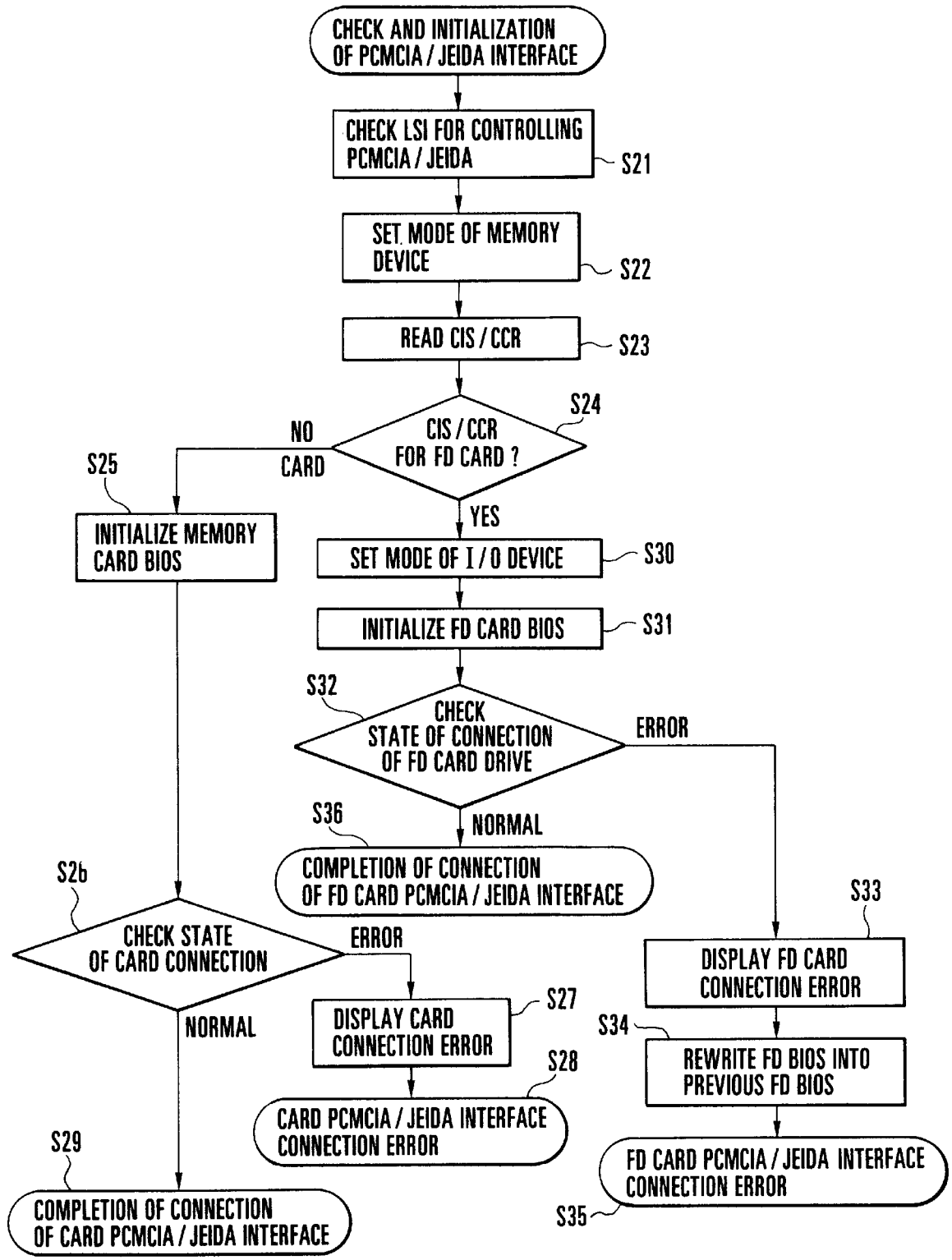
FIG. 6 is a flowchart showing one example of the operation of verification of a PCMCIA/JEIDA interface which is performed in Step S7 of the start-up processing for the computer system, which is shown in FIG. 5.

FIG. 6 is a flowchart showing the operation of the verification of the PCMCIA/JEIDA interface which is performed in Step S7 of the start-up processing for the computer system, which is shown in FIG. 5. This flowchart is associated with the above-described first and third embodiments. In operation, first, a check of an LSI for PCMCIA/JEIDA control is performed (Step S21). Then, mode setting for a memory device is performed (Step S22), and reading of CIS/CCR information is performed (Step S23). On the basis of the read CIS/CCR information, it is determined whether an FD card device or a memory card (IC card) is connected (Step S24). If it is determined that a memory card (IC card) is connected, a card BIOS is initialized (Step S25), and the state of connection of the card is checked (Step S26). If an error is detected, a card connection error display is provided (Step S27) and it is determined that an interface connection error has occurred (Step S28). If the card is normally connected, it is determined that the interface connection has been completed (Step S29). On the other hand, if it is determined in Step S24 that an FD card device is connected, mode setting for the I/O (input/output) device is performed (Step S30), and initialization of an FD card FD BIOS is performed (Step S31). The state of connection of the FD card drive is checked (Step S32), and if an error is detected, an FD card connection error display is provided and the vector of the FD BIOS is returned (Step S34) and it is determined that an interface connection error has occurred (Step S35). If the FD card drive is normally connected, it is determined that the interface connection has been completed (Step S36).

Figure 7:
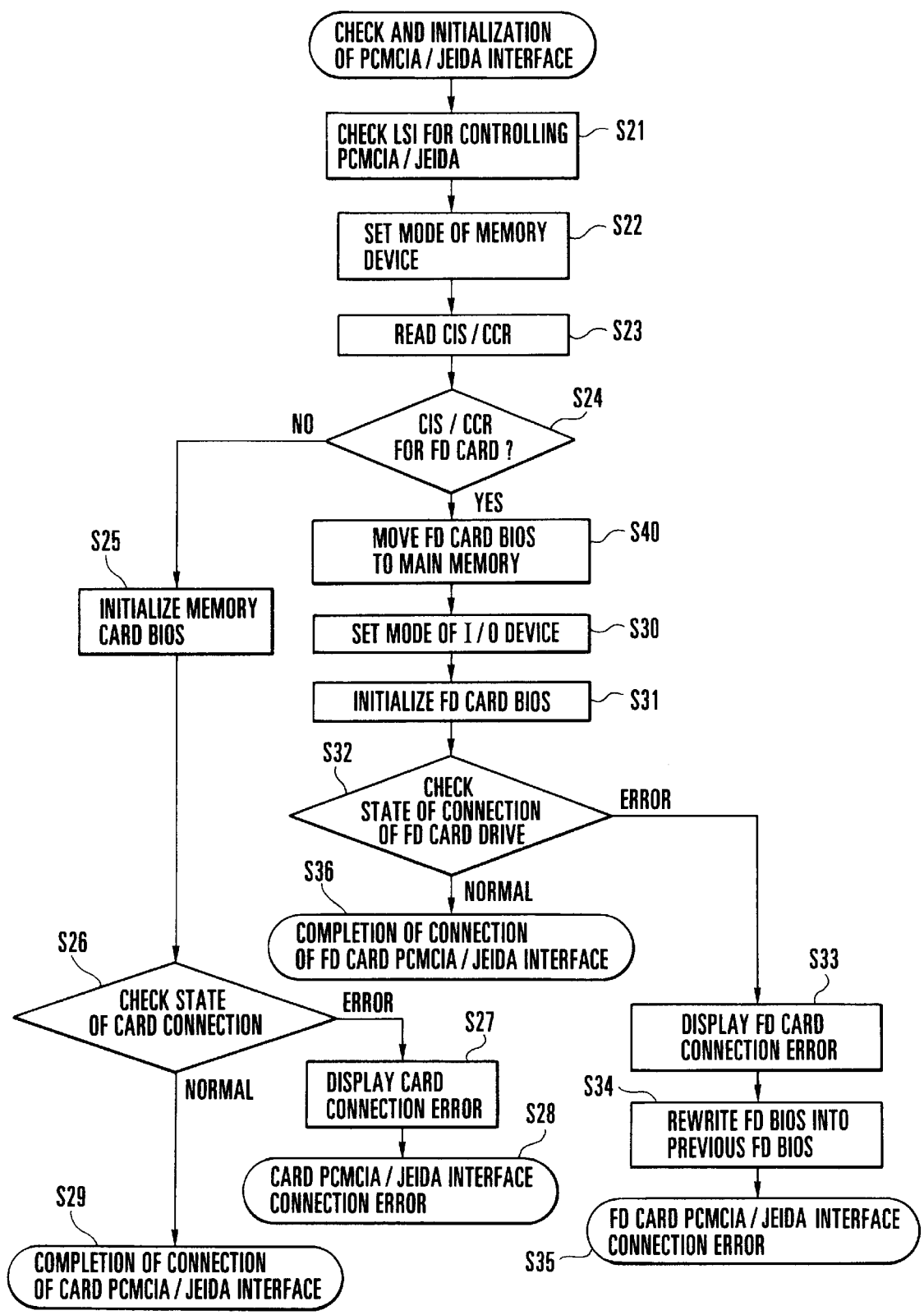
FIG. 7 is a flowchart showing another example of the operation of verification of a PCMCIA/JEIDA interface which is performed in Step S7 of the start-up processing for the computer system, which is shown in FIG. 5.

FIG. 7 shows another example of the flowchart of the operation of the verification of the PCMCIA/JEIDA interface which is performed in Step S7 of the start-up processing for the computer system, which is shown in FIG. 5. This flowchart is associated with the above-described second embodiment. Since in the second embodiment the FD card FD BIOS is provided within the FD card device, Step S40 is added before Step S30 in this flowchart. If it is determined in Step S24 that an FD card device is connected, the FD card FD BIOS is moved to the main memory (RAM) of the host system in Step S40. Since the other steps are identical to those shown in FIG. 6, a detailed description is omitted.

FIG. 8 is a table showing the functions of the FD BIOS, and FIG. 9 is a table showing the functions of the card BIOS.

On the basis of these BIOSes, an environment for performing the processing necessary for an access operation is set in the host system, such as an input/output operation, a data volume, a memory space, an interrupt and various commands relative to the FD or the card.

A combination of a host system and an FD card device both of which respectively have FD card BIOSes will be described below. In this case, according to the present invention, the FD card BIOS in the FD card device is preferentially selected and installed into the host system. The FD card BIOS provided in the host system is rewritten with the installed FD card BIOS. After that, if the FD card device is removed, the FD card BIOS in the host system is returned to the original BIOS.

Figure 10:
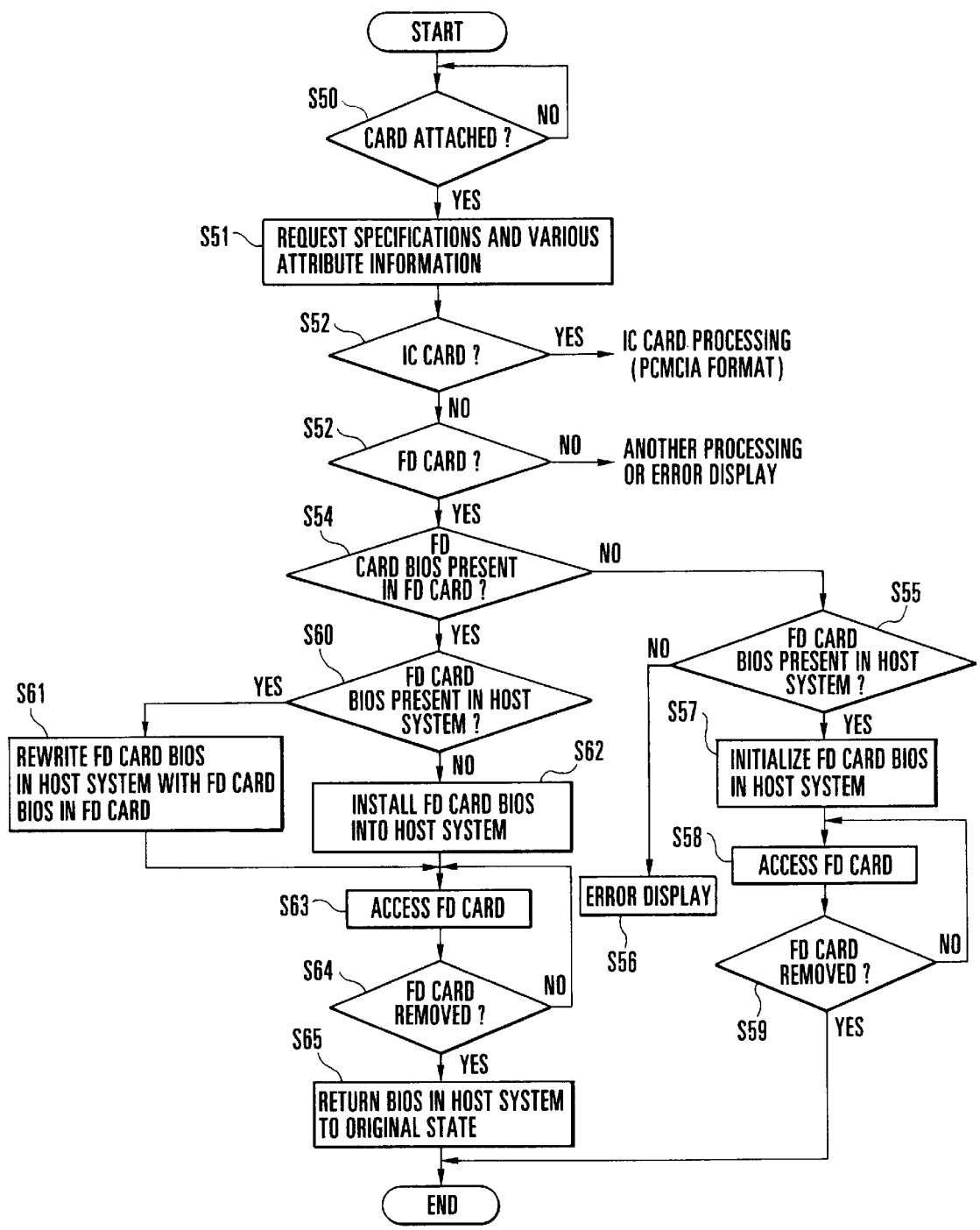
FIG. 10 is a flowchart showing processing to be executed in a system according to the present invention, which system is made up of a computer equipment and an FD card interface both of which have FD card BIOSes.

This processing is shown in the flowchart of FIG. 10. Referring to FIG. 10, it is determined in Step S50 whether a card (an IC card or an FD card) has been attached. If it is determined that a card has been attached, in Step S51, CIS and CCR information or specific attribute information stored in the ROM is read into the card and discrimination as to the specifications and attributes of the card is performed. In Step S52, a decision is made as to the result of the discrimination. In the case of an IC (memory) card, IC card processing which conforms to an ordinary PCMCIA format is performed. In the case of a card other than an IC card, the process proceeds to Step S53, in which it is determined whether the card is an FD card.

If it is determined in Step S53 that the card is not an FD card, this indicates that the card is not an IC card or an FD card. Accordingly, if there is another supported device, processing for executing discrimination, initialization, etc. of the card is performed. If such a supported device is not prepared, an error display is provided.

If it is determined in Step S53 that the card is an FD card, the process proceeds to Step S54, in which it is determined whether an FD card BIOS is present in the FD card. If no FD card BIOS is present in the FD card, the process proceeds to Step S55, in which it is determined whether an FD card BIOS is present in the host system. If no FD card BIOS is present in the host system, it is determined that access is impossible, and an error display is provided in Step S56.

If it is determined in Step S55 that an FD card BIOS is present in the host system, the process proceeds to Step S57, in which the FD card BIOS in the host system is initialized, and access to the FD card is performed in Step S58.

Then, if it is determined in Step S59 that the FD card has been removed from the host system or the power source has been turned off, the processing is brought to an end.

If it is determined in Step S54 that an FD card BIOS is present in the FD card, the process proceeds to Step S60, in which it is determined whether an FD card BIOS is also present in the host system. If there is no FD card BIOS in the host system, the FD card BIOS present in the FD card is installed into the host system in Step S62, and FD card processing is performed in Step S63. Thus, the floppy disk drive FDD can be used as if it were an IC card.

If it is then determined in Step S64 that the FD card has been removed from the host system or the power source has been turned off, the process proceeds to Step S65, in which the BIOS in the host system is returned to the original settings, and the process is brought to an end.

If it is determined in Step S60 that the FD card BIOS is present in the host system, the FD card BIOS present in the host system is rewritten with the FD card BIOS present in the FD card. After that, the process proceeds to Step S63, in which access to the FD card is enabled. Since the subsequent processing is similar to the previously-described one, a description thereof is omitted.

Accordingly, even if both of the host system and the FD card device have identical BIOSes, it is possible to use the computer system without any problem.

As is apparent from the above description, according to the first to third embodiments, an FDD can be connected to a card interface, such as a PCMCIA interface, of a computer, and it can be used without any problem as if it were an IC card.

Accordingly, it is possible to achieve the great advantages that it is not necessary to employ a large number of expensive IC cards which involve an increase in cost and that it is possible to employ an inexpensive external storage device using an FD.

Further, it is possible to achieve the great advantage that since the IC memory card and the FD card device can be used substantially equivalently, it is possible to provide compatibility between information on the IC memory card and information on the FD.

In the above description of the first to third embodiments, reference has been made to the internal arrangement and the processing of an FD-card form of interface device according to the present invention. Each of embodiments which will be described below relates to improvements in a mechanical structure and an external appearance according to the present invention and, more particularly, to functional and operational improvements which are effective when a card interface according to the present invention is used to connect a floppy disk drive to a personal computer or the like.

As described above, IC cards are not suitable for use in applications in which a large amount of data needs to be stored, because of their high prices. Although floppy disks (FDS) are suitable for use in such applications because of their low prices, personal computers need to have a dedicated connector so that an FDD can be externally attached. This arrangement makes it difficult to reduce the size of personal computers. One approach to solving these problems is a data storage device which can be connected to computer application equipment by inserting an IC memory card type connection adapter into an IC memory card slot which is provided in the computer application equipment.

Figure 11:
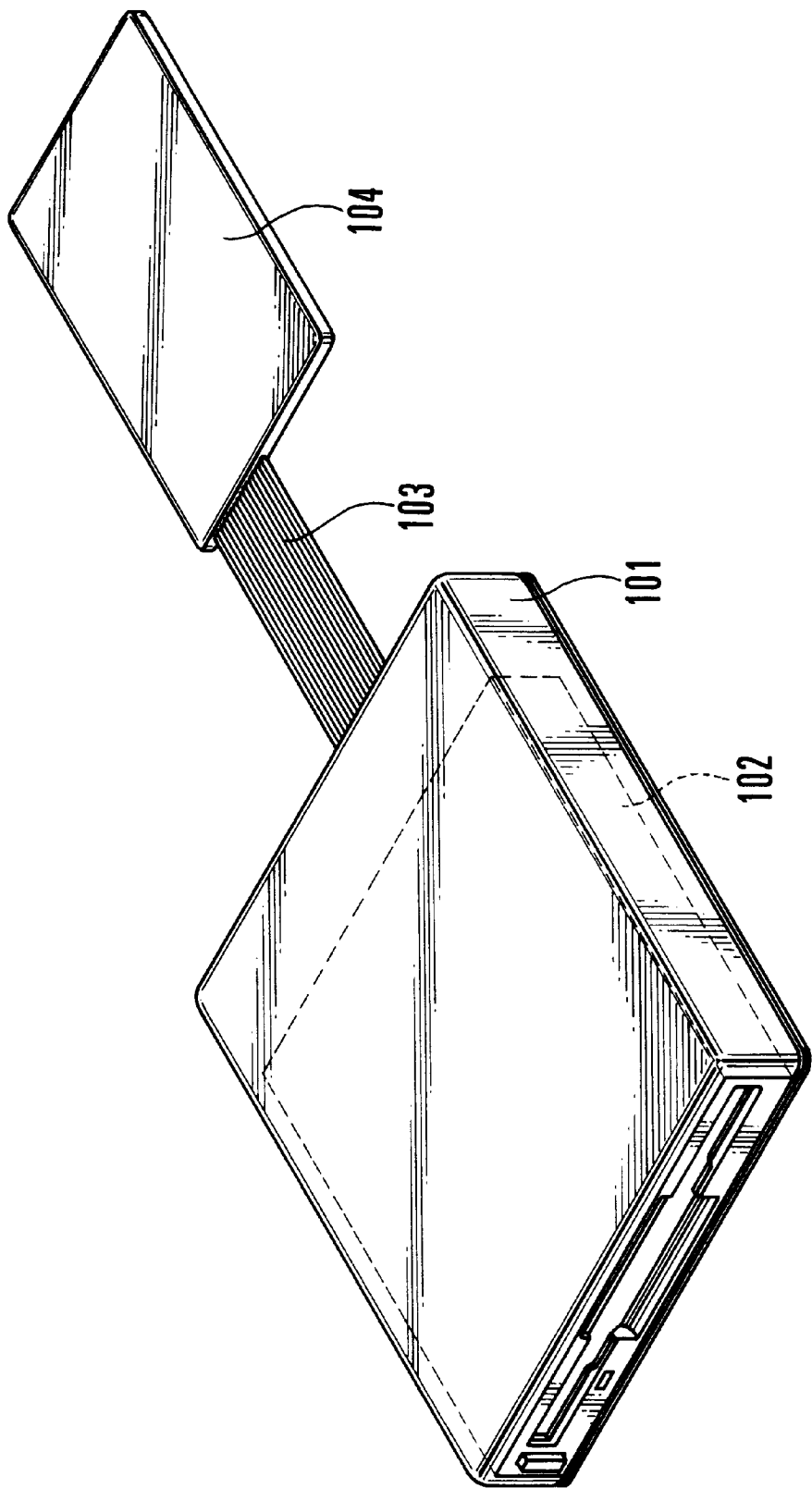
FIG. 11 is a diagrammatic perspective view of a data storage device on which the present invention is based.

FIG. 11 shows such a data storage device. As shown in FIG. 11, data storing means 102 is provided in a case 101, and an IC memory card type connector adapter 104 is connected to the data storing means 102 by a connection cable 103 of sheet-like shape. The IC memory card type connector adapter 104 is fixed to the connection cable 103.

A controller for the data storing means 102 is provided in the IC memory card type connector adapter 104. The data storing means 102 may be selected from various media, such as the aforesaid FDD, a hard disk drive, an optical disk drive and a magnetic tape drive, and a controller dedicated to the selected medium needs to be used as the aforesaid controller. However, the shown arrangement is inconvenient because the IC memory card type connector adapter 104 and the connection cable 103 are inseparable from each other.

A fourth embodiment according to the present invention has been made in the light of the above-described problems, and the object of the fourth embodiment is to provide a data storage device which includes an IC memory card type connection adapter and a connection cable which are connected to each other in readily separable form so that various data storage means and various IC memory card type connector adapters each having a built-in controller can be exchanged during use as required.

To achieve the above object, according to the fourth embodiment of the present invention, there is provided a data storage device which is externally removably attachable to computer application equipment and which includes an IC memory card type connection adapter and a connection cable for connecting the IC memory card type connector adapter and data storing means. The data storage device is arranged in such a manner that the data storing means can be connected to the computer application equipment by inserting the IC memory card type connection adapter into an IC memory card slot provided in the computer application equipment, and the IC memory card type connection adapter and the connection cable are separably connected by connecting means.

To achieve the same object, it is also desirable that the connecting means be provided with a structure approximately similar to that of a battery case of an IC memory card.

With the connecting means, it is possible to readily separate and connect the IC memory card type connection adapter and the connection cable as required. Accordingly, if the controller of the IC memory card type connection adapter is replaced with a different controller, it is possible to connect the IC memory card type connection adapter to the connection cable. Also, the connecting means has a structure approximately similar to that of the battery case of an IC memory card. Accordingly, since constituent parts for memory cards can be used to manufacture the connecting means, it is possible to effect a cost reduction.

Fourth Embodiment

The fourth embodiment of the present invention will be described below with reference to FIGS. 12 through 14.

Figure 12:
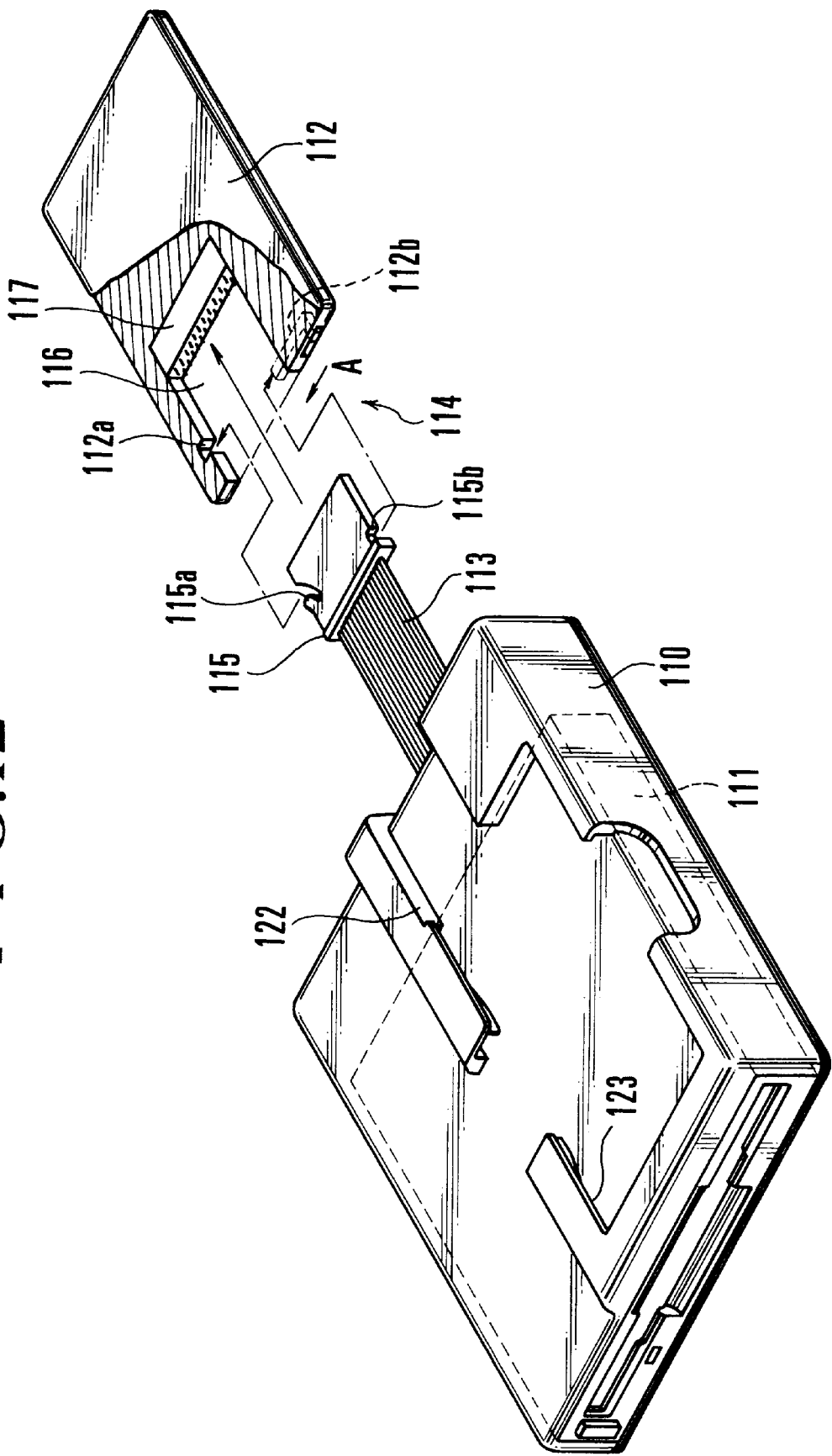
FIG. 12 is a diagrammatic perspective view showing a data storage device according to a fourth embodiment of the present invention.
Figure 13:
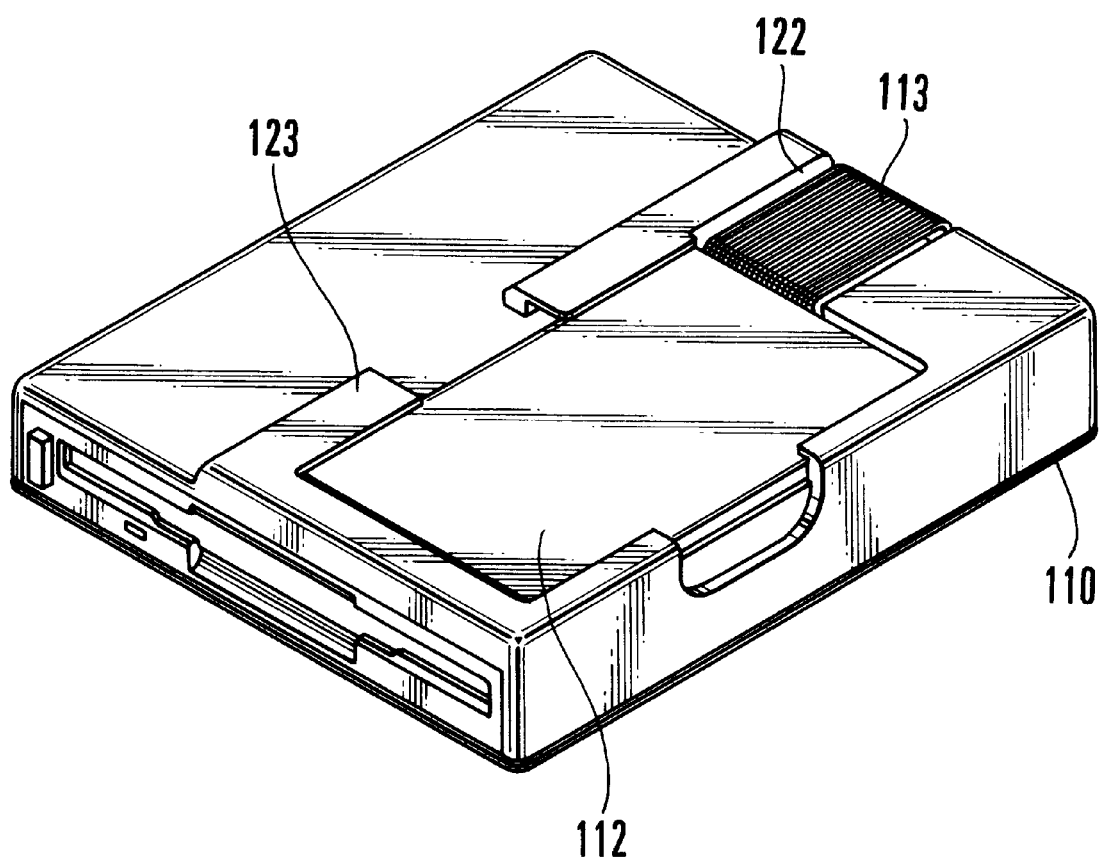
FIG. 13 is a diagrammatic perspective view showing the state in which an IC memory card type connection adapter is accommodated since the device of FIG. 12 need not be used.

FIG. 12 is a diagrammatic perspective view, partially broken away, showing a data storage device according to the fourth embodiment, and FIG. 13 is a diagrammatic perspective view showing the state in which an IC memory card type connection adapter of the data storage device is accommodated in the holding recess of a case.

Referring to FIG. 12, data storing means 111 is provided in a case 110. The data storing means 111 is formed by a floppy disk drive (FDD), a magnetic tape drive or the like. If the data storing means 111 is an FDD, there is the advantage that a large amount of data can be stored inexpensively. If the data storing means 111 is a magnetic tape drive, there is the advantage that a large amount of data can be stored on one reel of magnetic tape.

An IC memory card type connection adapter 112 is provided outside of the case 110. The IC memory card type connection adapter 112 is connected to the data storing means 111 provided in the case 110 by a connection cable 113 of sheet-like shape. The IC memory card type connection adapter 112 and the connection cable 113 are separably connected by connecting means 114.

The connecting means 114 includes a female connector 115 attached to the connection cable 113 and a male connector 117 provided at the internal end of an insertion opening 116 of the IC memory card type connection adapter 112. The female connector 115 has a structure approximately similar to that of the battery case of an IC memory card which will be described later, and has an elastic engagement projection 115a in one side portion and an engagement recess 115b in the other side portion. An engagement recess 112a and a slidable engagement member 112b are respectively provided in the opposing internal edge portions of the IC memory card type connection adapter 112 which face the insertion opening 116.

In the above-described arrangement, the data storing means 111 and the IC memory card type connection adapter 112 are connected in the following manner. First, when the female connector 115 is inserted into the IC memory card type connection adapter 112, the female connector 115 and the male connector 117 are connected to each other and the elastic engagement projection 115a of the female connector 115 engages with the engagement recess 112a of the IC memory card type connection adapter 112. Then, when the slidable engagement member 112b is made to move in the direction of the arrow A shown in FIG. 12, the leading end of the slidable engagement member 112b engages with the engagement recess 115b of the female connector 115. Thus, the female connector 115 is securely connected and fixed to the IC memory card type connection adapter 112. If this IC memory card type connection adapter 112 is inserted into an IC memory card slot which is provided in computer application equipment (not shown), such as a personal computer, the computer application equipment and the data storing means 111 are connected to each other, so that data files can be transferred between the computer application equipment and the data storing means 111.

Figure 14:
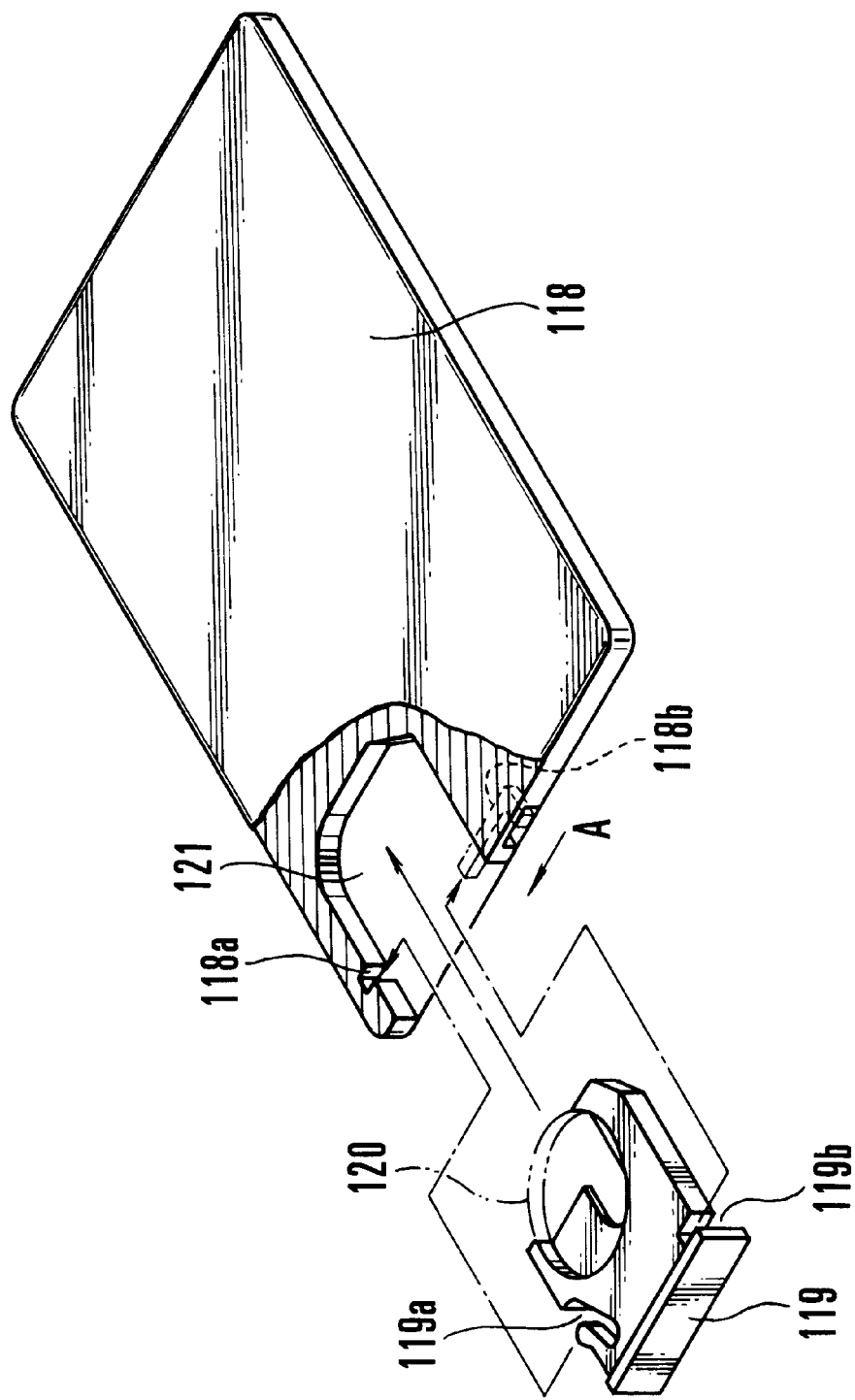
FIG. 14 is a diagrammatic perspective view showing a general IC memory card and a general battery case.

FIG. 14 is a diagrammatic perspective view, partially broken away, showing the arrangement of a general IC memory card having a built-in battery. In FIG. 14, an IC memory card is indicated by reference numeral 118, and a battery case is indicated by reference numeral 119. An engagement recess 118a and a slidable engagement member 118b are respectively provided in the opposing internal edge portions of the IC memory card 118 which face an insertion opening 121. The battery case 119 has an elastic engagement projection 119a in one side portion and an engagement recess 119b in the other side portion. A small flat battery 120 is accommodated in the battery case 119. When the battery case 119 is inserted into the insertion opening 121 of the IC memory card 118, the elastic engagement projection 119a of the battery case 119 engages with the engagement recess 118a of the IC memory card 118. When the slidable engagement member 118b is made to move in the direction of the arrow A shown in FIG. 14, the leading end of the slidable engagement member 118b engages with the engagement recess 119b of the battery case 119. Thus, the battery case 119 is securely fixed in the insertion opening 121 of the IC memory card 118.

In the above-described manner, fixed connection of the connection cable 113 of the data storage device described above and the IC memory card type connection adapter 112 can be achieved by using a structure approximately similar to that of the battery case 119 to be fitted into the IC memory card 118. Accordingly, since the connection of the connection cable 113 and the IC memory card type connection adapter 112 can be effected by employing the space of the insertion opening 121 into which to insert the battery case 119, it is not necessary to alter the external appearance of the data storage device by providing a connector or the like thereon as a separate component.

If the data storage device need not be used, the connection cable 113 is bent as shown in FIG. 13 and fitted into a fitting groove 122 of the case 110 and the IC memory card type connection adapter 112 is accommodated in a holding recess 123 of the case 110. Accordingly, the portability of the data storage device can be improved.

Although not specifically described herein, it is also preferable to adopt an arrangement capable of connecting the data storing means 111 and the connection cable 113 in such a manner that they can be readily separated from each other by a one-touch operation.

As described above in detail, the data storage device according to the fourth embodiment includes the IC memory card type connection adapter which connects the data storing means and computer application equipment by being inserted into the IC memory card slot provided in computer application equipment, and the IC memory card type connection adapter and the connect ion cable connected to the data storing means are separably connected by the connecting means. Accordingly, it is possible to readily exchange IC memory card type connection adapters for individual data storing means.

Further, since the connecting means has a structure approximately similar to that of the battery case of the IC memory card, it is possible to effect connection and separation of the IC memory card type connection adapter and the connection cable by means of a general fitting structure for fitting a battery case into an IC memory card. Accordingly, since constituent parts for IC memory cards can be used to manufacture the connecting means, it is possible to effect a cost reduction.

A fifth embodiment of the present invention will be described below.

As described above, the present invention is intended to provide an arrangement which makes it possible to connect a data storage device other than an IC memory card, for example, an FDD, to computer application equipment by inserting an IC memory card type connection adapter into an IC memory card slot provided in computer application equipment such as a personal computer.

However, such a data storage device has the problem that if the IC memory card type connection adapter is inserted into the IC memory card slot of a host computer system (computer application equipment), the connection adapter occupies the IC memory card slot with the result that it becomes impossible to employ another IC memory card together with the connection adapter.

The fifth embodiment has been made in the light of the above-described problem, and its object is to provide computer peripheral equipment and an IC memory card type connection adapter which is capable of connecting not only computer peripheral equipment but also an IC memory card to computer application equipment via one IC memory card slot provided in the computer application equipment, as well as which makes it possible to effectively utilize the aforesaid one IC memory card slot.

To achieve the above object, according to the fifth embodiment, there is provided computer peripheral equipment which is externally attachable to computer application equipment, and the body of the computer peripheral equipment is provided with an IC memory card type connection adapter which is capable of connecting the body to the computer application equipment by being inserted into an IC memory card slot provided in the computer application equipment. The IC memory card type connection adapter is provided with an IC memory card socket.

To achieve the same object, according to the sixth embodiment, there is provided an arrangement which includes an IC memory card type connection adapter body and an IC memory card socket provided on the IC memory card type connection adapter body. The connection adapter body has the function of connecting computer application equipment and computer peripheral equipment, an external communication line or the like by being inserted into an IC memory card slot provided in the computer application equipment.

In the case of the computer peripheral equipment according to the fifth embodiment, the body of the computer peripheral equipment is connected to the computer application equipment by inserting the IC memory card type connection adapter provided on the body of the computer peripheral equipment into the IC memory card slot provided in the computer application equipment, and an IC memory card can be simultaneously fitted into the IC memory card socket provided on the IC memory card type connection adapter. Accordingly, the computer peripheral equipment can be connected to the computer application equipment via one IC memory card slot provided therein, and the IC memory card can also be connected to this IC memory card slot.

In the case of the IC memory card type connection adapter according to the sixth embodiment, computer peripheral equipment, an external communication line or the like is connected to the computer application equipment by inserting the IC memory card type connection adapter body into the IC memory card slot provided in the computer application equipment, and an IC memory card can be simultaneously fitted into the IC memory card socket provided on the IC memory card type connection adapter body. Accordingly, the computer peripheral equipment, the external communication line or the like can be connected to the computer application equipment via one IC memory card slot provided therein, and the IC memory card can also be connected to this IC memory card slot.

The fifth and sixth embodiments will be sequentially described below with reference to FIGS. 15 and 16 in that order.

Fifth Embodiment

Figure 15:
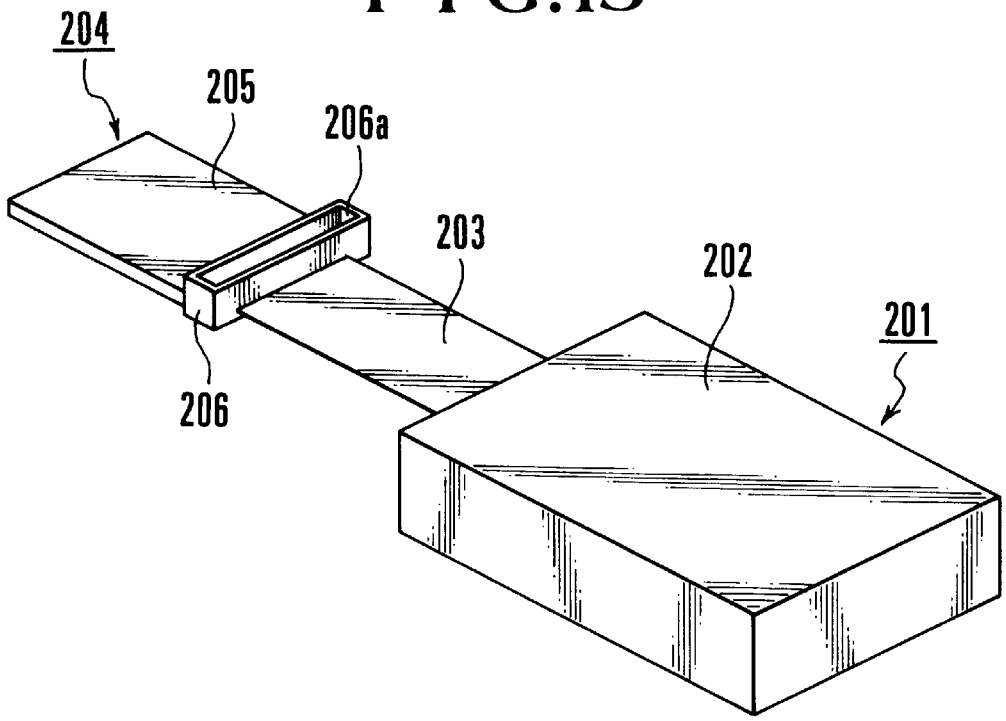
FIG. 15 is a diagrammatic perspective view showing computer peripheral equipment and an IC memory card type connection adapter according to a fifth embodiment of the present invention.

FIG. 15 is a schematic perspective view showing an IC memory card type connection adapter and a data storage device which is computer peripheral equipment according to the fifth embodiment of the present invention. In FIG. 15, a device body is indicated by reference numeral 201, and data storing means (not shown) is provided in a case 202.

An IC memory card type connection adapter 204 is connected to one external end of the case 202 by a connection cable 203 of sheet-like shape. The IC memory card type connection adapter 204 includes an IC memory card type connection adapter body 205 and an IC memory card socket 206. The IC memory card type connection adapter body 205 has approximately the same shape as an IC memory card (not shown) which can be inserted into an IC memory card slot provided in computer application equipment (not shown) to which to externally attach the data storage device, such as a host computer system or a personal computer. The IC memory card socket 206 is provided at one end of the IC memory card type connection adapter body 205 (at the end of the adapter body 205 which is closer to the connection cable 203), and the IC memory card can be fitted into the IC memory card socket 206. The IC memory card socket 206 is disposed integrally with the aforesaid end of the IC memory card type connection adapter body 205 with a fitting slot 206a faced up.

According to the above-described arrangement, by inserting the IC memory card type connection adapter body 205 into the IC memory card slot of the aforesaid type of computer application equipment, the device body 201 is connected to the computer application equipment via the connection cable 203 and the IC memory card type connection adapter body 205, whereby transfer of data is enabled between the computer application equipment and the device body 201.

If the IC memory card is fitted into the IC memory card socket 206 with the IC memory card type connection adapter body 205 inserted into the IC memory card slot of the computer application equipment, transfer of data is enabled between the IC memory card and the computer application equipment or between the IC memory card and the device body 201.

Accordingly, one IC memory card slot provided in the computer application equipment can be utilized for two purposes.

Sixth Embodiment

The sixth embodiment of the present invention will be described below with reference to FIG. 16.

Figure 16:
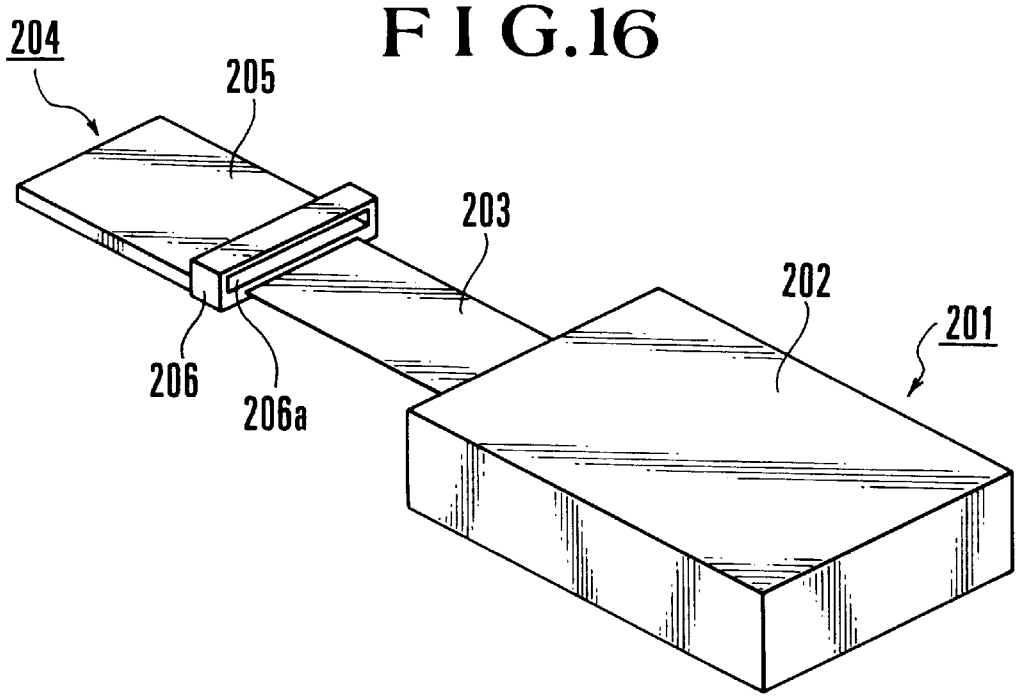
FIG. 16 is a diagrammatic perspective view showing computer peripheral equipment and an IC memory card type connection adapter according to a sixth embodiment of the present invention.

FIG. 16 is a schematic perspective view showing a data storage device which is computer peripheral equipment according to the sixth embodiment. In FIG. 16, the same reference numerals are used to denote parts identical to those of the fifth embodiment described above.

The sixth embodiment differs from the fifth embodiment in that the IC memory card socket 206 is disposed integrally with one end of the IC memory card type connection adapter body 205 with the fitting slot 206a faced sideways (toward the device body 201). The arrangement of the other parts of the sixth embodiment is substantially identical to that of the corresponding parts of the fifth embodiment.

Although each of the fifth and sixth embodiments is provided with a single IC memory card socket 206, the number of IC memory card sockets 206 may be two or more.

It is also possible to adopt a structure in which the IC memory card type connection adapter 204 can be used separately from the device body 201.

The IC memory card type connection adapter 204 may be replaced with a card including a built-in IC, such as a modem card for connection to computer peripheral equipment for use in an application other than data storage, for example, a telephone line. Even in the case of such a modem card, by providing the IC memory card socket 206, not only is it possible to utilize one IC memory card slot provided in the computer peripheral equipment, but also it is possible to achieve a functional improvement by fitting an expansion memory into the IC memory card socket 206.

As described above, in the computer peripheral equipment and the IC memory card type connection adapter according to the fifth and six embodiments, since the IC memory card socket is provided on the IC memory card type connection adapter, both an external device, such as computer peripheral equipment, and an IC memory card can be connected at once to computer application equipment via an IC memory card slot provided in computer application equipment. Accordingly, it is possible to provide the advantage that one IC memory card slot can be effectively utilized.

A seventh embodiment of the present invention will be described below. The seventh embodiment relates to a power-saving art.

Most personal computers of the recent portable type are battery-driven, and it is demanded, as a matter of course, that the above-described data storage device be able to operate for as long a time as possible even by battery driving. To meet this demand, energy-saving types of components, such as a motor and a semiconductor, are adopted in such a data storage device. However, if a user happens to forget to turn off the power switch, the battery is wastefully consumed, with the result that the life of the battery used becomes shorter.

The seventh embodiment has been made in the light of the above-described problem, and its object is to provide an energy-saving type of data storage device having a convenient arrangement which is capable of automatically turning on or off a power source to start or stop the operation of the data storage device without the need for a user to operate a power switch.

To achieve the above object, according to the seventh embodiment, there is provided a data storage device which is externally removably attached to computer application equipment and which includes a connection adapter, an accommodating part in which to removably accommodate the connection adapter, and detecting means provided in the accommodating part for detecting whether the connection adapter is accommodated in the accommodating part, so that a power source is turned on or off on the basis of a detection signal provided by the detecting means.

To achieve the above object, it is desirable that the connection adapter be accommodated in the state of being partially covered by the case.

This arrangement operates in the following manner. If the data storage device need not be used, when the connection adapter is accommodated in the accommodating part of the case in which data storing means is provided, the detecting means detects the state of accommodation of the connection adapter and the power source of the data storage device can be turned off on the basis of a detection signal provided by the detecting means. If the data storage device needs to be used, when the connection adapter is removed from the accommodating part of the case, the detecting means detects the removal of the connection adapter and the power source of the data storage device is turned on on the basis of a detection signal provided by the detecting means, whereby the data storage device can be immediately activated.

Seventh Embodiment

The seventh embodiment will be described below in detail with reference to FIGS. 17 and 18.

FIG. 17 is a diagrammatic perspective view of a data storage device according to the seventh embodiment, and FIG. 18 is a schematic view showing the internal arrangement of the data storage device of FIG. 17. As shown in both of the figures, data storing means 302 is provided in a case 301. The data storing means 302 is formed by a floppy disk drive (FDD), a magnetic tape drive or the like. If the data storing means 302 is an FDD, there is the advantage that a large amount of data can be stored inexpensively. If the data storing means 302 is a magnetic tape drive, there is the advantage that a large amount of data can be inexpensively stored on one reel of magnetic tape.

An IC memory card type connection adapter 303 having a flat rectangular shape is provided outside of the case 301. The IC memory card type connection adapter 303 is connected at one longitudinal end to the data storing means 302 provided in the case 301 by a connection cable 304 of sheet-like shape and having flexibility.

The top face of the case 301 is provided with an accommodating part 305 in which to accommodate the IC memory card type connection adapter 303 which is not used and a fitting groove 306 into which to removably fit the connection cable 304.

The accommodating part 305 has a recess part 307 the top plan shape of which corresponds to the top plan shape of the IC memory card type connection adapter 303. The longitudinal size of the recess part 307 coincides with the longitudinal size of the IC memory card type connection adapter 303. The breadthwise size of the recess part 307 is selected to be greater than that of the IC memory card type connection adapter 303 by a predetermined size.

Figure 21A:
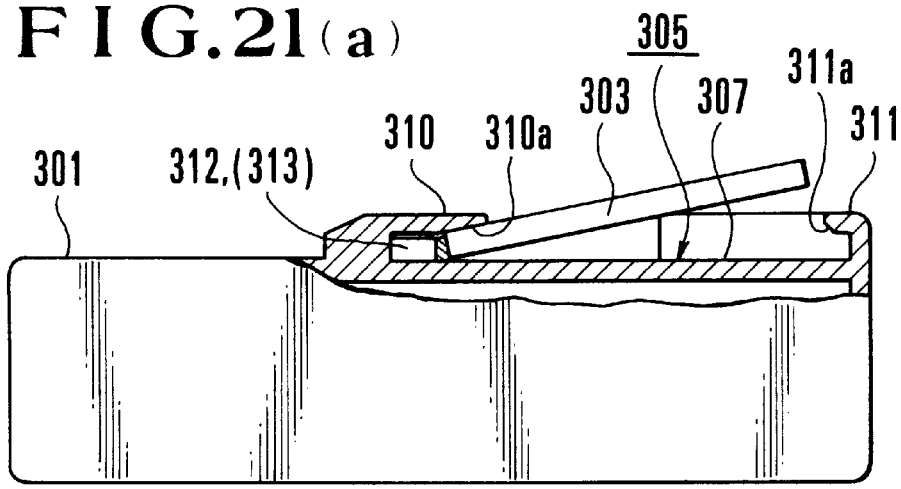
FIGS. 21(a), 21(b) and 21(c) are explanatory views showing a procedure for accommodating the IC memory card type connection adapter in the accommodating part of the case of the data storage device of FIG. 17.
Figure 21B:
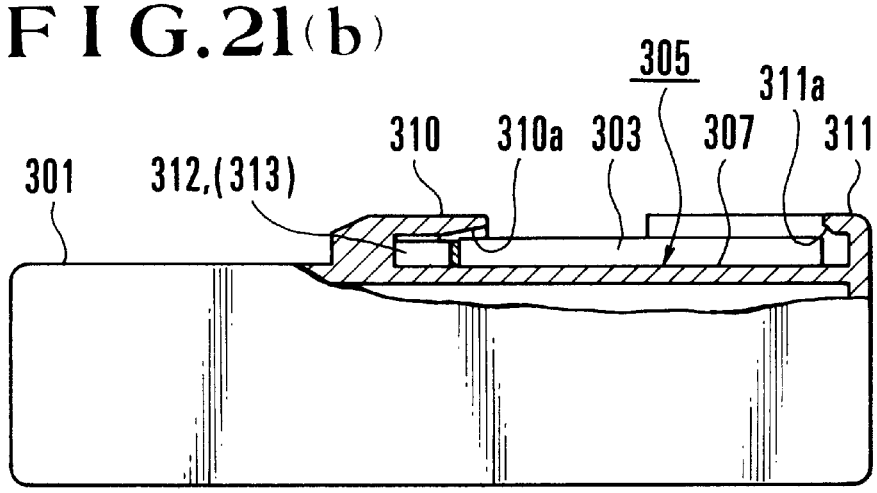
Figure 21C:
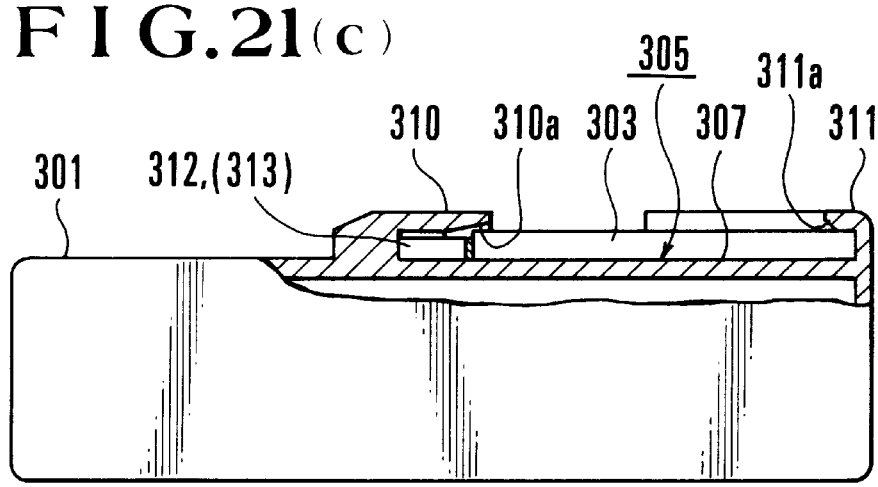

Cutout portions 308 and 309 are respectively formed in the approximately middle portions of the breadthwise opposing side walls of the recess part 307, so that it is possible to readily remove the IC memory card type connection adapter 303 from the recess part 307 by hooking fingers through the respective cutout portions 308 and 309 onto the IC memory card type connection adapter 303 accommodated in the recess part 307. Engaging walls 310 and 311 are respectively formed integrally with the upper portions of the breadthwise opposing side walls of the recess part 307 in such a manner as to extend horizontally toward each other as shown in FIGS. 21(a) to 21(c). The breadthwise opposing sides of the upper face of the IC memory card type connection adapter 303 are brought into engagement with the engaging walls 310 and 311 so that the IC memory card type connection adapter 303 is prevented from accidentally coming off the recess part 307.

The extension width of each of the engaging walls 310 is selected to be greater than the extension width of each of the engaging walls 311 (by approximately three times). The lower faces of the extending end portions of the engaging walls 310 and 311 are respectively formed as inclined faces 310a and 311a so that the IC memory card type connection adapter 303 can be smoothly inserted into and removed from the lower-face sides of the engaging walls 310 and 311.

Elastic members 312 and 313, such as leaf springs, are provided between the respective engaging walls 310 and the top face of the case 301. The elastic members 312 and 313 serve to press against the engaging walls 311 the IC memory card type connection adapter 303 accommodated in the recess part 307. The bottom of the fitting groove 306 is flush with the bottom of the recess part 307.

A detecting switch (detecting means) 314 for detecting whether the IC memory card type connection adapter 303 is accommodated in the recess part 307 is mounted in the case 301 as shown in FIGS. 17 and 18. This detecting switch 314 is a normal push switch, and an operating element 314a projects by a small amount upward from the bottom of the recess part 307. When the IC memory card type connection adapter 303 is accommodated in the recess part 307, the operating element 314a is pressed by the IC memory card type connection adapter 303 to turn off the detecting switch 314.

This detecting switch 314 is connected to a battery 315 which is a power source for driving the data storage device, and has the function of turning on or off the battery 315. The battery 315 is provided in the case 301 as shown in FIGS. 17 and 18.

Referring to the operation of the above-described arrangement, when the IC memory card type connection adapter 303 is removed from the recess part 307 of the case 301 as shown in FIGS. 17 and 18, the operating element 314a of the detecting switch 314 moves upward and the detecting switch 314 is turned on, thereby turning on the power source. Thus, the data storage device is placed in its operative state. If the removed IC memory card type connection adapter 303 is inserted into an IC memory card slot provided in computer application equipment such as a personal computer (not shown), the computer application equipment and the data storing means 302 are connected to each other, so that data files can be transferred between the computer application equipment and the data storing means 302.

If the data storage device need not be used, the IC memory card type connection adapter 303 is accommodated in the recess part 307 of the case 301. The operation of accommodating the IC memory card type connection adapter 303 in the recess part 307 will be described below.

First, the connection cable 304 is folded back and fitted into the fitting groove 306. Then, the elastic members 312 and 313 are pressed while inserting one breadthwise edge portion of the IC memory card type connection adapter 303 into the gaps below the engaging walls 310 as shown in FIG. 21(a). Then, the breadthwise other edge portion of the IC memory card type connection adapter 303 is pressed down, thereby bringing the lower face of the IC memory card type connection adapter 303 into close contact with the bottom of the recess part 307 as shown in FIG. 21(b).

After that, if the operator separates the hand from the IC memory card type connection adapter 303, the IC memory card type connection adapter 303 is made to move toward the engaging walls 311 by the urging force of the elastic members 312 and 313, and the top face of the breadthwise other edge portion of the IC memory card type connection adapter 303 engages with the engaging walls 311. Thus, the IC memory card type connection adapter 303 is accommodated in the recess part 307 in a securely held state as shown in FIG. 21(c).

Figure 20:
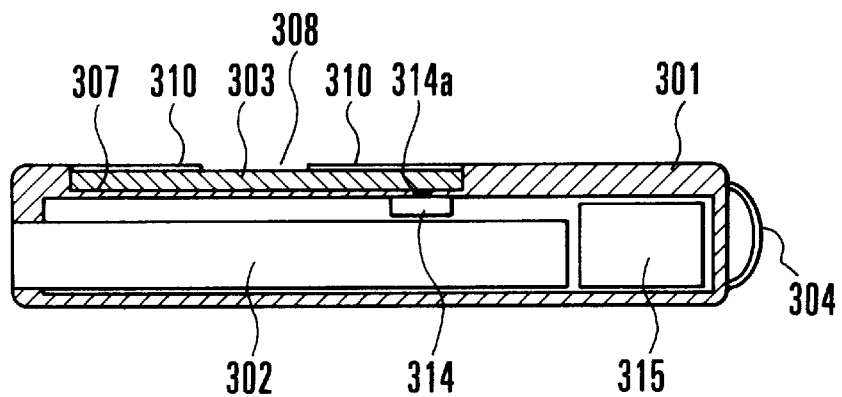
FIG. 20 is a schematic cross-sectional view of the data storage device of FIG. 19.

When the IC memory card type connection adapter 303 is accommodated in the recess part 307 in the above-described manner, the operating element 314a is pressed by the IC memory card type connection adapter 303 as shown in FIG. 20, the detecting switch 314 is turned off and the power source is automatically turned off.

As is apparent from the above description, in the seventh embodiment, the detecting switch 314 is provided in the case 301. The detecting switch 314 is turned on if the data storage device needs to be used and the IC memory card type connection adapter 303 is removed from the case 301, and if the data storage device need not be used and the IC memory card type connection adapter 303 is secured to the case 301, the detecting switch 314 is turned off. The power source of the data storage device can be turned on or off in the above-described manner. Accordingly, it is possible to prevent the operator from forgetting to turn off the power source, so that wasteful consumption of the battery 315 can be prevented.

It is also preferable to incorporate a charging mode for charging the battery 315 when a user ceases to use the data storage device and the detecting switch 314 detects that the IC memory card type connection adapter 303 is accommodated in the recess part 307 of the case 301.

Also, while the IC memory card type connection adapter 303 is accommodated in the recess part 307 of the case 301, the engaging walls 310 and 311 are kept in engagement with engagement with the breadthwise opposing sides of the upper face of the IC memory card type connection adapter 303. Accordingly, it is possible to securely hold the IC memory card type connection adapter 303 so that the malfunction of the detecting switch 314 can be prevented. Further, it is possible to prevent the IC memory card type connection adapter 303 from being damaged while the IC memory card type connection adapter 303 is being carried.

Figure 19:
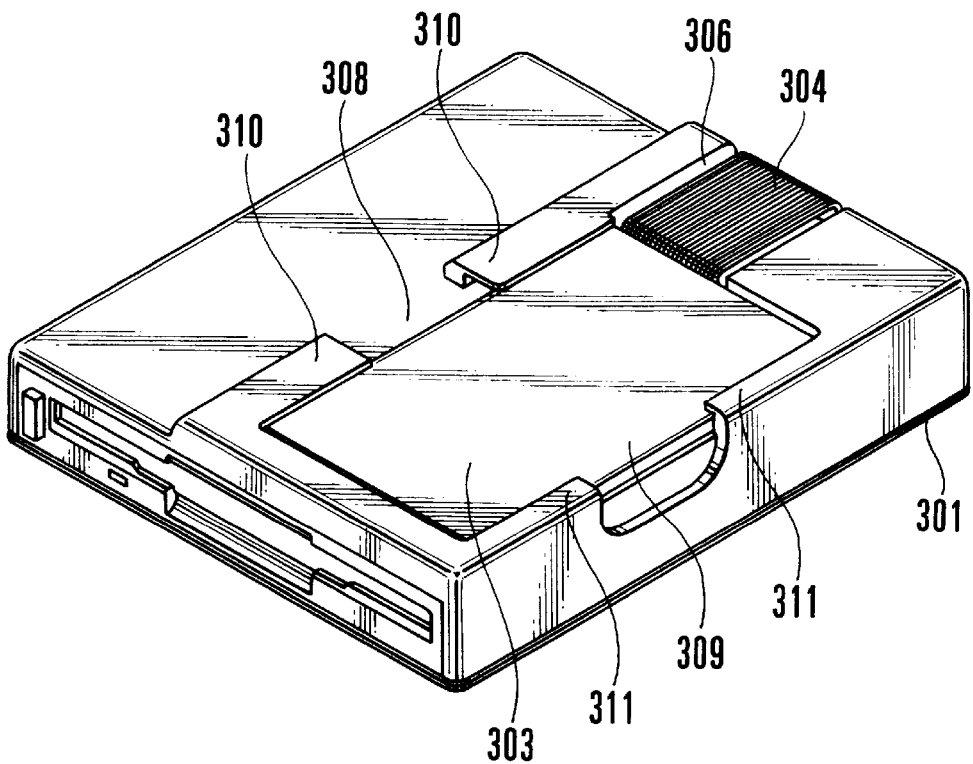
FIG. 19 is a diagrammatic perspective view showing a state in which the data storage device is unusable.

Also, since the case 301 is provided with the fitting groove 306 into which to fit the connection cable 304 as shown in FIG. 19, it is possible to prevent the connection cable 304 from being damaged. Further, since the case 301 can be carried with the connection cable 304 accommodated in the fitting groove 306, the portability is improved.

As is apparent from the above description, according to the seventh embodiment, the power source of the data storage device can be automatically turned on or off by removing the connection adapter from the case for the purpose of using the data storage device or by securing the connection adapter to the case for the purpose of stopping the use of the data storage device. Accordingly, it is possible to prevent a user from forgetting to turn off the power source, so that an energy-saving arrangement can be achieved. Further, since no user needs to manually turn on or off the power source, improved operability can be achieved. In addition, since the connection adapter can be accommodated in the accommodating part of the case if the data storage device need not be used, improved portability can be achieved.

An eighth embodiment of the present invention will be described below. This embodiment also relates to a power-saving art similarly to the seventh embodiment.

This kind of data storage device is arranged to be supplied with electricity from a power source provided in computer application equipment, such as a personal computer, or has a built-in battery as a power source. The power source of such a data storage device is turned on or off by means of a power switch irrespective of whether a storing (recording) medium is inserted in or removed from the data storage device.

In the case of such a conventional example, after the storing medium has been removed, if the power source remains on, the circuit of the data storage device continues to consume the power source. This leads to the disadvantage that an excessive burden is placed on the power source of the computer application equipment, such as a personal computer, or that the built-in battery rapidly reaches its final discharge.

The eighth embodiment has been made in the light of the above-described problem, and its object is to provide a data storage device of the energy-saving type which is capable of reducing wasteful consumption of a power source when the data storage device is not used.

To achieve the above object, according to the eighth embodiment, there is provided a data storage device which is externally attachable to computer application equipment via a connection adapter and which is provided with power source switching means operative to allow a power source to supply electricity to the data storage device in interlocked relationship to the operation of fitting a storing medium into the data storing means.

To achieve the same object, there is also provided a date storage device which is, in one preferred form, provided with a built-in battery as a power source and connecting means for stopping the supply of electricity from the rechargeable battery and simultaneously connecting the rechargeable battery to a charging circuit, in interlocked relationship to the operation of removing the storing medium from the data storage device.

The power source is turned on or off by means of the power source switching means in interlocked relationship to the operation of fitting or removing the storing medium into or from the data storage device. Accordingly, it is possible to reduce wasteful consumption of the power source when the data storage device is not used.

The eighth embodiment will be described below with reference to FIG. 22.

Eighth Embodiment

Figure 22:
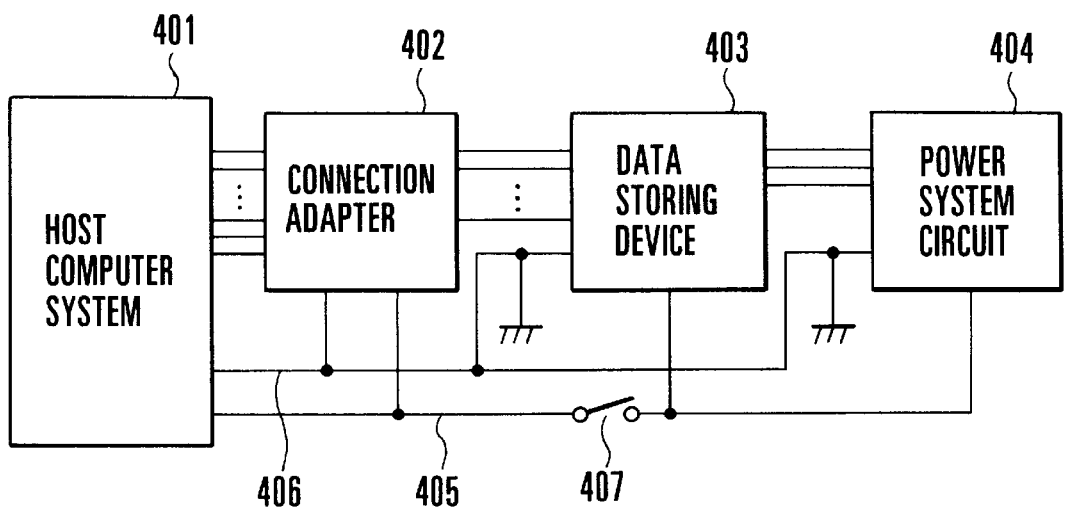
FIG. 22 is a schematic circuit block diagram showing the state in which a data storage device according to an eighth embodiment of the present invention is connected to computer application equipment.

FIG. 22 is a schematic circuit block diagram showing the state in which a data storage device according to the eighth embodiment of the present invention is connected to a host system, such as a personal computer. Referring to FIG. 22, a host computer system (computer application equipment) 401 has an IC memory card slot (not shown), and the data storing means of a data storage device 403 is connected to the host computer system 401 by an IC memory card type connection adapter 402 being inserted into the IC memory card slot.

The data storing means of the data storage device 403 is of a type which can be removably fitted with a storage (recording) medium, such as a floppy disk or a magnetic tape, and a power system circuit 404 is connected to the data storing means. The power system circuit 404 serves to drive components such as a motor, a solenoid and a lamp (none of which is shown).

The host computer system 401, the IC memory card type connection adapter 402, the data storage device 403 and the power system circuit 404 are connected to one another by a power source line 405 and a ground line 406.

A switch (power source switching means) 407 is interposed between the connection point at which the IC memory card type connection adapter 402 is connected to the power source line 405 and the connection point at which the data storage device 403 is connected to the power source line 405. This switch 407 serves to automatically perform switching between the connection of a power source (not shown) to the power system circuit 404 and the disconnection of the power source from the power system circuit 404 in interlocked relationship to the operation of fitting the data storage device 403 into the data storing means or the operation of removing the data storage device 403 from the data storing means.

In the above-described arrangement, when the storage medium is fitted into the data storing means of the data storage device 403, an operating element (not shown) of the switch 407 is pressed and turned on in interlocked relationship to the operation of fitting the storage medium. Thus, electricity is supplied from the power source to the data storage device 403 and the power system circuit 404 via the power source line 405, so that the data storage device 403 and the power system circuit 404 are brought into an operative state.

If the storing medium is removed from the data storing means during the operative state, the operating element of the switch 407 automatically resets and is turned off, so that the supply of electricity to the data storage device 403 and the power system circuit 404 is interrupted.

Ninth Embodiment

Figure 23:
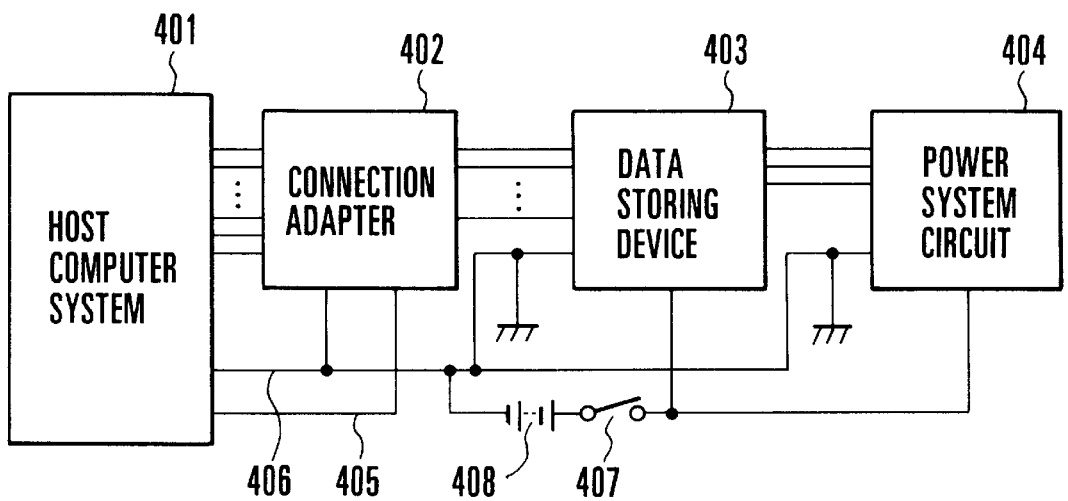
FIG. 23 is a schematic circuit block diagram showing the state in which a data storage device according to a ninth embodiment of the present invention is connected to computer application equipment.

FIG. 23 shows a ninth embodiment of the present invention, and in this figure, identical reference numerals are used to denote parts identical to those shown in FIG. 22. The ninth embodiment differs from the eighth embodiment in that a battery 408 is interposed between the movable contact of the switch 407 and the ground line 406. When the storing medium is fitted into the data storing means of the data storage device 403, the operating element of the switch 407 is pressed and turned on, so that electricity is supplied from the battery 408 to the data storage device 403 and the power system circuit 404.

If the storing medium is removed from the data storing means while electricity is being supplied, the operating element of the switch 407 automatically returns to its off state, so that the supply of electricity to the data storage device 403 and the power system circuit 404 is interrupted.

Tenth Embodiment

FIG. 24 shows a tenth embodiment of the present invention, and in this figure, identical reference numerals are used to denote parts identical to those shown in FIG. 22. The ninth embodiment differs from the eighth embodiment in that a switch 409 for detecting whether the storing medium has been fitted is provided in interlocked relationship to the switch 407. When the storing medium is fitted into the data storing means of the data storage device 403, the switch 407 and the switch 409 are simultaneously pressed and turned on. Thus, electricity is supplied from the power source to the power system circuit 404 and simultaneously the data storage device 403 recognizes that the storing medium has been fitted.

In the tenth embodiment, the switch 407 and the switch 409 may not be the aforesaid interlocked ones, and two independent switches may also be employed. The switch 409 may be omitted and it is possible to adopt an arrangement in which the data storage device 403 can detect though a signal line whether electricity is supplied to the power system circuit 404.

Eleventh Embodiment

FIG. 25 shows an eleventh embodiment of the present invention, and in this figure, identical reference numerals are used to denote parts identical to those shown in FIG. 24. The eleventh embodiment differs from the tenth embodiment in that a switching element 410 and a switching signal line 411 are provided instead of the switch 407. When the storing medium is fitted into the data storing means of the data storage device 403, the switch 409 is pressed and turned on. The data storage device 403 recognizes that the storing medium has been fitted, and switches the switching element 410 to its on state through the switching signal line 411 and supplies electricity to the connection cable 103 through the power source line 405.

Incidentally, in the eleventh embodiment, a solenoid relay may also be employed instead of the switching element 410.

Twelfth Embodiment

Figure 26:
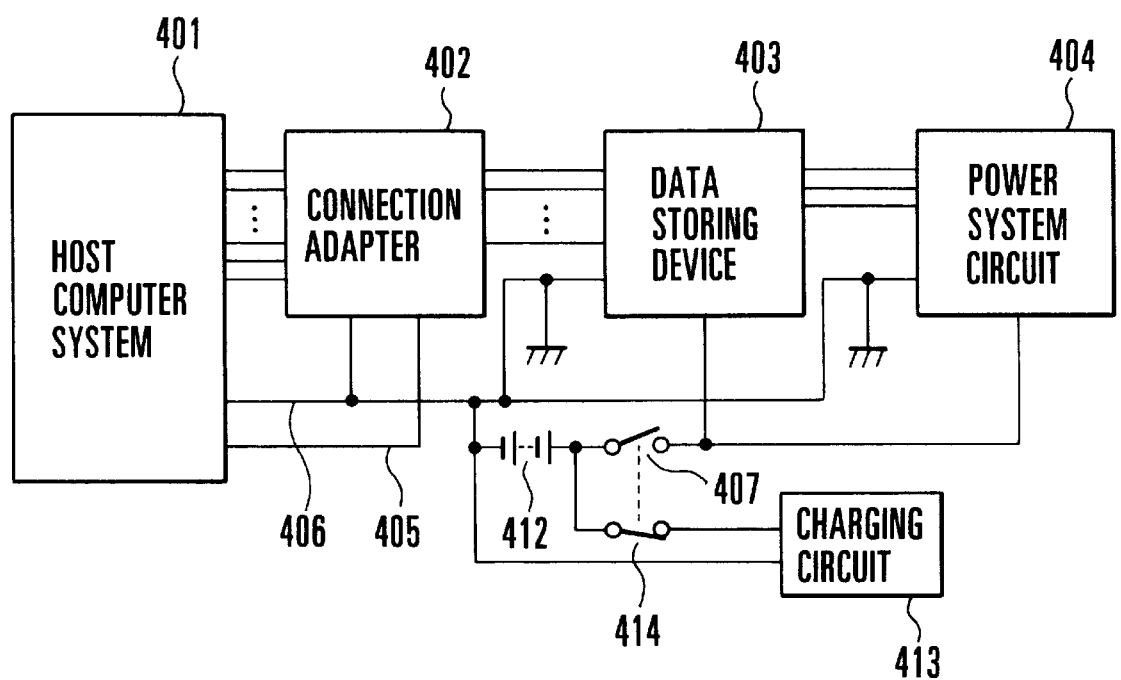
FIG. 26 is a schematic circuit block diagram showing the state in which a data storage device according to a twelfth embodiment of the present invention is connected to computer application equipment.

FIG. 26 shows a twelfth embodiment of the present invention, and in this figure, identical reference numerals are used to denote parts identical to those shown in FIG. 23. The twelfth embodiment differs from the ninth embodiment of FIG. 23 in that: a rechargeable battery 412 is provided instead of the battery 408; a charging circuit 413 for charging the rechargeable battery 412 is provided; and a switch 414, which interlocks with the switch 407 and the on/off operation of which is opposite to that of the switch 407, is provided between the rechargeable battery 412 and the charging circuit 413. When the storing medium is fitted into the data storing means of the data storage device 403, the switch 407 and the switch 414 are simultaneously pressed. The switch 407 switches from off to on so that electricity is supplied from the rechargeable battery 412 to the data storage device 403 and the power system circuit 404. Simultaneously, the switch 414 switches from on to off, thereby separating the rechargeable battery 412 and the charging circuit 413 from each other. If the storing medium is removed from the data storing means during such a state, the switch 407 is turned off to prevent wasteful consumption of the rechargeable battery 412, while the switch 414 is turned on and the charging circuit 413 is connected to the rechargeable battery 412 so that charging becomes possible. Thus, since the rechargeable battery 412 can be charged only in an inoperative state, it is possible to prevent an excessive burden from being placed on the charging circuit 413.

As is apparent from the above description, in each of the data storage devices according to the eighth to twelfth embodiments, since the on/off operation of the power source and the operation of fitting or removing the storing medium into or from the data storing means are interlocked with each other, it is possible to prevent wasteful consumption of the power source when the data storage device is not used, and it is also possible to reduce a burden to be placed on the power source of computer application equipment such as a host computer system. In the arrangement in which a battery is incorporated, it is possible to prevent wasteful consumption of the battery. Further, in the arrangement in which the rechargeable battery is incorporated, switching between the connection and the disconnection of the charging circuit to and from the rechargeable battery is performed simultaneously with switching between the connection and the disconnection of the rechargeable battery to the data storage device, etc., so that it is possible to prevent an excessive burden from being placed on the charging circuit.

A thirteenth embodiment of the present invention will be described below.

In the above-described data storage device, it is desirable to employ a long connection cable for the purpose of improving the operability with which an IC memory card type connection adapter is inserted into an IC memory card slot provided in computer application equipment. However, there is the problem that such a long connection cable impairs the portability of the data storage device.

The thirteenth embodiment has been made in the light of the above-described problem, and its object is to provide a data storage device which can employ a long connection cable to improve the operability with which an IC memory card type connection adapter is inserted into an IC memory card slot provided in computer application equipment, and also which can offer high portability by enabling the connection cable to be accommodated in a cable accommodating part of the case of the data storage device if the data storage device need not be used.

To achieve the above object, according to the thirteenth embodiment, there is provided a data storage device which is externally removably attachable to computer application equipment and which includes an IC memory card type connection adapter, data storing means provided in a case of the data storage device, a connection cable for connecting the IC memory card type connector adapter and the data storing means. The data storage device is arranged in such a manner that the data storing means can be connected to the computer application equipment by inserting the IC memory card type connection adapter into an IC memory card slot provided in the computer application equipment. The case of the data storage device is provided with a cable accommodating part in which to accommodate the connection cable if the data storage device need not be used.

To achieve the same object, it is also desirable to adopt an arrangement in which the connection cable is accommodated in the cable accommodating part in wound form, or to employ a connection cable of approximately circular cross-sectional shape.

Since the connection cable is long, it is possible to improve the operability with which the IC memory card type connection adapter is inserted into the IC memory card slot provided in the computer application equipment. Further, if the data storage device need not be used, the connection cable can be accommodated in the cable accommodating part provided in the case. Accordingly, since the long connection cable is prevented from impairing the portability of the data storage device, high portability can be realized.

The thirteenth embodiment of the present invention will be described below in detail with reference to FIGS. 27 and 28.

Thirteenth Embodiment

Figure 27:
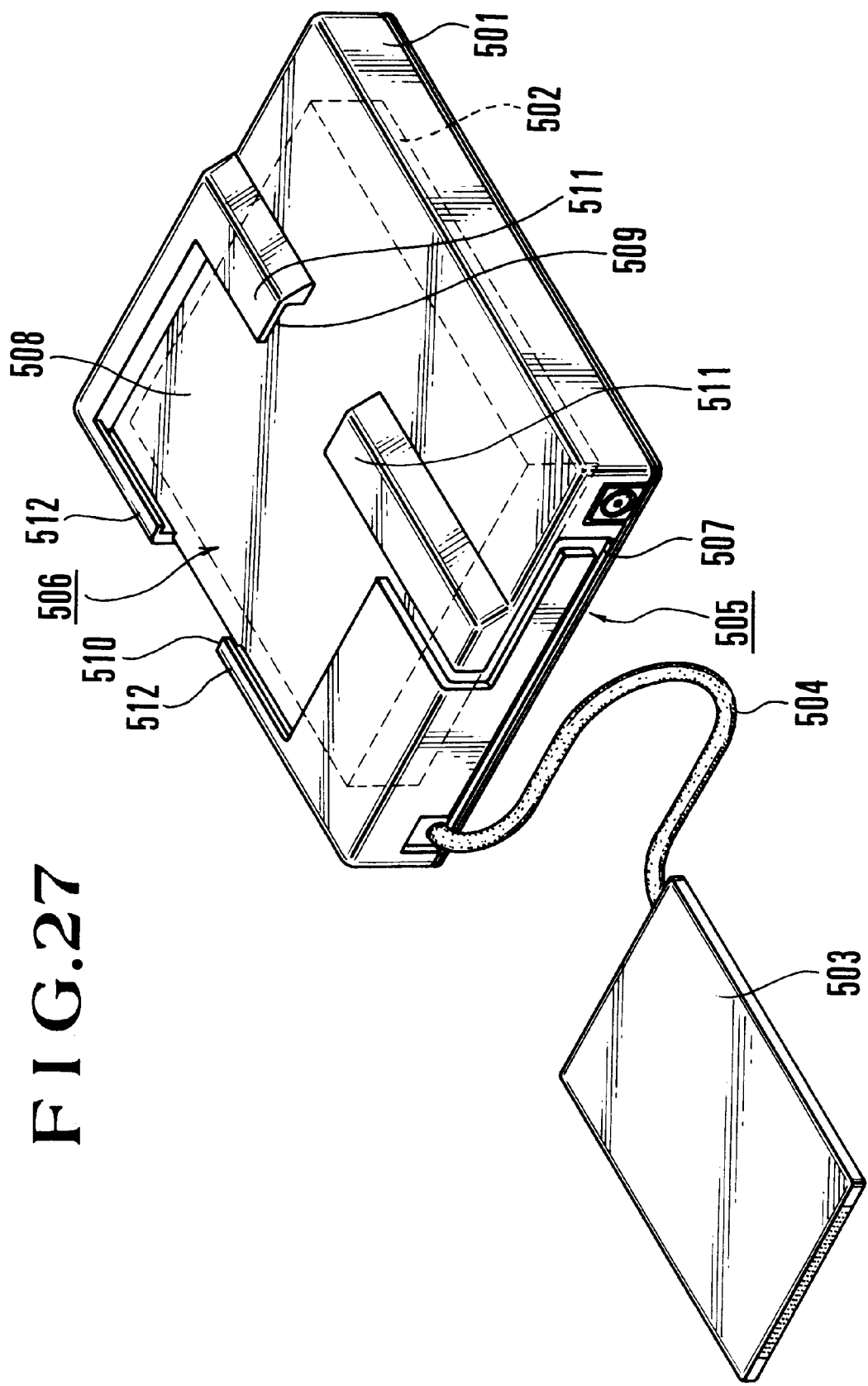
FIG. 27 is a diagrammatic perspective view showing a state in which a data storage device according to a thirteenth embodiment of the present invention is usable.
Figure 28:
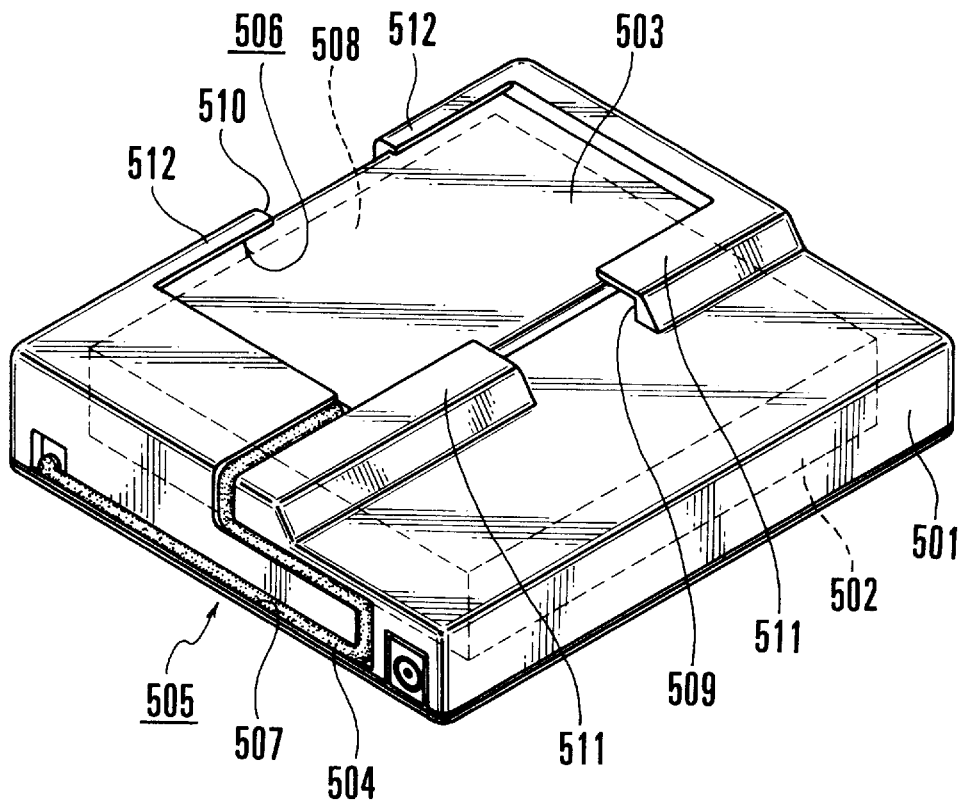
FIG. 28 is a diagrammatic perspective view showing a state in which the data storage device according to the thirteenth embodiment of the present invention is unusable.

FIG. 27 is a diagrammatic perspective view showing the state of the use of a data storage device according to the thirteenth embodiment of the present invention, and FIG. 28 is a diagrammatic perspective view showing the state of the nonuse of the data storage device. As shown in both of the figures, data storing means 502 is provided in a case 501. The data storing means 502 is formed by a floppy disk drive (FDD), a magnetic tape drive or the like. If the data storing means 502 is an FDD, there is the advantage that a large amount of data can be stored inexpensively. If the data storing means 502 is a magnetic tape drive, there is the advantage that a large amount of data can be inexpensively stored on one reel of magnetic tape.

An IC memory card type connection adapter 503 having a flat rectangular shape is provided outside of the case 501. The IC memory card type connection adapter 503 is connected at one longitudinal end to the data storing means 502 provided in the case 501 by a connection cable 504 of circular cross-sectional shape and having flexibility.

The length of the connection cable 504 is selected to be long enough to improve the operability with which the IC memory card type connection adapter 503 is inserted into an IC memory card slot provided in computer application equipment (not shown), such as personal computer.

The case 501 is provided with a cable accommodating part 505 in which to accommodate the connection cable 504 which is not used and an adapter accommodating part 506 in which to accommodate the IC memory card type connection adapter 503 which is not used.

The cable accommodating part 505 is formed by a groove 507 which is formed to extend from one end face to the top face of the case 501 in the shown manner. The connection cable 504 can be removably fitted into the groove 507.

The adapter accommodating part 506 has a recess part 508 the top plan shape of which corresponds to the top plan shape of the IC memory card type connection adapter 503. The longitudinal size of the recess part 508 coincides with the longitudinal size of the IC memory card type connection adapter 503. The breadthwise size of the recess part 508 is selected to be greater than that of the IC memory card type connection adapter 503 by a predetermined size.

Figures 30, 31:
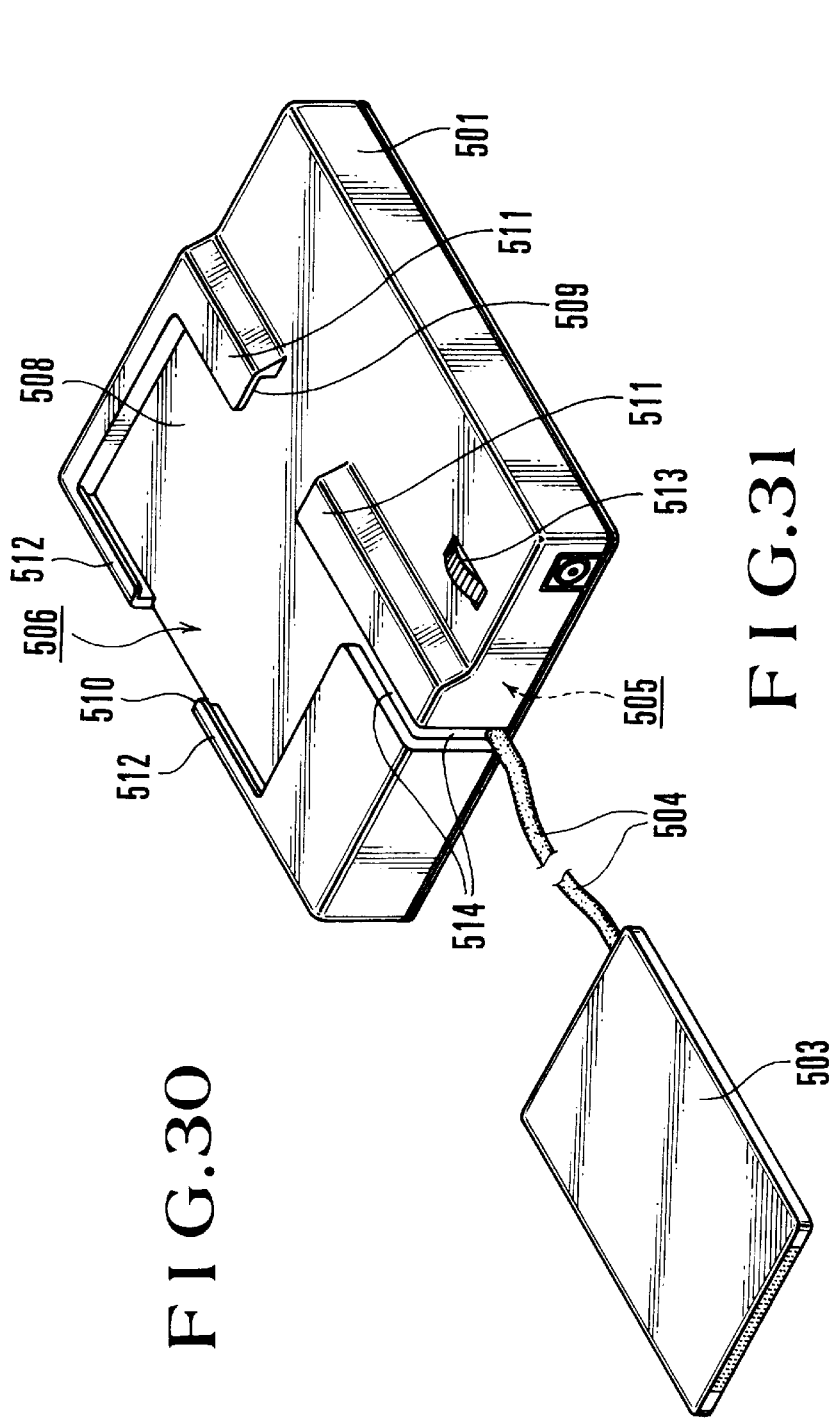
FIG. 30 is a diagrammatic perspective view showing a state in which the data storage device according to a fifteenth embodiment of the present invention is usable.
FIG. 31 is a partially cut away, side elevational view of the data storage device.

Cutout portions 509 and 510 are respectively formed in the approximately middle portions of the breadthwise opposing side walls of the recess part 508, so that it is possible to readily remove the IC memory card type connection adapter 503 from the recess part 508 by hooking fingers through the respective cutout portions 509 and 510 onto the IC memory card type connection adapter 503 accommodated in the recess part 508. Engaging walls 511 and 512 are respectively formed integrally with the upper portions of the breadthwise opposing side walls of the recess part 508 in such a manner as to extend horizontally toward each other as shown in FIG. 31. The breadthwise opposing sides of the upper face of the IC memory card type connection adapter 503 are brought into engagement with the engaging walls 511 and 512 so that the IC memory card type connection adapter 503 is prevented from accidentally coming off the recess part 508.

The extension width of each of the engaging walls 511 is selected to be greater than the extension width of each of the engaging walls 512 (by approximately three times). The lower faces of the extending end portions of the engaging walls 511 and 512 are respectively formed as inclined faces so that the IC memory card type connection adapter 503 can be smoothly inserted into and removed from the lower-face sides of the engaging walls 511 and 512.

Elastic members (not shown), such as leaf springs, are provided between the respective engaging walls 511 and the top face of the case 501. These elastic members serve to press against the engaging walls 512 the IC memory card type connection adapter 503 accommodated in the recess part 508. The bottom of the groove 507 of the cable accommodating part 505 located on the top face of the case 501 is flush with the bottom of the recess part 508.

Referring to the operation of the above-described arrangement, when the data storage device is to be used, as shown in FIG. 27, the IC memory card type connection adapter 503 is removed from the recess part 508 of the adapter accommodating part 506 of the case 501 and the connection cable 504 is removed from the groove 507 of the cable accommodating part 505. Then, if the removed IC memory card type connection adapter 503 is inserted into an IC memory card slot provided in computer application equipment such as a personal computer (not shown), the computer application equipment and the data storing means 502 are connected to each other, so that data files can be transferred between the computer application equipment and the data storing means 502.

If the data storage device need not be used, the IC memory card type connection adapter 503 and the connection cable 504 are respectively accommodated in the recess part 508 of the adapter accommodating part 506 of the case 501 and the groove 507 of the cable accommodating part 505. This accommodating operation will be described below.

First, the connection cable 504 is folded back and fitted into the groove 507. Then, the elastic members are pressed while inserting one breadthwise edge portion of the IC memory card type connection adapter 503 into the gaps below the engaging walls 511. Then, the breadthwise other edge portion of the IC memory card type connection adapter 503 is pressed down, thereby bringing the lower face of the IC memory card type connection adapter 503 into close contact with the bottom of the recess part 508.

After that, if the operator separates the hand from the IC memory card type connection adapter 503, the IC memory card type connection adapter 503 is made to move toward the engaging walls 512 by the urging force of the elastic members, and the top face of the breadthwise other edge portion of the IC memory card type connection adapter 503 engages with the engaging walls 512. Thus, the IC memory card type connection adapter 503 is accommodated in the recess part 508 in a securely held state.

Fourteenth Embodiment

Figure 29:
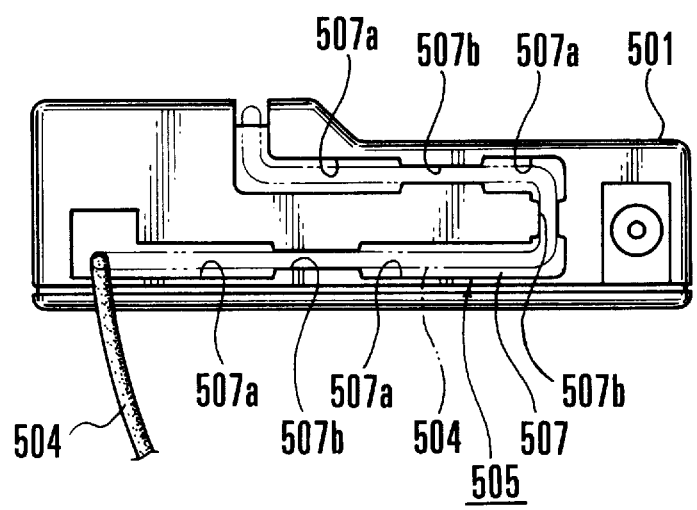
FIG. 29 is a diagrammatic side elevational view of the case of a data storage device according to a fourteenth embodiment of the present invention.

A fourteenth embodiment of the present invention will be described below with reference to FIG. 29. FIG. 29 is a diagrammatic side elevational view of the case of a data storage device according to the fourteenth embodiment. In FIG. 29, identical reference numerals are used to denote parts identical to those of the above-described thirteenth embodiment.

The fourteenth embodiment differs from the thirteenth embodiment in that the groove 507 which constitutes the cable accommodating part 505 includes a plurality of enlarged-width portions 507a into which the connection cable 504 is to be loosely fitted and a plurality of reduced-width portions 507b in which the connection cable 504 is press-fitted, the enlarged-width portions 507a and the reduced-width portions 507b being arranged in alternate sequence. According to the fourteenth embodiment, it is possible to readily fit or remove the connection cable 504 into or from the groove 507.

Fifteenth Embodiment

A fifteenth embodiment of the present invention will be described below with reference to FIGS. 30 and 31. FIG. 30 is a diagrammatic perspective view showing the state of the use of a data storage device according to the fifteenth embodiment of the present invention, and FIG. 31 is a partially cut away, side elevational view of the data storage device. In both figures, identical reference numerals are used to denote parts identical to those of the above-described thirteenth embodiment.

The fifteenth embodiment differs from the thirteenth embodiment in that the cable accommodating part 505 is arranged to accommodate the connection cable 504 in wound form.

Specifically, the cable accommodating part 505 is provided with a winding dial 513 which is rotatably supported in the case 501, and the peripheral portion of the winding dial 513 partially projects upward from the top face of the case 501. By rotating the winding dial 513 in the counterclockwise direction as viewed in FIG. 31, the connection cable 504 is wound around a winding shaft 513a and accommodated in the cable accommodating part 505.

Further, a fitting groove 514 into which to fit the connection cable 504 is formed to extend from one end face to the top face of the case 501 in the shown manner. If the data storage device need not be used, the proximal end portion of the connection cable 504 can be fitted into the fitting groove 514.

As described above, in the data storage device according to any of the thirteenth to fifteenth embodiments, since a long connection cable can be employed, it is possible to improve the operability with which an IC memory card type connection adapter is inserted into an IC memory card slot provided in computer application equipment. In addition, if the data storage device need not be used, the connection cable can be accommodated in a cable accommodating part of the case of the data storage device, whereby the portability of the data storage device can be improved.

A sixteenth embodiment of the present invention will be described below.

The sixteenth embodiment is intended to improve the operability of a disk inserting/ejecting operation of a disk drive, such as a floppy disk drive or a laser disc drive, of the above-described type to which an IC memory card type connection adapter is removably attachable, or the operability of a disk inserting/ejecting operation of a disk drive unit of reduced thickness or size.

In general, the above-described type of floppy disk drive is arranged to perform recording or reproduction of information on or from a disk in the following manner. When a disk which serves as a recording medium is inserted into the disk drive via a disk cassette, the inserted disk is ejectably loaded in the disk drive and is then rotated by the driving of a motor. Information is recorded or reproduced on or from the rotating disk while a head is being moved in contact with or in proximity to the rotating disk. In this arrangement, the head is provided on a carriage so that the head is made to move (seek) in the radial direction of the disk by the motor.

Such a disk drive has a base for supporting various constituent members, such as inserting/ejecting means for carrying out insertion or ejection of a disk cassette, disk rotation driving means for causing the disk to rotate by the motor, head seek means for causing the head to move to an arbitrary track position in the radial direction of the disk, and head loading means for loading or unloading the head onto or from the disk. Further, a control circuit for controlling the entire disk drive, a connector for connection with an electrical power source, etc. are provided on the base, and the control circuit is connected to electronic equipment, such as a host computer, through an interface circuit.

The inserting/ejecting means for carrying out insertion or ejection of a disk cassette is made up of constituent elements such as a cassette guide having the function of guiding the disk cassette during insertion or ejection as well as loading or unloading, driving means (loading mechanism) for causing the cassette guide to move between a load position and an unload position, and an ejecting mechanism for serving the function of forcing out the disk cassette, in accordance with the position of the cassette guide.

The disk drive is also provided with shutter opening means operative to open the shutter of the disk cassette by engaging with the shutter when the disk cassette is inserted.

The head loading means for bringing the head in contact with or in proximity to the disk loaded via the disk cassette, is in general arranged to operate in interlocked relationship to the insertion of the disk cassette.

It has been general practice to incorporate such a disk drive into the body of electronic equipment such as a personal computer or a word processor. However, in recent years, the size of this kind of disk drive has been reduced, so that such disk drives are widely used as external storage devices for the electronic equipment. For this reason, it is strongly demanded that the operability of a disk cassette ejecting operation be improved.

However, in a conventional disk drive, an eject button for ejecting a disk cassette is positioned in the vicinity of a cassette inserting/ejecting slot for insertion and ejection of the disk cassette, and is arranged to be operated in a direction parallel to a disk plane, i.e., on the front panel of the disk drive. If such a disk drive is reduced in size or thickness, the operability will be impaired. Particularly in the case of a disk drive of the type which allows an FD card interface to be held on its top face in a manner referred to previously in the description of each of the above-described embodiments, since an operating part is disposed on the top face, the use of the arrangements of the conventional disk drives will extremely impair the operability.

The sixteenth embodiment has been made in the light of the above-described technical problems, and its object is to provide a disk drive of compact arrangement which allows an operator to readily perform a disk cassette ejecting operation in the direction of the disk plane.

To achieve the above object, according to the sixteenth embodiment, there is provided a disk drive which is arranged to move a head in a predetermined direction while rotating a disk which serves as a recording medium, and to cause a cassette guide for guiding and holding a disk cassette in which the disk is accommodated to selectively move to a load position and to an unload position by means of a pivotal motion of an actuating lever pivotally supported on a base. In the disk drive, when the actuating lever is operated in the direction of the disk plane, the cassette guide is moved to the unload position, whereby the disk cassette is ejected.

Accordingly, it is possible to perform the disk cassette ejecting operation in the direction of the disk plane, i.e., from the top face of the disk drive, whereby the operability of the disk cassette ejecting operation is improved.

Sixteenth Embodiment

Figure 32:
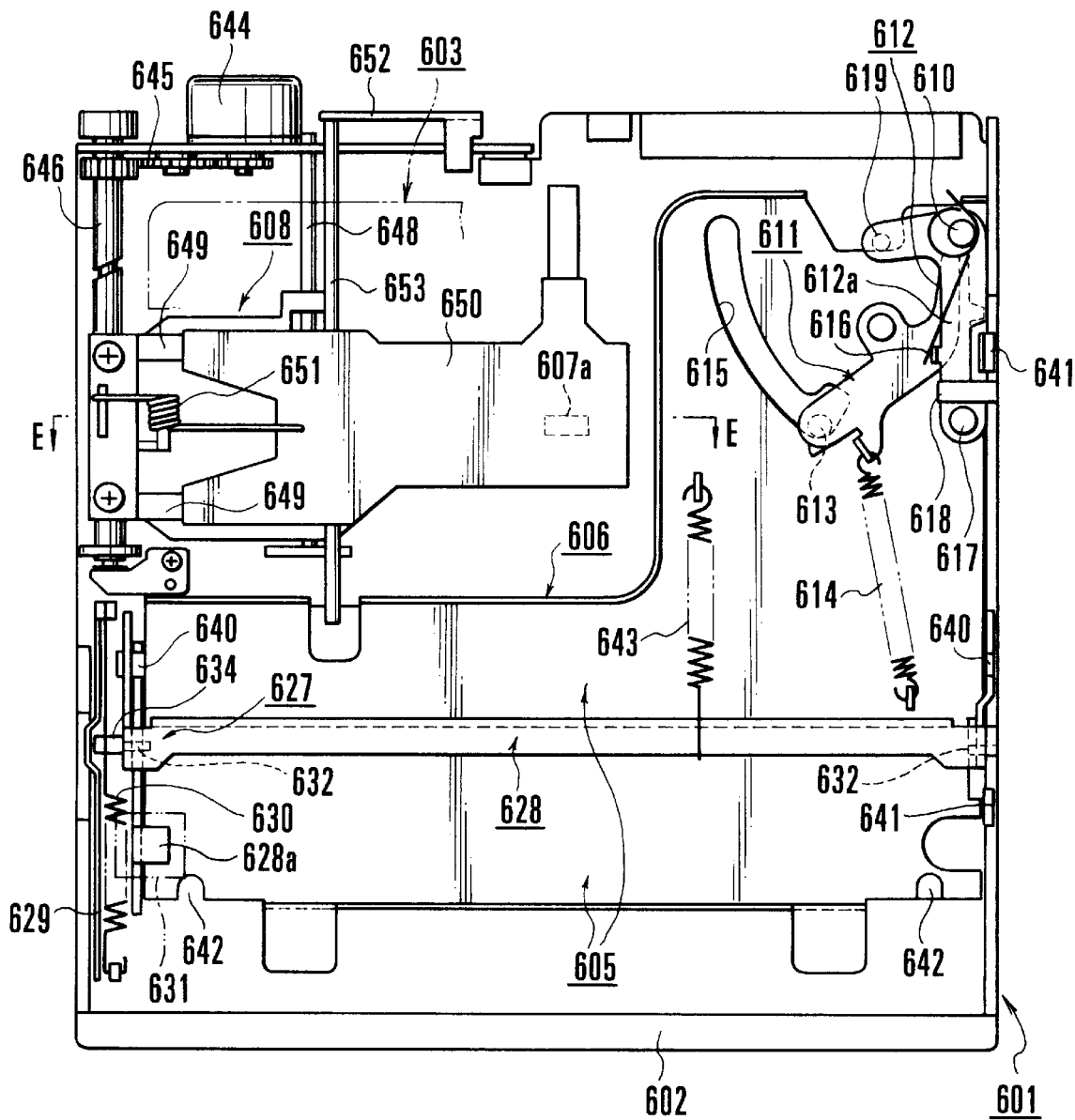
FIG. 32 is a diagrammatic top plan view showing the internal arrangement of a disk drive according to a sixteenth embodiment of the present invention, in which a disk cassette is placed in its unload position.
Figure 33:
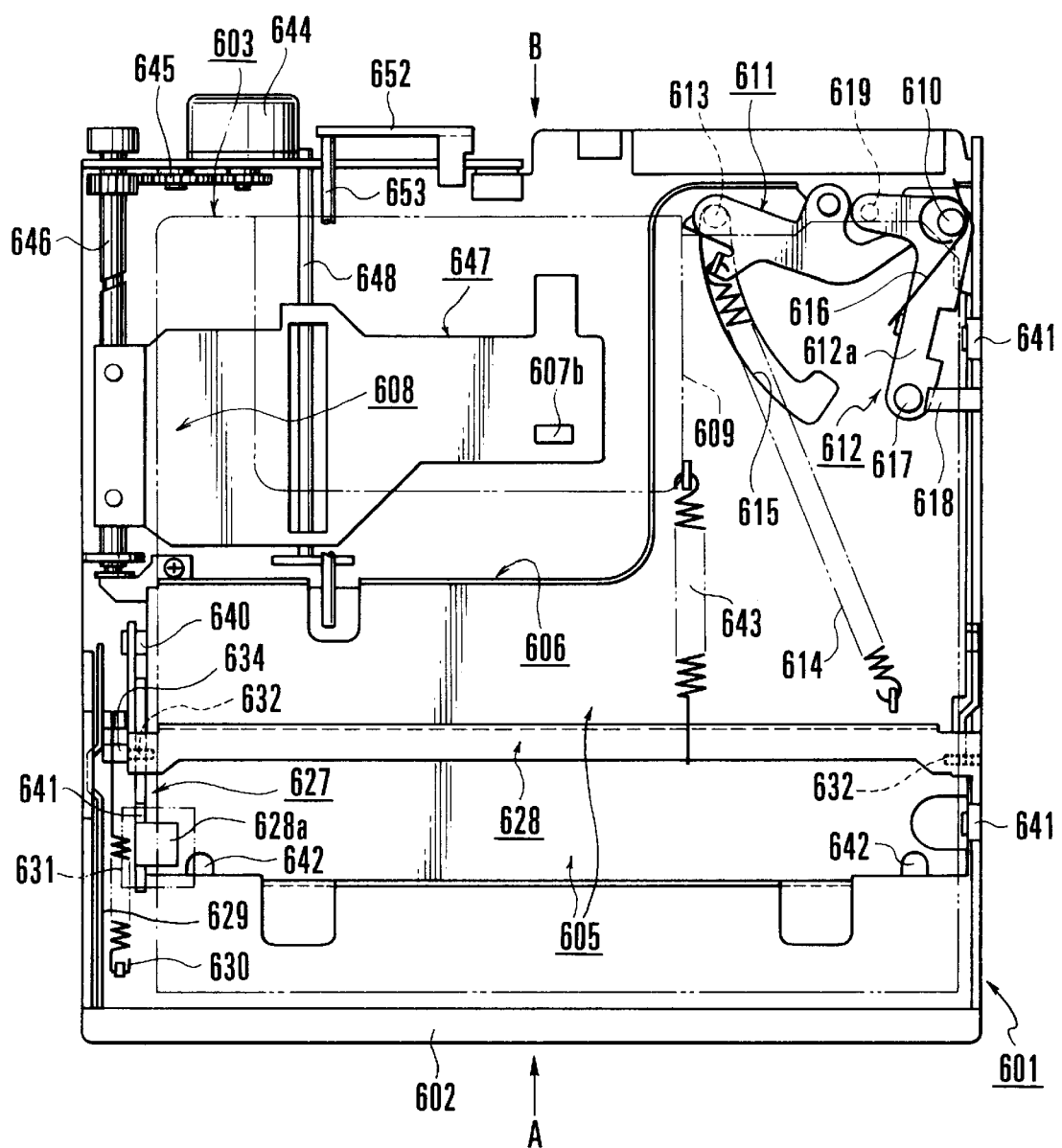
FIG. 33 is a diagrammatic top plan view showing the internal arrangement of the disk drive of FIG. 32 in which the disk cassette is placed in its load position.
Figure 34:
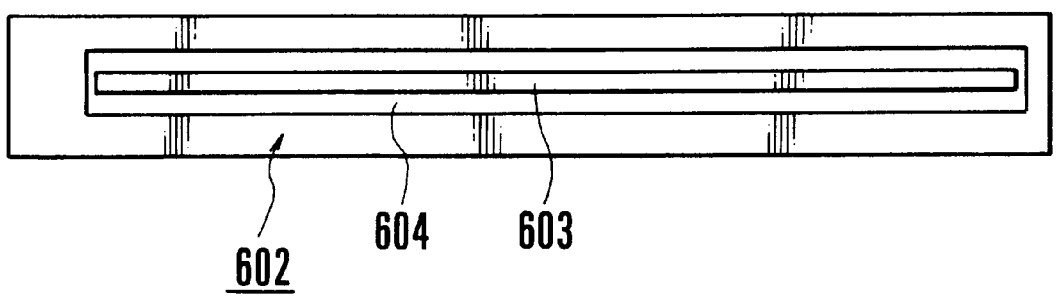
FIG. 34 is a view of the disk drive, taken in the direction of the arrow A of FIG. 33.
Figure 35:
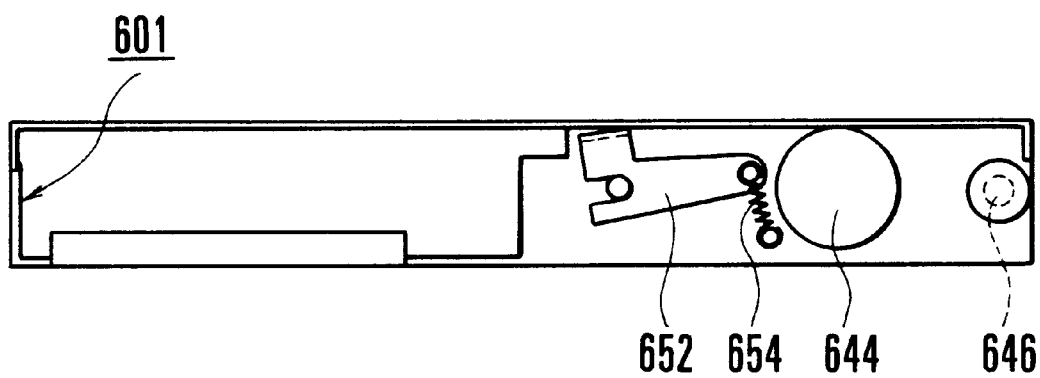
FIG. 35 is a view of the disk drive, taken in the direction of the arrow B of FIG. 33.

FIG. 32 is a diagrammatic top plan view showing the arrangement of the internal elements of the disk drive in which a disk cassette is placed in its unload position. FIG. 33 is a diagrammatic top plan view showing the arrangement of the internal elements of the disk drive of FIG. 32 in which the disk cassette is placed in its load position. FIG. 34 is a view of the disk drive, taken in the direction of the arrow A of FIG. 33. FIG. 35 is a view of the disk drive, taken in the direction of the arrow B of FIG. 33.

As shown in FIGS. 32 to 35, a base 601 has the shape of an approximately flat square box having an open top, and is formed from a thin sheet metal, such as a thin aluminum sheet. The top of the base 601 is covered with a cover (not shown) formed of a thin sheet made of a non-magnetic material, such as aluminum, for the purposes of magnetic shielding and dust protection. A front panel 602 is attached to the base 601 at the front side thereof. As shown in FIG. 34, the front panel 602 has a cassette inserting/ejecting slot 604 for permitting insertion and ejection of a disk cassette 603.

A cassette guide 605 for guiding the disk cassette 603 during insertion/ejection as well as loading/unloading is held in the base 601 in such a manner as to be movable in the upward and downward directions as well as in the forward and rearward directions. The cassette guide 605 has a cross-sectional shape which is capable of guiding and holding the disk cassette 603 which is inserted through the cassette inserting/ejecting slot 604. In the shown example, the cassette guide 605 has an approximately square and partially cut out shape as viewed in top plan, that is to say, a cutout portion 606 is formed in the cassette guide 605 by removing an approximate left half of a rear portion thereof. The cassette guide 605 is held in a position which is displaced to the right with respect to the position of the base 601, and a portion in the base 601 that is adjacent to the left-hand edge of the cassette guide 605 is formed as a space in which other constituent parts are disposed.

As shown in FIGS. 32 and 33, a head seek mechanism 608, which has a pair of upper and lower heads 607a and 607b for recording or reproducing information on or from a disk (recording medium), such as a magnetic disk, accommodated in the disk cassette 603, is disposed in an area corresponding to the cutout portion 606 of the cassette guide 605. The head seek mechanism 608 serves to cause the heads 607a and 607b to move to an arbitrary track position (to perform a seek operation) on the disk in the radial direction thereof.

The aforesaid disk is externally accessible, as by opening a slidable shutter 609 provided on the head access opening of the disk cassette 603 (refer to FIG. 33) and loading the heads 607a and 607b onto the magnetic disk through the respective head access openings.

As shown in FIGS. 32 and 33, a vertical shaft 610 is provided on the right-hand rear portion of the cassette guide 605, and a shutter lever 611 and a latch lever 612 are supported by the vertical shaft 610 for pivotal motion on the vertical shaft 610 at a location above the cassette guide 605. The shutter lever 611 serves to open and close the shutter 609 which covers the head access opening of the disk cassette 603, in interlocked relationship to the insertion and ejection of the disk cassette 603. A first pin 613, which can be brought into abutment with the leading end of the disk cassette 603, as viewed in the direction of disk-cassette insertion, as well as with one edge of the shutter 609, is provided on the bottom surface of an extending end portion of the shutter lever 611. The shutter lever 611 is urged in the counterclockwise direction (in the direction of left-hand rotation) as viewed in FIG. 32 or 33, by a spring 614 which is held between the shutter lever 611 and the cassette guide 605. An arcuate slot 615 is formed in the top of the cassette guide 605. The arcuate slot 615 has a shape of predetermined length according to the locus of movement of the first pin 613 so that the first pin 613 is allowed to move along the locus of movement.

As shown in FIGS. 32 and 33, the latch lever 612 is urged by a latch spring 616 in the counterclockwise direction (in the direction of left-hand rotation) as viewed in the figures. If the disk cassette 603 is placed in the unload position, a roller 617 provided on one end portion of the latch lever 612 engages with a stopper 618 formed on the base 601 so that the latch lever 612 is placed in its latched state, as shown in FIG. 32. The other end portion of the latch lever 612 is provided with a second pin 619 which can be brought into abutment with the leading end of the inserted disk cassette 603. In the above-described manner, a latch lever 612 is disposed on the side of the cassette guide 605 which is opposite to the cutout portion 606, that is, the side of the cassette guide 605 which is opposite to the side on which the above-described head seek mechanism 608 and a cassette loading mechanism 627 (to be described later) are disposed (the side of the cassette guide 605 which is opposite to the side on which the space is formed by displacing the cassette guide 605 and the disk cassette 603 to the right in the above-described manner).

Figure 36:
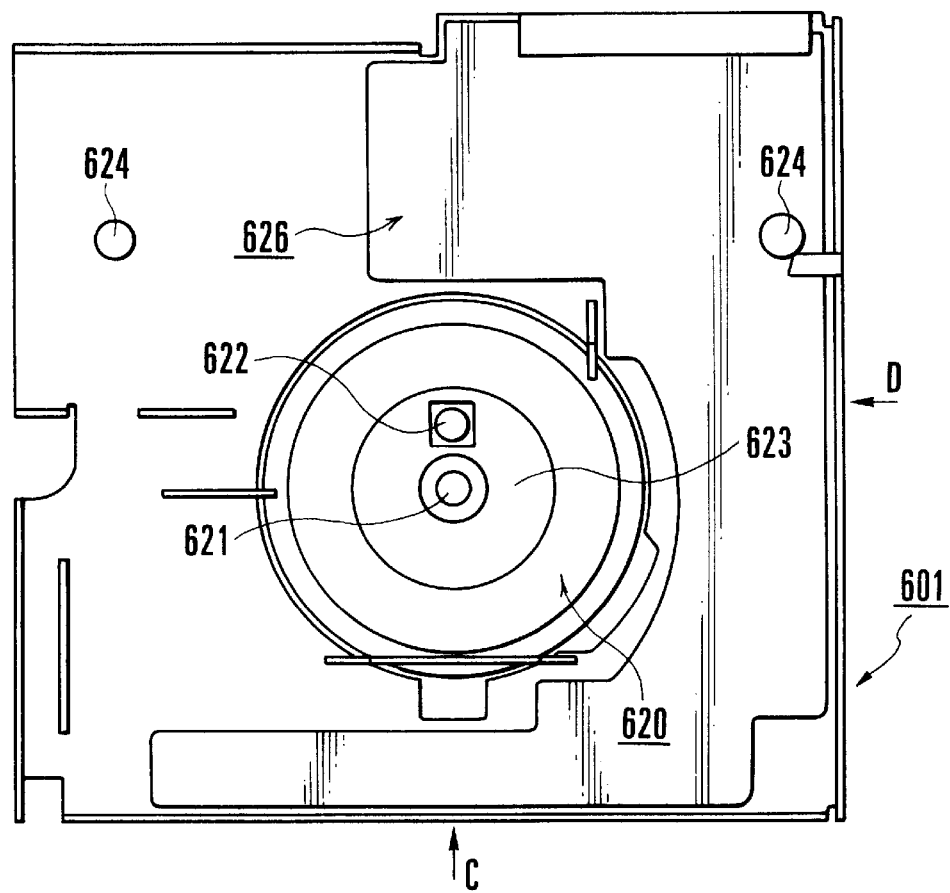
FIG. 36 is a top plan view showing the disk drive shown in FIG. 32, with some portions being omitted for the sake of clarity.
Figure 37:
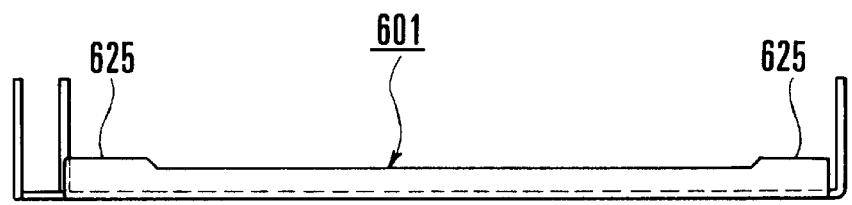
FIG. 37 is a view taken in the direction of an arrow C of FIG. 36.
Figure 38:
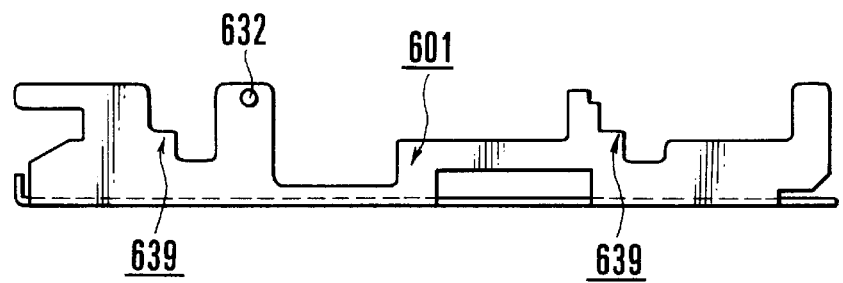
FIG. 38 is a view taken in the direction of an arrow D of FIG. 36.

FIG. 36 is a top plan view showing the disk drive shown in FIG. 32, with the cassette loading mechanism 627, the head seek mechanism 608 and the like being omitted for the sake of clarity. FIG. 37 is a view taken in the direction of an arrow C of FIG. 36, and FIG. 38 is a view taken in the direction of an arrow D of FIG. 36. As shown in FIG. 36, a disk-like flat motor 620 for disk driving is disposed approximately in the center of the bottom of the base 601, and the motor 620 is provided with a center shaft 621 which engages with the center hole (not shown) of the disk cassette 603, a driving pin 622 which engages with a driving hole (not shown) provided in the vicinity of the center hole of the disk cassette 603, and a magnet 623 for holding the hub of the disk by attraction. Rearward of the motor 620 are disposed positioning pins 624 for positioning the disk cassette 603 when the disk cassette 603 is in its loaded state. Positioning faces 625 are formed on the base 601 by partially raising part of the base 601 in the vicinity of the cassette inserting/ejecting slot 604. A printed circuit board 626 for controlling the disk drive is disposed around the motor 620.

As shown in FIGS. 32 and 33, the cassette loading mechanism 627 for selectively moving the cassette guide 605 to the load and unload positions is disposed in the space which is formed in the base 601 along the left-hand edge of the cassette guide 605. An actuating lever 628 is provided on the base 601, which extends transversely above the cassette guide 605 and which is pivotally supported at its opposite ends on the base 601. An operating lever 629 of the cassette loading mechanism 627 is normally urged in the direction of the cassette inserting/ejecting slot 604 by a return spring 630. The pivotal position of the actuating lever 628 is restricted by the operating lever 629, and the cassette guide 605 is selectively moved toward the load and unload positions in accordance with the pivotal position of the actuating lever 628.

The actuating lever 628 has an arm 628a which is positioned below an eject button 631. This portion will be described later.

Figure 39:
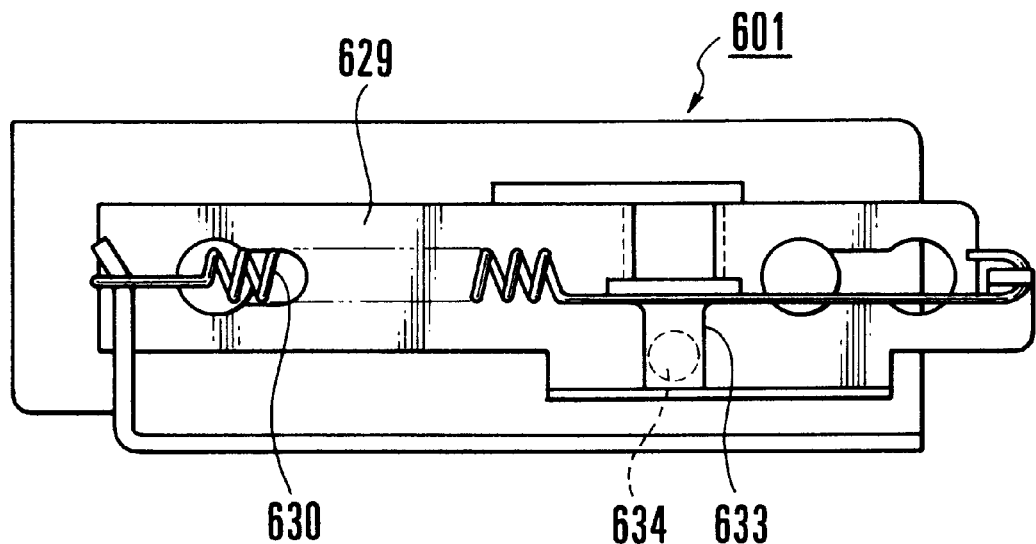
FIG. 39 is a diagrammatic side elevational view showing the state of the operating lever of the disk drive of FIG. 32 when the disk cassette is in the unload position.
Figure 40:
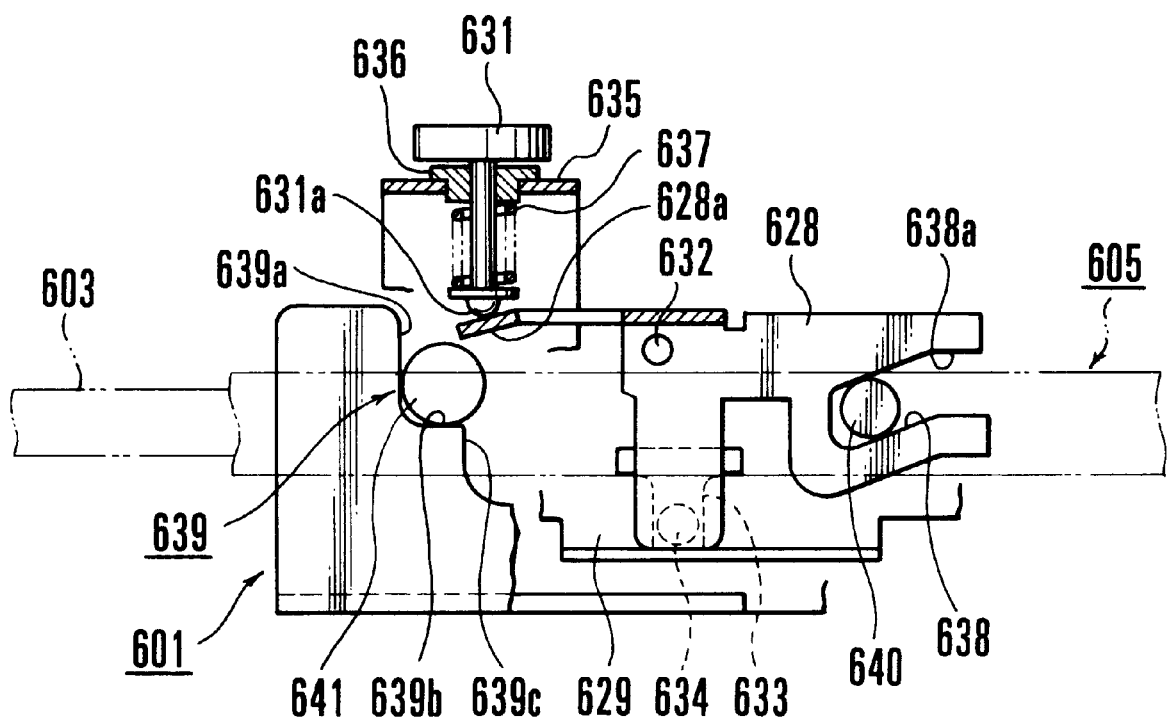
FIG. 40 is a diagrammatic side elevational view showing the states of an actuating lever, a cassette guide and an eject button when the disk cassette is in the unload position.
Figure 41:
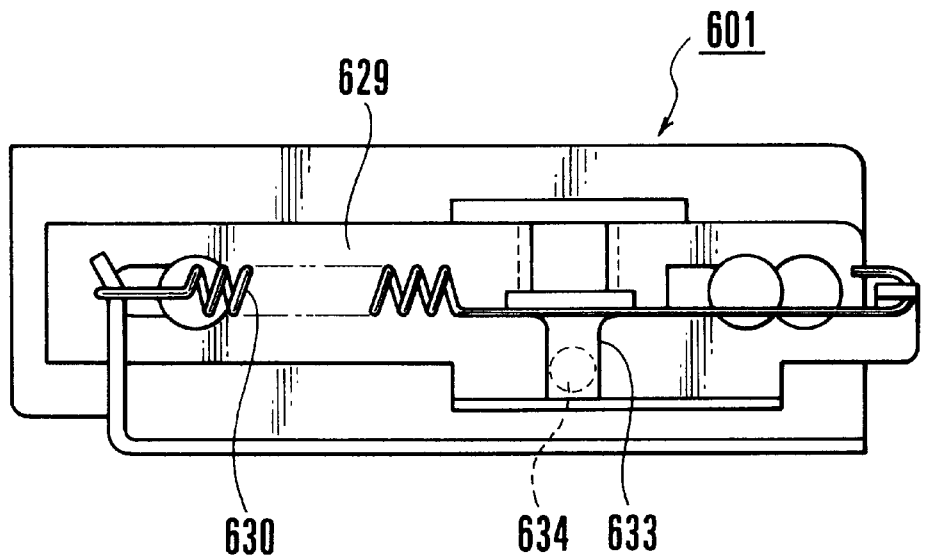
FIG. 41 is a diagrammatic side elevational view showing the state of the operating lever of the disk drive of FIG. 32 when the disk cassette is in the load position.
Figure 42:
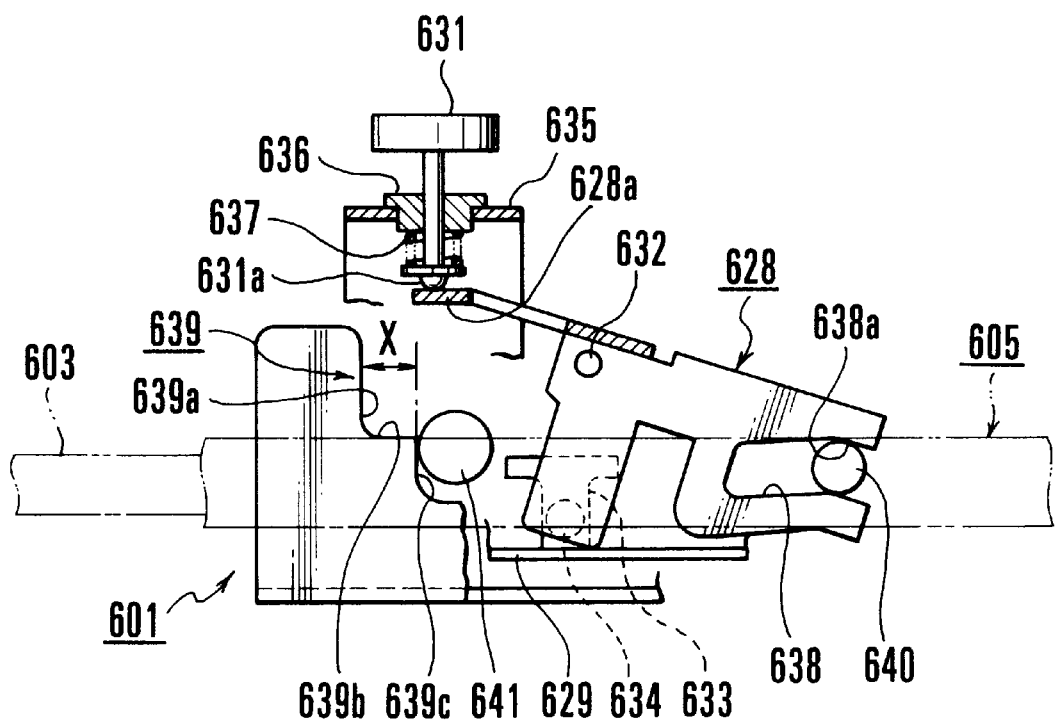
FIG. 42 is a diagrammatic side elevational view showing the states of the actuating lever, the cassette guide and the eject button when the disk cassette is in the load position.

FIGS. 39 to 42 are fragmentary side elevational views showing the state of the cassette loading mechanism 627 when the disk cassette 603 is in the load position, as well as the state of the cassette loading mechanism 627 when the disk cassette 603 is in the unload position. FIG. 39 shows the state of the operating lever 629 when the disk cassette 603 is in the unload position, FIG. 40 shows the state of an actuating lever 628 and that of the cassette guide 605 when the disk cassette 603 is in the unload position, FIG. 41 shows the state of the operating lever 629 when the disk cassette 603 is in the load position, and FIG. 42 shows the state of the actuating lever 628 and that of the cassette guide 605 when the disk cassette 603 is in the load position. The aforesaid operating lever 629 is supported for sliding motion with respect to the base 601 in the forward and rearward directions thereof by a slide guide portion made up of a pin and a slot, and is normally urged to the left (in the forward direction) as viewed in FIG. 39 by the return spring 630. The actuating lever 628 is supported at its opposite ends for pivotal motion on support points 632 provided on the base 601. A cutout 633 formed in the operating lever 629 is engaged with a pin 634 provided on one end portion of the actuating lever 628.

The arm 628a of the actuating lever 628 is disposed in contact with a lower end 631a of the eject button 631. The eject button 631 is supported by a button guide 635 and a guide bearing 636 in such a manner as to be able to move in the upward and downward directions. The eject button 631 is urged downward as viewed in FIG. 40 by a spring 637.

Cam slots 638 are respectively formed in the opposite end portions of the actuating lever 628, and holding parts 639 each having a staircase-like edge portion are provided on the opposite ends of the base 601, respectively. The opposite sides of the cassette guide 605 are respectively provided with center pins 640 as well as rollers 641. The center pins 640 engage with the associated cam slots 638 formed in the opposite end portions of the actuating lever 628, and the rollers 641 abut against the associated holding parts 639 of the base 601. Since the shape of the cassette guide 605 is such that the approximate left half of the rear portion is cut out as shown in FIGS. 32 and 33, the holding parts 639 and the rollers 641 are provided at a total of three locations, one left-hand location and two forward and rearward locations.

The operation of each part during the loading and unloading of the disk cassette 603 will be described below with reference to FIGS. 32 through 42. When the disk cassette 603 is inserted through the cassette inserting/ejecting slot 604 (refer to FIG. 34), the leading edge of the disk cassette 603 comes into abutment with the first pin 613 of the shutter lever 611 (refer to FIGS. 32 and 33), thereby causing the shutter lever 611 to turn in the clockwise direction shown in FIG. 32 (in the direction of right-hand rotation). At this time, the first pin 613 of the shutter lever 611 (refer to FIGS. 32 and 33) is brought into abutment with one edge of the shutter 609 of the disk cassette 603 to cause the shutter 609 to move against a return spring (not shown) in accordance with the turn of the shutter lever 611 (the insertion of the disk cassette 603), thereby opening the head access opening. Thus, the heads 607a and 607b is allowed to access the disk.

Then, the leading end of the disk cassette 603 comes into abutment with the second pin 619 of the latch lever 612 (refer to FIGS. 32 and 33). When the disk cassette 603 is further pressed in the direction of disk-cassette insertion, the latch lever 612 turns in the clockwise direction (in the direction of right-hand rotation) as viewed in the figures, so that the roller 617 of the latch lever 612 disengages from the stopper 618 of the base 601. By the disengagement of the latch mechanism, the cassette guide 605 arrested by the roller 617 is allowed to move further toward the rear end of the disk drive (to the right as viewed in FIG. 40).

The position of the leading end of the disk cassette 603 within the cassette guide 605 in the direction of disk-cassette insertion is restricted by the first pin 613 coming into abutment with the rearward end of the arcuate slot 615 as shown in FIG. 33.

When the disk cassette 603 is further pressed, the cassette guide 605 moves together toward the rear end of the disk drive. With the movement of the cassette guide 605, the center pins 640 of the cassette guide 605 (refer to FIGS. 40 and 42) move horizontally toward the rear end of the disk drive (to the right as viewed in the figures) in the respective cam slots 638 of the actuating lever 628. Further, the urging force of the return spring 630 acts on the pin 634 of the actuating lever 628 via the operating lever 629 to cause the actuating lever 628 to turn on the support points 632 from the position shown in FIG. 40 in the clockwise direction (in the direction of right-hand rotation). At the same time, the rollers 641 (provided at three locations) of the cassette guide 605, which are kept in abutment with upper vertical portions 639a and horizontal portions 639b of the respective holding parts 639, also move toward the rear end of the disk drive along the horizontal portions 639b of the holding parts 639. Since the pin 634 moves toward the left as viewed in FIG. 40 by the turn of the actuating lever 628, the operating lever 629 also moves accordingly. When the disk cassette 603 is further pressed, the rollers 641 of the cassette guide 605 move along corresponding lower vertical portions 639c of the holding parts 639. Thus, the cassette guide 605 is placed in the loaded state shown in FIG. 42 (the state in which the disk cassette 603 is placed in the load position).

As the arm 628a of the actuating lever 628 moves downward with the clockwise turn of the operating lever 328, the eject button 631 moves downward as viewed in FIG. 40 by the urging force of the spring 637.

During the loaded state in which the cassette guide 605 is moved down, the position of the cassette guide 605 with respect to the direction of disk-cassette insertion is restricted to the position where the cassette guide 605 is moved toward the rear of the disk drive by a distance X between the upper vertical portion 639a and the lower vertical portion 639c of each of the holding parts 639, by the abutment of the rollers 641 of the cassette guide 605 with the respective lower vertical portions 639c of the holding parts 639 of the base 601. In addition, during such a loaded state, the disk cassette 603 is positioned in the loaded state by the positioning pins 624 and the positioning faces 625, and the cassette guide 605 is urged in the downward direction as viewed in FIG. 40 by the urging force of the actuating lever 628. Accordingly, the disk cassette 603 is positioned in such a way that its top face is pressed by a plurality of disk-cassette pressing projections 642 (refer to FIGS. 32 and 33) provided on the cassette guide 605, whereby the load position of the cassette guide 605 is restricted. If the cassette guide 605 is placed in the load position, the disk (to be exact, the hub) within the disk cassette 603 is magnetically attracted to the rotor of the disk driving motor 620 (refer to FIG. 36) and is also engaged with the center shaft 621 and the driving pin 622 on the rotor, whereby the disk is positioned (in the direction of disk height and in the direction of disk rotation). Accordingly, the disk cassette 603 is set in the loaded state in which recording and reproduction of information on and from the disk are possible.

During the loaded state, the center pins 640 of the cassette guide 605 are respectively urged leftwardly obliquely in the downward direction as viewed in FIG. 42 by open-side end portions 638a of the upper cam surfaces of the corresponding cam slots 638 of the actuating lever 628. In the above-described manner, the positions of the respective rollers 641 of the cassette guide 605 in the direction of disk-cassette insertion are restricted by the corresponding lower vertical portions 639*c* of the holding parts 639 of the base 601, and the cassette guide 605 is stably held with respect to the base 601.

When the disk cassette 603 set in the disk drive is to be ejected, an operator presses downward the eject button 631 (refer to FIGS. 33 and 42) which is placed in the state shown in FIG. 42. When the eject button 631 is pressed rearward, the actuating lever 628 turns in the counterclockwise direction (in the direction of left-hand rotation) as viewed in FIG. 42, and the operating lever 629 moves rearward against the urging force of the return spring 630 by means of the engagement between the cutout 633 of the operating lever 629 and the pin 634 of the actuating lever 628. Then, the center pins 640 are lifted up by the respective cam slots 638 to cause the cassette guide 605 to move upward. When the eject button 631 is further pressed downward, the cassette guide 605 moves upward accordingly to disengage the rollers 641 from individual lower vertical portions 641*c*, whereby the cassette guide 605 becomes movable toward the front of the disk drive (to the left as viewed in FIG. 40).

When the eject button 631 is further pressed downward, the shutter lever 611 and the latch lever 612 are made to turn rapidly in the counterclockwise direction (in the direction of left-hand rotation) by the urging forces of the respective return springs 614 and 616 (refer to FIGS. 32 and 33), thereby ejecting the disk cassette 603 in the forward direction and at the same time moving the cassette guide 605 in the forward direction. It is to be noted that an elastic member for urging the cassette guide 605 in the forward direction may also be provided for aiding in smooth movement of the cassette guide 605. As an example, in the sixteenth embodiment, a spring member 643 (refer to FIGS. 32 and 33) is disposed between the actuating lever 628 and the cassette guide 605. Instead, the shutter spring 614 (refer to FIGS. 32 and 33) may also be utilized in such a manner that one end of the shutter spring 614 is secured to the actuating lever 628 or to a fixed side such as the base 601.

When the shutter lever 611 returns to its initial position by moving along the arcuate slot 615, the first pin 613 of the shutter lever 611 is brought into abutment with the forward end of the arcuate slot 615 to apply a returning force to the cassette guide 605. Thus, the cassette guide 605 is returned to the initial position shown in FIG. 40. When the pressing of the eject button 631 is stopped at that position, the operating lever 629 and the actuating lever 628 are returned to their initial positions (unload positions) shown in FIGS. 39 and 40 by the urging force of the return spring 630 (refer to FIGS. 39 and 41).

Figure 43:
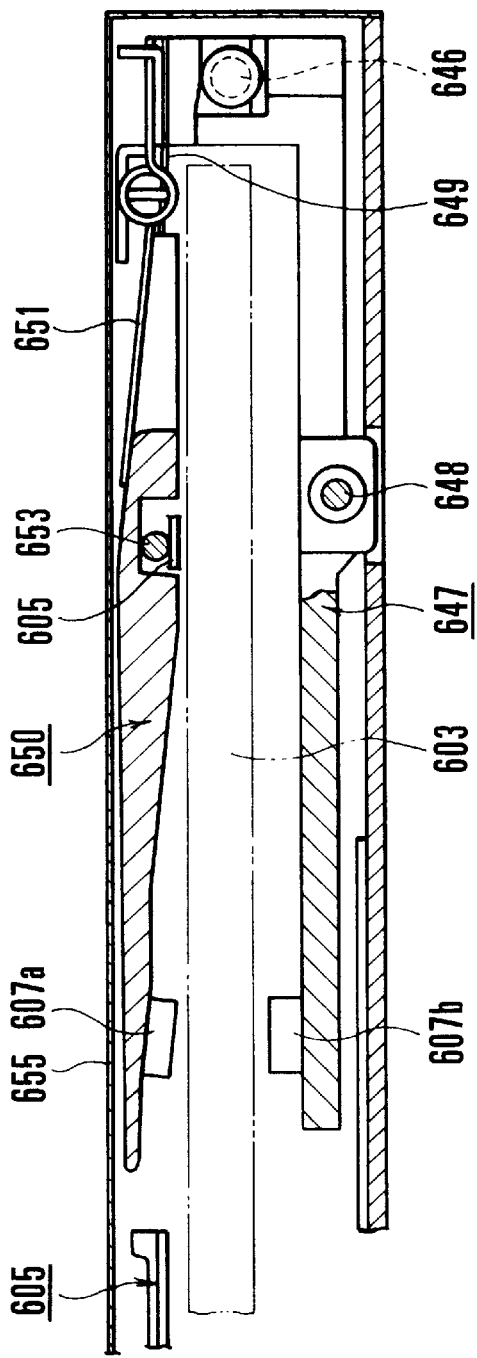
FIG. 43 is a vertical sectional view, taken along line E—E of FIG. 32, of a portion including a head seek mechanism.

As shown in FIGS. 32 and 33, the head seek mechanism 608 is disposed in the area corresponding to the cutout portion 606 of the cassette guide 605. FIG. 43 is a vertical sectional view, taken along line E—E of FIG. 32, of a portion including the head seek mechanism 608.

The head seek mechanism 608 will be described below with reference to FIGS. 32, 33 and 43. In the shown example, the cutout portion 606 having an area corresponding to approximately ¼ of the entire area of the cassette guide 605 is formed in the left-hand half of the rear portion of the cassette guide 605. However, a corresponding cutout portion may be formed not in the left-hand half but in the right-hand half, in which case a mechanism corresponding to the head seek mechanism 608 may be provided within the right-hand cutout portion.

Referring to FIGS. 32 and 33, the cassette loading mechanism 627 and the head seek mechanism 608 are arrayed along one edge (in the shown example, the left-hand edge) of the disk cassette 603 in the inserting direction of the disk cassette 603, on the side on which the cassette loading mechanism 627 including the operating lever 629 and the associated elements is disposed, that is, within the space that is formed adjacent to the one edge of the cassette guide 605 by displacing the cassette guide 605 with respect to the base 601 in one direction (in the shown example, in the right-hand direction).

The head seek mechanism 608 is provided with a head driving motor 644 (refer to FIG. 35) which is fixed to the rear wall of the base 601, a driving shaft 646 made from a lead screw which is rotated by the motor 644 via a gear train 645, a head carriage 647 engaged with the lead groove of the driving shaft 646 and arranged in such a manner as to be movable in opposite directions along the length of the driving shaft 646 by the forward and reverse rotations of the driving shaft 646, a guide bar 648 engaged with the head carriage 647 for guiding the head carriage 647, the lower head 607*b* mounted on an extending end portion of the head carriage 647, a head arm 650 secured to the head carriage 647 via a leaf spring 649 in such a manner as to be movable in the upward and downward directions, the upper head 607*a* mounted on an extending end portion of the head arm 650, and a head loading spring 651 for urging the head arm 650 in the downward direction (toward a head load position).

A bar 653 for head lifting (for unloading the heads 607*a* and 607*b*), which extends past the underside of the head arm 650 and engages with the top face of the cassette guide 605 at one end, is mounted on one end of a support arm 652 movably supported on the base 601. The support arm 652 is normally urged in the direction in which the head lifting bar 653 is brought into abutment with the top face of the cassette guide 605, i.e., in the downward direction, by a spring 654 (refer to FIG. 34) held between the support arm 652 and the base 601. Accordingly, during the cassette-unloaded state in which the cassette guide 605 is moved upward, the head arm 650 is lifted to the upper position shown in FIG. 43 so that the upper head 607*a* is held in the unload position.

As described above, the disk drive according to the sixteenth embodiment is arranged in such a manner that the upper head 607*a* and the lower head 607*b* can be simultaneously loaded onto the upper and lower sides of the medium (disk) accommodated in the disk cassette 603, respectively.

In FIG. 43, there is shown the state in which the cassette guide 605 and the upper head 607*a* and the lower head 607*b* are placed in their unload positions. During the state shown in FIG. 43, the upper face (the highest portion) of the cassette guide 605 and the upper face (the highest portion) of the head arm 650 are made approximately flush with each other. Further, the sixteenth embodiment has an arrangement which makes it possible to make the height (thickness) of the disk drive as small as possible by minimizing the gap between the upper face of the cassette guide 605 or that of the head arm 650 and a cover 655, which covers the open top of the base 601 (refer to FIG. 43), when the disk cassette 603 is placed in the unloaded state as shown in FIG. 43.

The driving shaft 646 is disposed in the left-hand end portion of the base 601 and along the left-hand edge of the disk cassette 603 so as to extend in the direction of disk-cassette insertion. As shown, the driving shaft 646 is disposed in the vicinity of the rear end of the head arm 650 in such a manner that the axis of the driving shaft 646 and that of the head arm 650 are mutually perpendicular.

Figure 44:
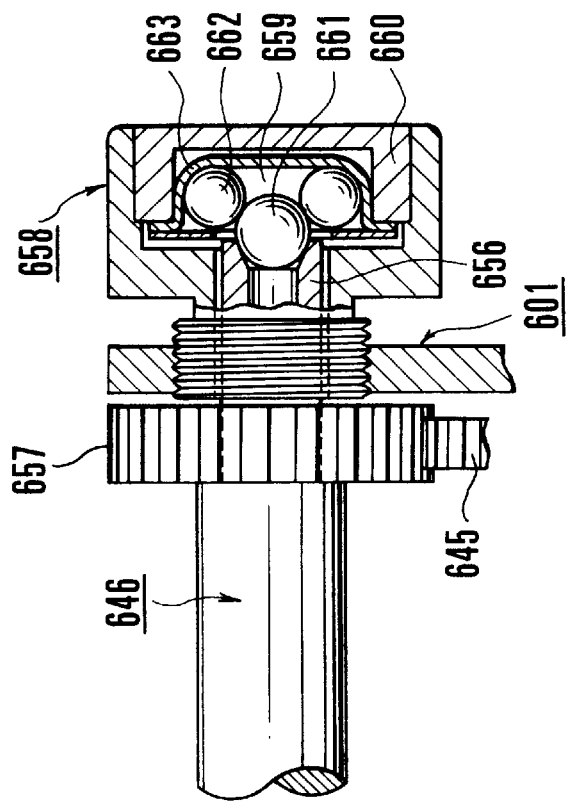
FIG. 44 is a partially vertical sectional view showing the bearing structure of a driving shaft of the head seek mechanism in the disk drive of FIG. 32.

FIG. 44 is a partially vertical sectional view showing a bearing structure provided at each end of the driving shaft 646. Since the bearing structures at both ends of the driving shaft 646 have substantially the same construction, the following description refers to only the shown bearing structure provided at one end (the rear end), and a description of the bearing structure at the other end is omitted.

Referring to FIG. 44, the driving shaft 646 has a support portion 656 and a gear 657 fixed to the support portion 656, and a rotational force from the head driving motor 644 is transmitted to the gear 657. A bearing holder 658 is secured to the rear wall of the base 601 by screw-fitting in such a manner that the position of the driving shaft 646 can be adjusted in the axial direction. The driving shaft 646 can move to and fro in the axial direction by the rotation of the bearing holder 658 so that the track positions of the respective heads 607a and 607b can be adjusted. The support portion 656 of the driving shaft 646 projects from the gear 657 in the rearward direction, and the projecting portion extends into the bearing holder 658. A bearing chamber 659 having an open rear end is formed in the rear (outside) of the bearing holder 658, and the bearing chamber 659 is airtightly covered with a cap 660.

A sun ball 661 is brought into abutment with a bearing surface formed in the end face of the support portion 656 of the driving shaft 646, and a plurality of (for example, 3 to 6) planetary balls 662 are disposed, as illustrated, in abutment with the sun ball 661 within the bearing chamber 659. The planetary balls 662 are held by a casing 663 which is disposed outside of the planetary balls 662 to surround them. The cap 660 is airtightly fitted into the bearing holder 658 (as by press-fitting or fitting using an adhesive) with the balls (the single sun ball 661 and the plurality of planetary balls 662) disposed in the above-described manner, thereby constituting a rotary bearing for supporting the radial and thrust loads of the driving shaft 646 at each end thereof.

In the above-described embodiment, although the driving shaft 646 made from a lead screw is employed as a transmission means for driving the head seek mechanism 608, transmission means made up of a rack-and-pinion mechanism, a linear motor or the like may be substituted for the lead screw. The output of the motor 51 may also be transmitted to the driving shaft 646 by means of a belt or the like.

Figure 45:
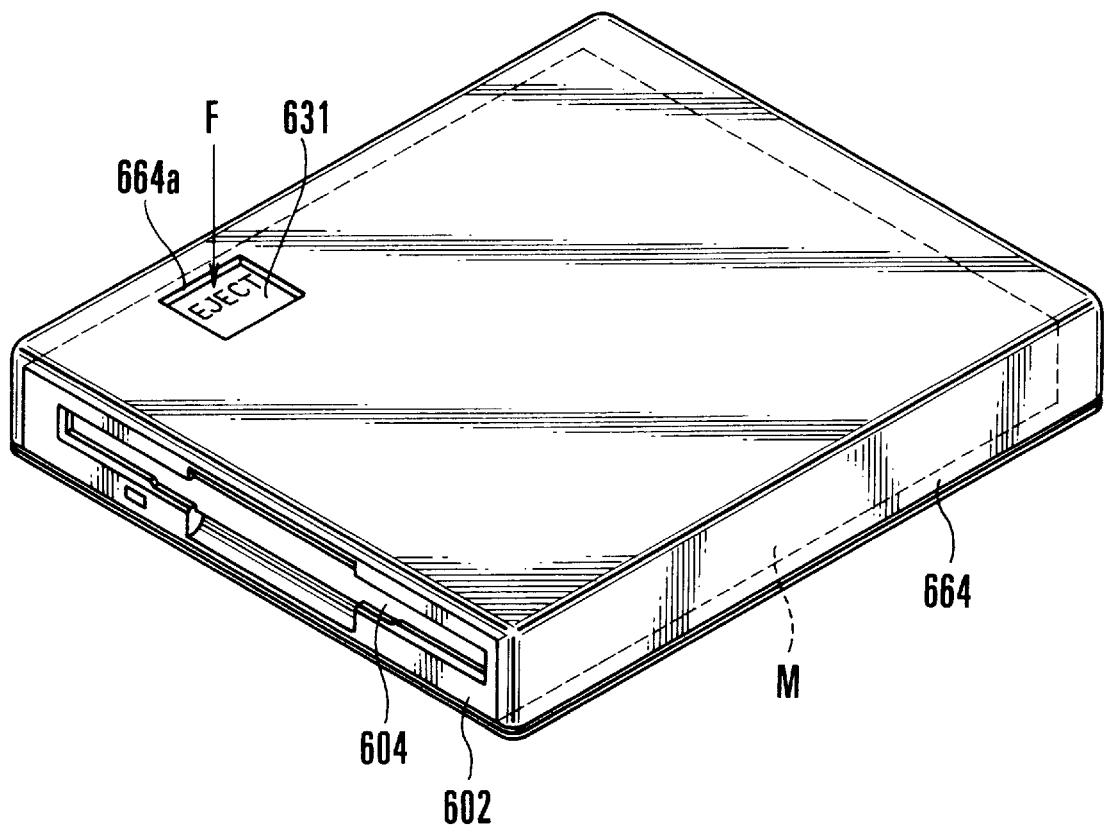
FIG. 45 is a diagrammatic perspective view showing the external appearance of an external storage device provided with a disk drive according to the sixteenth embodiment.

FIG. 45 is a diagrammatic perspective view showing the external appearance of an external storage device for electronic equipment, which is provided with a disk drive M according to the sixteenth embodiment. As shown in FIG. 45, the disk drive M according to the sixteenth embodiment is provided in a case 664. The front panel 602 is exposed from the case 664 at the front side thereof, and the eject button 631 is exposed in an opening 664a formed in the top side of the case 664. Owing to the above-described structure, the disk cassette 603 can be readily ejected through the cassette inserting/ejecting slot 604 by pressing the eject button 631 in the direction of an arrow F.

Figure 46:
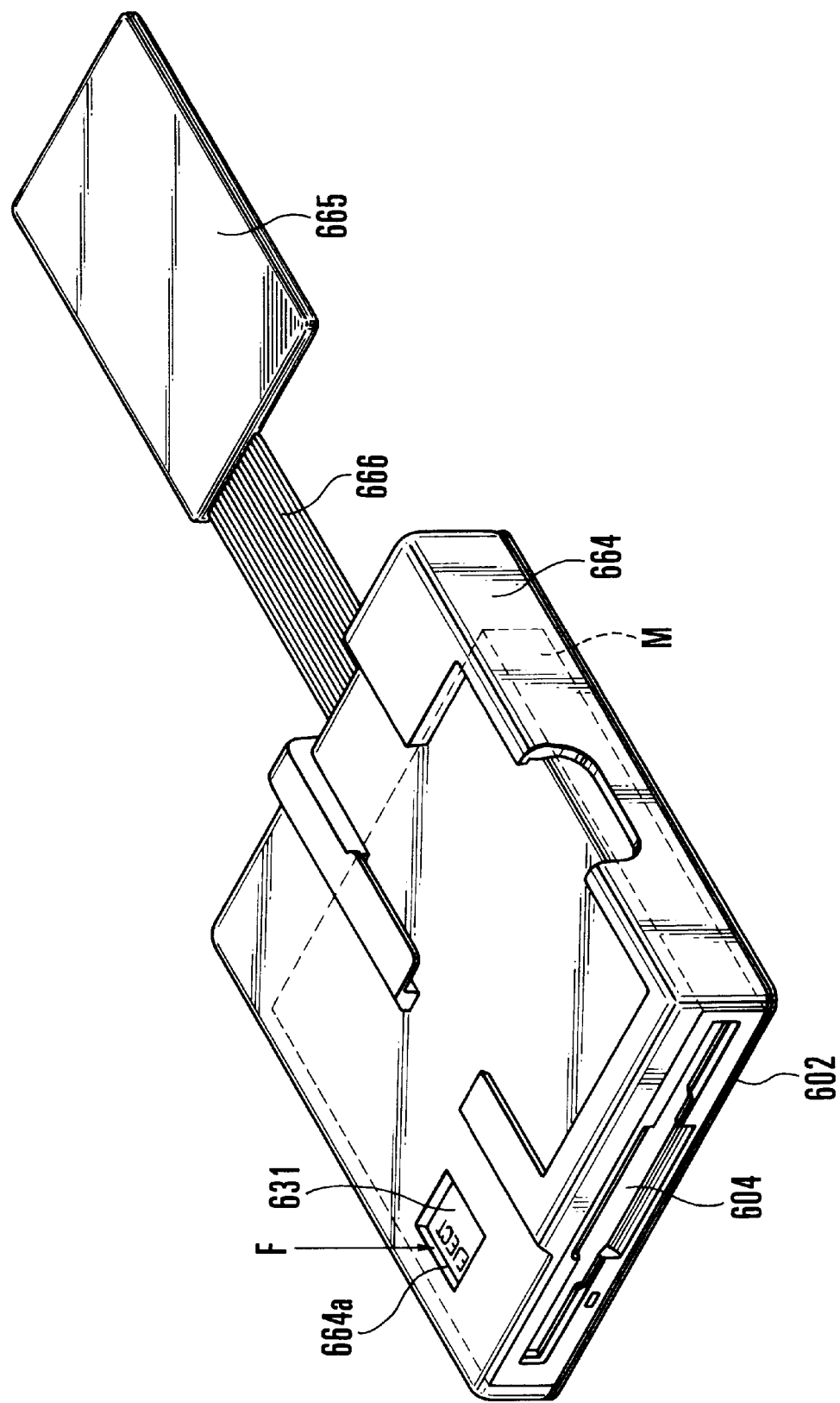
FIG. 46 is a diagrammatic perspective view showing the external appearance of a different example of the external storage device provided with the disk drive according to the sixteenth embodiment.

FIG. 46 is a diagrammatic perspective view showing the external appearance of a different example of the external storage device for electronic equipment, which is provided with the disk drive M according to the sixteenth embodiment. In recent years, as the size reduction of electronic equipment proceeds, IC memory cards have become more popular instead of the aforementioned disk drive M as storage devices for such electronic equipment. The external storage device shown in FIG. 46 can be externally attached to the electronic equipment without using a dedicated connector for externally attaching the external storage device to the electronic equipment. The data storage means (disk device) M can be readily connected to the electronic equipment by connecting an IC memory card type connector adapter 665 and the data storage means M by a connection cable 666 and inserting the IC memory card type connector adapter 665 into an IC memory card slot provided in electronic equipment (such as a personal computer). In this example as well, the front panel 602 is exposed at the front side of the case 664, and the eject button 631 is exposed in the opening 664a formed in the top side of the case 664. Similarly to the example shown in FIG. 45, owing to the aforesaid structure, the disk cassette 603 can be readily ejected through the cassette inserting/ejecting slot 604 by pressing the eject button 631 in the direction of the arrow F.

As described above, in the disk drive according to the sixteenth embodiment, when the actuating lever is actuated in the direction of the disk plane, the cassette guide is moved to the unload position so that the disk cassette can be ejected. Accordingly, an operator can readily perform a disk cassette ejecting operation from the top side of the drive.

In the case of the aforesaid external storage device which allows an FD card interface or the like to be held on its top face, an operator can perform all operations on the top face of the device. Accordingly, the operability of the device is extremely improved.

What is claimed is:

1. An interface device for connecting an external storage device to a host computer to which a card form of storage device can be connected, the external storage device differing in data format from the data format of the card form of storage device and not directly connected to said host computer, said host computer having a slot for removable receipt of said card form of storage device and terminals for electrical connection with terminals of said card form of storage device, said interface device comprising:

a connection unit for connecting the external storage device to the host computer, said connection unit being able to be removably received in said slot and adapted for electrical connection with said host computer terminals; and converting means for converting a data format of data read out from the external storage device into the data format conforming to the card form of storage device.

2. An interface device according to claim 1, wherein the external storage device is a floppy disk drive.

3. An interface device according to claim 1, wherein the card form of storage device has a data format conforming to a PCMCIA format.

4. An interface device according to claim 2, wherein said converting means is provided in said connection unit.

5. An interface device according to claim 4, wherein a floppy disk controller for controlling the floppy disk drive is further provided in said connection unit.

6. An interface device according to claim 1, further comprising a ROM in which discrimination information on said interface device is stored.

7. An interface device according to claim 6, wherein the discrimination information is read out into the host computer in response to connection of said interface device to the host computer.

8. An interface device according to claim 6, further comprising a BIOS in which a program for executing input/output control of said interface device is stored, the program being read out into the host computer in response to connection of said interface device to the host computer.

9. An interface device for connecting an external storage device to a host computer to which a card form of storage device can be connected, the external storage device differing in data format from the data format of the card form of storage device and not directly connected to said host computer, said host computer having a slot for removable receipt of said card form of storage device and terminals for electrical connection with terminals of said card form of storage device, said interface device comprising:

a connection unit for connecting the external storage device to the host computer, said connection unit being able to be removably received in said slot and adapted for electrical connection with said host computer terminals;

converting means for converting a data format of data read out from the external storage device into the data format conforming to the card form of storage device; and a nonvolatile memory in which are stored a plurality of pieces of discrimination information for allowing the external storage device to be controlled by the host computer.

10. An interface device according to claim 9, further comprising means for performing DMA transfer of the data.

11. An interface device according to claim 9, wherein the external storage device is a floppy disk drive, a content of said nonvolatile memory being read into the host computer before initialization of the host computer.

12. An interface device according to claim 11, further comprising a floppy disk controller for controlling the floppy disk drive.

13. An interface device according to claim 9, wherein the card form of storage device conforms to a PCMCIA format.

14. An interface device according to claim 9, wherein said converting means and said nonvolatile memory are provided in said connection unit.

15. An interface device according to claim 9, further comprising a floppy disk controller for controlling a floppy disk drive.

16. An interface device according to claim 15, further comprising a BIOS in which information for executing input/output control of the floppy disk drive via said interface device is stored.

17. An interface device according to claim 16, wherein said BIOS is installed into the host computer in response to connection of said connection unit to the host computer.

18. A data storage device comprising:

an external storage device which differs in data format from a data format of a card form of storage device and not directly connected to said host computer; and an interface including:
      a connection unit for electrically connecting the external storage device to a host computer, said connection unit being able to be removably received in a slot which is provided in said host computer and into which the card form of storage device is removably receivable; and
      controlling means for converting control information which is to be outputted from said host computer in a data format conforming to the card form of storage device, into a data format conforming to the external storage device, and enabling said external storage device to be controlled.

19. A data storage device according to claim 18, wherein said external storage device is a floppy disk drive.

20. A data storage device according to claim 19, wherein said interface further includes a floppy disk controller for controlling the floppy disk drive and a memory in which attribute information about said interface is stored.

21. A data storage device according to claim 20, wherein the attribute information stored in said memory is loaded into said host computer in response to fitting of said connection unit into the slot.

22. A data storage device according to claim 21, further comprising a BIOS in which information for controlling an input/output operation of said external storage device via said interface is stored, said BIOS being installed into predetermined addresses in said host computer in response to the fitting of said connection unit into the slot.

23. A data storage device according to claim 18, wherein the card form of storage device has a data format conforming to a PCMCIA format.

24. A data storage device according to claim 18, wherein said host computer is provided with a BIOS in which information for controlling an input/output operation of said external storage device via said interface is stored.

25. A data storage device according to claim 18, further comprising DMA transfer means for executing DMA transfer between said host computer and said interface.

26. A data storage device comprising:

a first type of storage device which differs in physical size and a connector format from a second type of storage device, said second type of storage device being of size compatible with removable receipt thereof in a host computer slot, said second type of storage device having electrical terminals for connection to said host computer;

an adaptor electrically connected with said first type of storage device, said adaptor having terminals for connection to said host computer and a size compatible with removable receipt thereof in said host computer slot; and converting means for converting a data format of said first type of storage device into a data format of said second type of storage device.

27. A data storage according to claim 26, wherein the electrical connection of said adaptor and said first type of storage device is effected in part by respective male and female connector components.

28. A data storage device according to claim 27, wherein said electrical connection of said adaptor and said first type of storage device is effected in part by a multiple conductor electrical cable terminated by one of said male and female connector components.

29. A device for connecting an external data processing device to a computer to which a card form of storage device can be connected, the external data processing device differing in data format from the data format of the card form of storage device, said device comprising:

a connection unit for connecting the external data processing device to the computer, said connection unit being able to be removably received in a slot in said computer and adapted for electrical connection with terminals of said computer; and data format converting means for converting data which is to be output from the external data processing device into a data format conforming to said data format of said card form of storage device.

30. A device according to claim 29, wherein said data format conforming to the data format of said card form of storage device is a PCMCIA format.

31. A device according to claim 29, wherein said converting means is provided in said connection unit.

32. A device according to claim 29, further comprising a drive unit for driving a recording medium different from said card form of storage device.

33. A device according to claim 32, wherein said drive unit drives a floppy disc.

34. A device according to claim 29, further comprising a memory in is stored which a program used for executing input and/or output between said device and said computer.

35. A device according to claim 34, wherein said program is read out from said memory and loaded in said computer in response to connection of said device to said computer.

* * * * *